(12) United States Patent
Chung et al.

(10) Patent No.: US 8,766,354 B2
(45) Date of Patent: Jul. 1, 2014

(54) SEMICONDUCTOR DEVICES INCLUDING VERTICAL CHANNEL TRANSISTORS AND METHODS OF MANUFACTURING THE SAME

(75) Inventors: Hyun-woo Chung, Seoul (KR); Hyeong-sun Hong, Seongnam-si (KR); Yong-chul Oh, Suwon-si (KR); Yoo-sang Hwang, Suwon-si (KR); Cheol-ho Baek, Yongin-si (KR); Kang-uk Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 137 days.

(21) Appl. No.: 13/185,961

(22) Filed: Jul. 19, 2011

(65) Prior Publication Data

US 2012/0025300 A1 Feb. 2, 2012

(30) Foreign Application Priority Data

Jul. 29, 2010 (KR) .......................... 10-2010-0073531

(51) Int. Cl.
*H01L 29/66* (2006.01)
(52) U.S. Cl.
USPC .................................. 257/330; 257/E29.262
(58) Field of Classification Search
USPC ................................... 257/330, 302, E29.262
See application file for complete search history.

(56) References Cited

U.S. PATENT DOCUMENTS

| 4,908,691 A * | 3/1990 | Silvestri et al. ............... 257/360 |
| 8,058,683 B2 * | 11/2011 | Yoon et al. .................... 257/329 |
| 8,552,472 B2 * | 10/2013 | Kim et al. ..................... 257/242 |
| 2006/0118846 A1 * | 6/2006 | Bissey et al. .................. 257/296 |

FOREIGN PATENT DOCUMENTS

| JP | 2009194248 A | 8/2009 |
| KR | 100850146 B1 | 7/2008 |
| KR | 20090004172 | 1/2009 |

* cited by examiner

*Primary Examiner* — Mark Prenty
(74) *Attorney, Agent, or Firm* — Harness, Dickey & Pierce, P.L.C.

(57) ABSTRACT

A semiconductor device including a plurality of buried word lines extending in a first direction and a plurality of buried bit lines extending in a second direction. Upper surfaces of the plurality of buried word lines and the plurality of buried bit lines are lower than an upper surface of a substrate. The distance between two active regions that constitute a pair of first active regions from among a plurality of first active regions included in a first group of active regions is less than the distance between two adjacent active regions having the plurality of buried bit lines therebetween. A method of manufacturing a semiconductor device includes forming a plurality of first trenches in a substrate, forming a plurality of first conductive patterns in the plurality of first trenches in such a manner that a pair of first conductive patterns is disposed in each of the plurality of first trenches, forming a plurality of first buried patterns in the plurality of first trenches to cover the plurality of first conductive patterns, forming a plurality of second trenches by etching the substrate between the plurality of first trenches, and forming a plurality of second buried patterns in the plurality of second trenches.

20 Claims, 45 Drawing Sheets

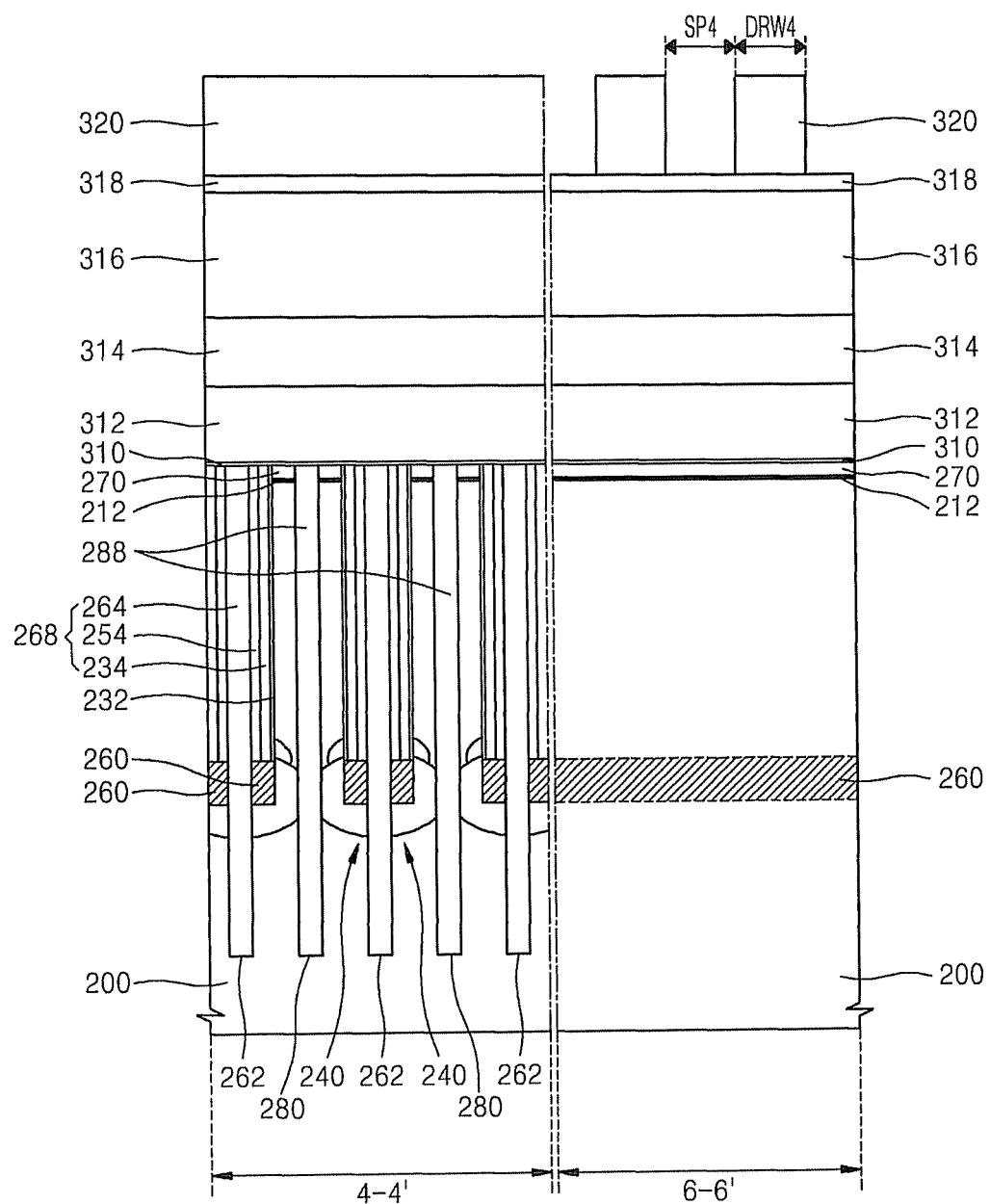

SEMICONDUCTOR DEVICES INCLUDING VERTICAL CHANNEL TRANSISTORS AND METHODS OF MANUFACTURING THE SAME

CROSS-REFERENCE TO RELATED APPLICATION

This application claims priority under 35 U.S.C. §119 to Korean Patent Application No. 10-2010-0073531, filed on Jul. 29, 2010, in the Korean Intellectual Property Office (KIPO), the entire contents of which is incorporated herein by reference.

BACKGROUND

Example embodiments of the inventive concepts relate to semiconductor devices and methods of manufacturing the same, and particularly, to semiconductor devices including vertical channel transistors, in which a vertical channel is formed in an active region, and a method of manufacturing the same.

The greater the degree of integration of a semiconductor device, the smaller the design rules of elements of the semiconductor device. In particular, in the case of semiconductor devices that require a large number of transistors, a channel length decreases as a gate length decreases, which is considered a standard design rule. Accordingly, a vertical channel transistor may increase an effective channel length by increasing the distance between a source and drain of a transistor of a highly-scaled semiconductor device.

SUMMARY

Example embodiments of the inventive concepts may provide highly integrated semiconductor devices including buried bit lines and vertical channel transistors. One or more example embodiments of the inventive concepts may provide methods of manufacturing semiconductor devices including vertical channel transistor structures with a fine unit cell size while securing a sufficient process margin during formation of buried bit lines and/or vertical channel transistors.

According to example embodiments of the inventive concepts, a semiconductor device includes a plurality of active regions disposed apart from each other in a substrate in a first direction and a second direction, a plurality of buried word lines extending in the first direction while facing sidewalls of a first group of active regions arranged in a line in the first direction from among the plurality of active region, upper surfaces of the plurality of buried word lines lower than an upper surface of the substrate, and a plurality of buried bit lines extending in the second direction while contacting sidewalls of a second group of active regions arranged in a line in the second direction from among the plurality of active region. Upper surfaces of the plurality of buried bit lines are lower than the upper surface of the substrate, the first group of active regions including a plurality of pairs of first active regions, a distance between two active regions that constitute a pair of first active regions from among the plurality of pairs of first active regions less than a distance between two adjacent active regions having the plurality of buried bit lines therebetween.

The plurality of pairs of first active regions may be disposed having two adjacent buried bit lines therebetween. The second group of active regions may include a plurality of pairs of second active regions. A distance between two active regions that constitute a pair of second active regions from among the plurality of second active region, may be less than a distance between two adjacent active regions having the plurality of buried word lines therebetween. The plurality of pairs of second active regions may be arranged having two adjacent buried word lines therebetween. Each of the plurality of buried word lines may face one sidewall of each of the active regions belonging to the first group, and a single-gate transistor including one buried word line from among the plurality of buried word lines may be formed in each of the plurality of active regions. The plurality of buried word lines may be formed in bar shapes extending in the first direction at a side of the first group of active regions.

Each pair of the plurality of pairs of buried bit lines may be disposed between each of the plurality of pairs of first active regions. A distance between each pair of the plurality of pairs of buried bit lines, may be less than a distance between two adjacent buried bit lines having each pair of the plurality of pairs of first active regions therebetween. Each pair of the plurality of pairs of buried word lines may be disposed between each of the plurality of pairs of second active regions. A distance between each pair of the plurality of pairs of buried word lines, may be less than a distance between two adjacent buried bit lines having each of the plurality of pairs of second active regions therebetween.

The second group of active regions may include a plurality of second active regions disposed at equal intervals in the second direction. Each of the plurality of buried word lines may face two sidewalls of each of the active regions belonging to the first group, and a double-gate transistor including one buried word line from among the plurality of buried word lines may be formed in each of the plurality of active regions. The plurality of buried word lines may be formed in ring shapes covering the first group of active regions, respectively. Each pair of the plurality of pairs of buried bit lines may be disposed between each of the plurality of pairs of first active regions. A distance between each pair of the plurality of pairs of buried bit lines may be less than a distance between two adjacent buried bit lines having each of the plurality of pairs of first active regions therebetween. The second direction may be perpendicular to the first direction.

According to other example embodiments of the inventive concepts, a semiconductor device includes a plurality of active regions defined in a substrate by a plurality of first buried patterns, a plurality of second buried patterns, a plurality of third buried patterns, and a plurality of fourth buried patterns, where the plurality of first buried patterns and the plurality of second buried patterns are alternately buried in the substrate in a first direction, and the plurality of third buried patterns and the plurality of fourth buried patterns are buried in the substrate in a second direction. A plurality of buried bit lines are formed on the substrate in such a manner that upper surfaces of the plurality of buried bit lines are lower than an upper surface of the substrate. The plurality of buried bit lines include a plurality of pairs of buried bit lines including two buried bit lines that face each other while including the plurality of first buried patterns therebetween. A plurality of buried word lines are formed on the substrate in such a manner that upper surfaces of the plurality of buried word lines are lower than the upper surface of the substrate and are higher than upper surfaces of the plurality of pairs of buried bit lines. A plurality of first source/drain regions are formed around the plurality of buried bit lines, respectively. A plurality of first source/drain regions are formed around the plurality of buried bit lines on the substrate.

A third distance between the upper surface of the substrate and lower surfaces of the plurality of third buried patterns and a fourth distance between the upper surface of the substrate and lower surfaces of the plurality of fourth buried patterns, may be less than a first distance between the upper surface of the substrate and lower surfaces of the plurality of first buried patterns. Each of the plurality of pairs of buried bit lines, and two active regions that face each other while including the plurality of second buried patterns therebetween from among the plurality of active regions, may be alternately disposed. The two active regions facing each other while including the plurality of second buried patterns therebetween, may contact one of the plurality of buried bit lines. The plurality of buried word lines may include a plurality of pairs of buried word lines, each pair including two buried word lines that face each other while including the plurality of third buried patterns therebetween.

Each of the plurality of pairs of buried word lines, and two active regions that face each other while including the plurality of fourth buried patterns therebetween from among the plurality of active regions, may be alternately disposed. The two active regions facing each other while including the plurality of fourth buried patterns therebetween, may face one of the plurality of buried word lines. A thickness of the plurality of buried bit lines extending in a direction from bottom to top of the substrate, may be less than a thickness of the plurality of buried word lines extending in a direction from bottom to top of the substrate.

According to yet other example embodiments of the inventive concepts, there is provided a method of manufacturing a semiconductor device. In this method, a plurality of first trenches are formed by partially etching a substrate. A plurality of first conductive patterns are formed in the plurality of first trenches in such a manner that a pair of first conductive patterns are disposed in each of the plurality of first trenches. A plurality of first buried patterns are formed in the plurality of first trenches to cover the plurality of first conductive patterns. Then, a plurality of second trenches are formed by etching the substrate between the plurality of first trenches. The plurality of second trenches include a pair of adjacent second trenches having the pair of first conductive patterns therebetween. A plurality of second buried patterns are formed in the plurality of second trenches.

The forming of the plurality of first conductive patterns may include forming a plurality of conductive layers for filling at least one portion of spaces in the plurality of first trenches therewith, respectively, and dividing each of the plurality of conductive layers into two parts so as to form the plurality of first conductive patterns covering inner sidewalls of the plurality of first trenches, respectively. The method may further include forming a plurality of sacrificial layer patterns on the substrate before the plurality of first trenches are formed. The forming of the plurality of first trenches may include etching the substrate by using the plurality of sacrificial layer patterns as an etch mask. The forming of the plurality of second trenches may include removing the plurality of sacrificial layer patterns, and etching the substrate exposed via regions from which the plurality of sacrificial layer patterns are removed.

The method may further include forming a plurality of first source/drain regions of a first conductive type by implanting impurity ions into the substrate via bottom surfaces of the plurality of first trenches, before the plurality of first conductive patterns are formed in the plurality of first trenches, and dividing each of the plurality of first source/drain regions into two parts by etching the substrate between a pair of first conductive patterns in each of the plurality of first trenches after the plurality of first conductive patterns are formed in the plurality of first trenches. After each of the plurality of first source/drain regions is divided into two parts, two first source/drain regions may be disposed between two adjacent first trenches from among the plurality of first trenches.

The forming of the plurality of second trenches may include forming a plurality of second upper trenches having a first depth by etching the substrate to the first depth, forming a plurality of non-floating body (NFB) ion implanting regions of a second conductive type by implanting impurity ions into the substrate via bottom surfaces of the plurality of second upper trenches, each of the plurality of NFB ion implanting regions being located between two first source/drain regions between two adjacent first trenches, and etching the substrate to pass through the plurality of NFB ion implanting regions starting from the bottom surfaces of the plurality of second upper trenches. Here, the second conductive type is different from the first conductive type, and the first depth is less than depths of the plurality of second trenches.

The method may further include forming a plurality of third trenches by partially etching the plurality of first buried patterns, the plurality of second buried patterns, and the substrate, bottom surfaces of the plurality of third trenches higher than upper surfaces of the plurality of first conductive patterns, forming a plurality of second conductive patterns in the plurality of third trenches in such a manner that a pair of second conductive patterns is disposed in each of the plurality of third trenches, forming a plurality of third buried patterns in the plurality of third trenches to cover the plurality of second conductive patterns, forming a plurality of fourth trenches by partially etching the substrate between the plurality of third trenches. The plurality of fourth trenches include a pair of adjacent fourth trenches having the pair of second conductive patterns therebetween, upper surfaces of the plurality of fourth trenches higher than the upper surfaces of the plurality of first conductive patterns; and forming a plurality of fourth buried patterns in the plurality of fourth trenches.

After the plurality of third buried patterns are formed and before the plurality of fourth trenches are formed, the method may further include forming a plurality of second source/drain regions of the first conductive type on the substrate by implanting impurity ions into the substrate. The method may further include forming a plurality of second source/drain regions of the first conductive type on the substrate by implanting impurity ions into the substrate, after the plurality of fourth buried patterns are formed in the plurality of fourth trenches. The method may further include forming a body contact line conductive layer below the plurality of fourth trenches, after the plurality of fourth trenches are formed, the plurality of fourth buried patterns formed on the body contact line conductive layer and in the plurality of fourth trenches, respectively. The plurality of first conductive patterns may be a plurality of bit lines. The plurality of second conductive patterns may be a plurality of word lines.

According to at least one example embodiment of the inventive concepts, a semiconductor device includes active regions spaced apart from each other in first and second directions in a substrate, a plurality of buried word lines extending in the first direction on sidewalls of a first group of the active regions arranged in the first direction, the first group including a first plurality of pairs of the active regions, upper surfaces of the plurality of buried word lines lower than an upper surface of the substrate, and a plurality of buried bit lines extending in the second direction on sidewalls of a second group of the active regions arranged in the second direction, a distance between adjacent active regions of the first group with at least two of the plurality of buried bit lines therebetween greater than a distance between active regions of at least one of the first plurality of pairs, upper surfaces of the plurality of buried bit lines lower than the upper surface of the substrate.

According to at least one example embodiment of the inventive concepts, a semiconductor device includes a plurality of active regions defined in a substrate by a plurality of first buried patterns, a plurality of second buried patterns, a plurality of third buried patterns, and a plurality of fourth buried patterns, the plurality of first buried patterns and the plurality of second buried patterns alternately buried in the substrate in a first direction, and the plurality of third buried patterns and the plurality of fourth buried patterns buried in the substrate in a second direction, a plurality of buried bit lines including a plurality of pairs of buried bit lines, each pair of buried bit lines including two buried bit lines facing each other, one of the plurality of first buried patterns between the two buried bit lines of each pair of buried bit lines, upper surfaces of the plurality of buried bit lines lower than an upper surface of the substrate, a plurality of buried word lines with upper surfaces between the upper surface of the substrate and upper surfaces of the plurality of pairs of buried bit lines, a plurality of first source/drain regions around the plurality of buried bit lines, and a plurality of second source/drain regions in the plurality of active regions in the substrate.

According to at least one example embodiment of the inventive concepts, a method of manufacturing a semiconductor device includes forming a plurality of first trenches by partially etching a substrate, forming a plurality of first conductive patterns in the plurality of first trenches such that a pair of first conductive patterns are in each of the plurality of first trenches, forming a plurality of first buried patterns in the plurality of first trenches to cover the plurality of first conductive patterns, forming a plurality of second trenches by partially etching the substrate between the plurality of first trenches, the plurality of second trenches including at least one pair of adjacent second trenches with one of the pairs of first conductive patterns therebetween, and forming a plurality of second buried patterns in the plurality of second trenches.

According to at least one example embodiment of the inventive concepts, a semiconductor device includes a plurality of active regions of a substrate, a plurality of bit lines in the substrate, each of the bit lines connected to at least one of the active regions and a plurality of word lines in the substrate, each of the word lines on a sidewall of at least one of the active regions.

BRIEF DESCRIPTION OF THE DRAWINGS

Example embodiments will be more clearly understood from the following brief description taken in conjunction with the accompanying drawings. FIGS. 1A-15 represent non-limiting example embodiments as described herein.

FIGS. 1A-1L are cross-sectional diagrams illustrating methods of manufacturing semiconductor devices according to example embodiments of the inventive concepts.

FIG. 5 is a layout plan view of structures that may be obtained by performing methods illustrated in FIGS. 4A-4N according to example embodiments of the inventive concepts;

FIGS. 6A-6L are cross-sectional diagrams illustrating methods of manufacturing the semiconductor devices illustrated in FIGS. 3A and 3B according to yet other example embodiments of the inventive concepts;

FIG. 9 is a perspective view of part of a 3D arrangement of semiconductor devices with a layout illustrated in FIG. 3A, and including a plurality of body contact lines of FIGS. 8A-8E, according to yet still other example embodiments of the inventive concepts;

FIG. 11 is a layout plan view of semiconductor devices according to still yet further example embodiments of the inventive concepts;

FIG. 13 is a plan view illustrating memory modules including semiconductor memory devices according to example embodiments of the inventive concepts;

FIG. 14 is a schematic block diagram of memory cards including semiconductor devices according to example embodiments of the inventive concepts; and FIG. 15 is a schematic block diagram of systems that include semiconductor devices according to example embodiments of the inventive concepts.

Figure 1A:
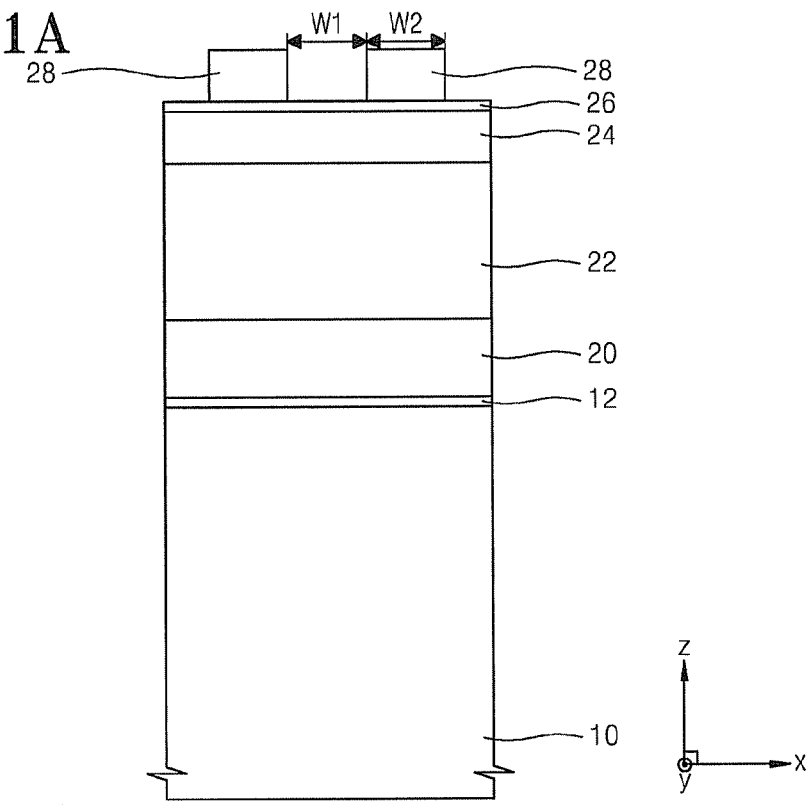

It should be noted that these figures are intended to illustrate the general characteristics of methods, structure and/or materials utilized in certain example embodiments of the inventive concepts and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments of the inventive concepts. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIGS. 1A-1L are cross-sectional diagrams illustrating methods of manufacturing semiconductor devices according to example embodiments of the inventive concepts. Referring to FIG. 1A, a pad oxide layer 12 and a sacrificial layer 20 may be formed on a substrate 10 (e.g., sequentially). A first hard mask layer 22, a second hard mask layer 24, an anti-reflection layer 2, and a plurality of photoresist patterns 28 may be formed on the sacrificial layer 20 (e.g., sequentially). The substrate 10 may be, for example, a silicon substrate. The pad oxide layer 12 may be formed by, for example, oxidizing a surface of the substrate 10 by thermal oxidation and/or radical oxidation. The pad oxide layer 12 may be used as an etch stop. In some cases, the pad oxide layer 12 may not be formed.

The sacrificial layer 20, the first hard mask layer 22, and the second hard mask layer 24 may include materials with different etch selectivities. For example, the sacrificial layer 20 may be, for example, polysilicon. The first hard mask layer 22 may be, for example, a silicon nitride layer and/or a silicon oxide layer. The second hard mask layer 24 may be, for example, a silicon oxide layer, a silicon nitride layer, and/or an amorphous carbon layer (ACL), and/or a layer including a hydrocarbon compound and/or a derivative thereof. For example, with a relatively high carbon content of about 85 to 99% by weight of the total weight of the hydrocarbon compound and/or a derivative thereof (hereinafter referred to as a "Spin On Hard mask (SOH) layer"). The anti-reflection layer 26 may be, for example, a silicon oxynitride layer.

The substrate 10 may include a plurality of trench regions arranged in a line in a first direction (e.g., an X-axis direction in FIG. 1A). The plurality of photoresist patterns 28 may each be formed with a second width W2, with an interval of a first width W1 therebetween. Upper surfaces of the plurality of photoresist patterns 28 may be line shaped with the second width W2 and extending in a second direction (Y-axis direction) perpendicular to the first direction (x-axis direction). The first width W1 and the second width W2 may be the same or may be different according to the design of a desired pattern.

Figure 1B:
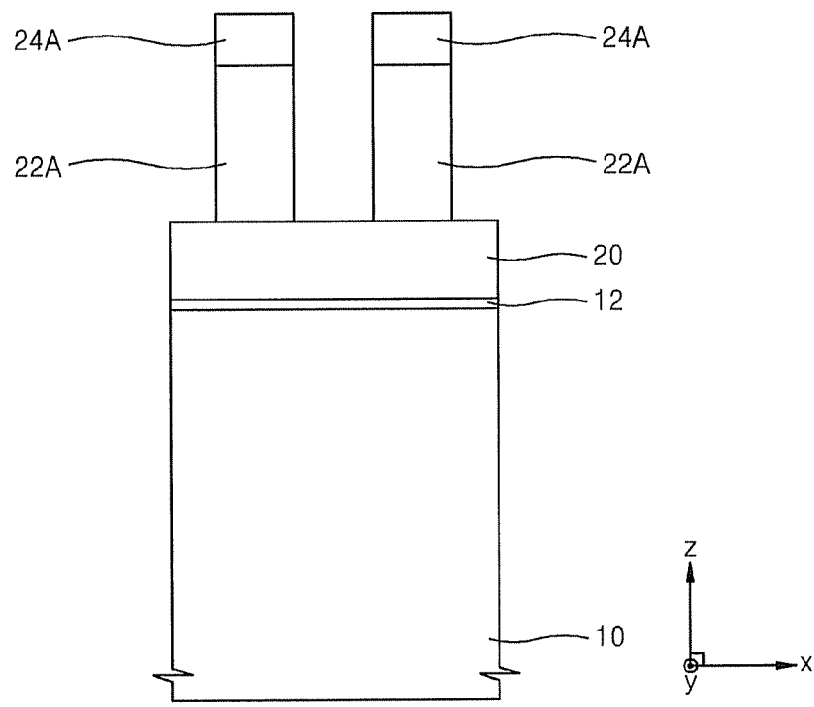

Referring to FIG. 1B, a plurality of anti-reflection layer patterns (not shown) and a plurality of second hard mask patterns 24A may be formed by etching the anti-reflection layer 26 and the second hard mask layer 24 by using the plurality of photoresist patterns 28 as an etch mask. A plurality of first hard mask patterns 22A may be formed by etching the first hard mask layer 22 using the plurality of second hard mask patterns 24A as an etch mask. An upper surface of the sacrificial layer 20 may be exposed via the plurality of first hard mask patterns 22A. The plurality of second hard mask patterns 24A may partially remain but example embodiments of the inventive concept are not limited thereto. For example, after the plurality of first hard mask patterns 22A are formed by etching the first hard mask layer 22, the shapes of remnants of the second hard mask layer 24 that remain on the first hard mask patterns 22A may vary according to etch conditions.

Figure 1C:
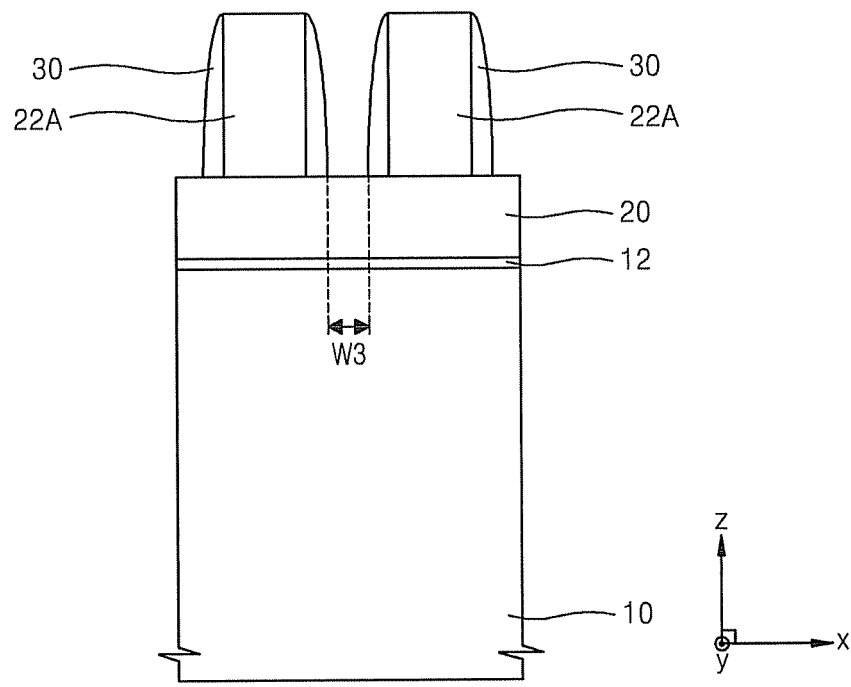

Referring to FIG. 1C, upper surfaces of the plurality of first hard mask pattern 22A may be exposed by removing the plurality of second hard mask patterns 24A from the plurality of first hard mask pattern 22A, and a plurality of first spacers 30 may be formed covering both sidewalls of the plurality of first hard mask patterns 22A. In order to form the plurality of first spacers 30, a first spacer layer (not shown) may be formed on the resultant structure having the plurality of first hard mask patterns 22A thereon so as to cover the upper surfaces and sidewalls of the plurality of first hard mask patterns 22A, and the first spacer layer may be etched using, for example, an etch-back process. The first spacer 30 may be, for example, a silicon oxide layer. A third width W3 between the plurality of first hard mask patterns 22A, via which the sacrificial layer 20 may be exposed, may be less than the first width W1 (see FIG. 1A). According to other example embodiments of the inventive concepts, the plurality of first spacers 30 may not be formed. For example, if a width WT1 of each of a plurality of first trenches 32 of FIG. 1E, which may be formed in the substrate 10 in the X-axis direction, is equal to the first width W1 (see FIG. 1A), then the plurality of first spacers 30 may not be formed.

Figure 1D:
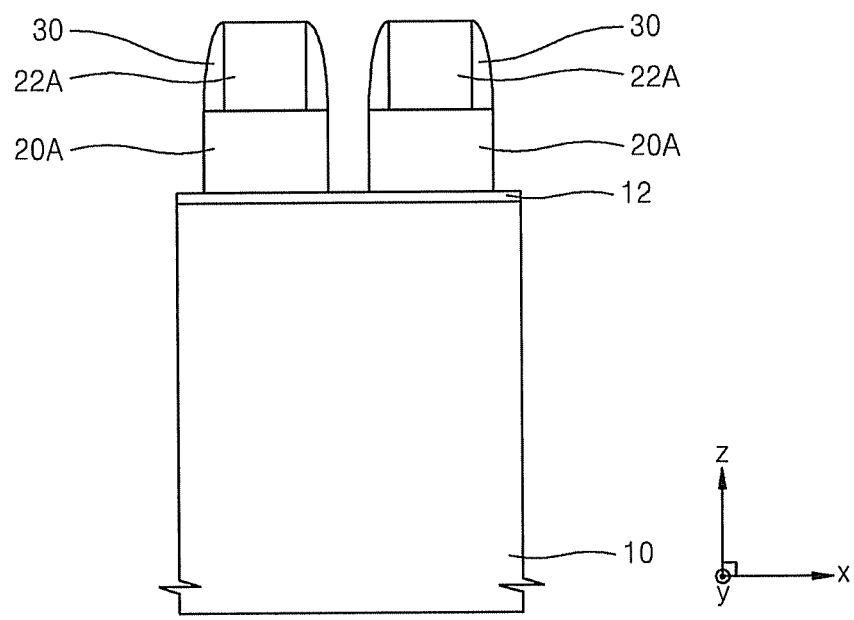
Figure 1E:
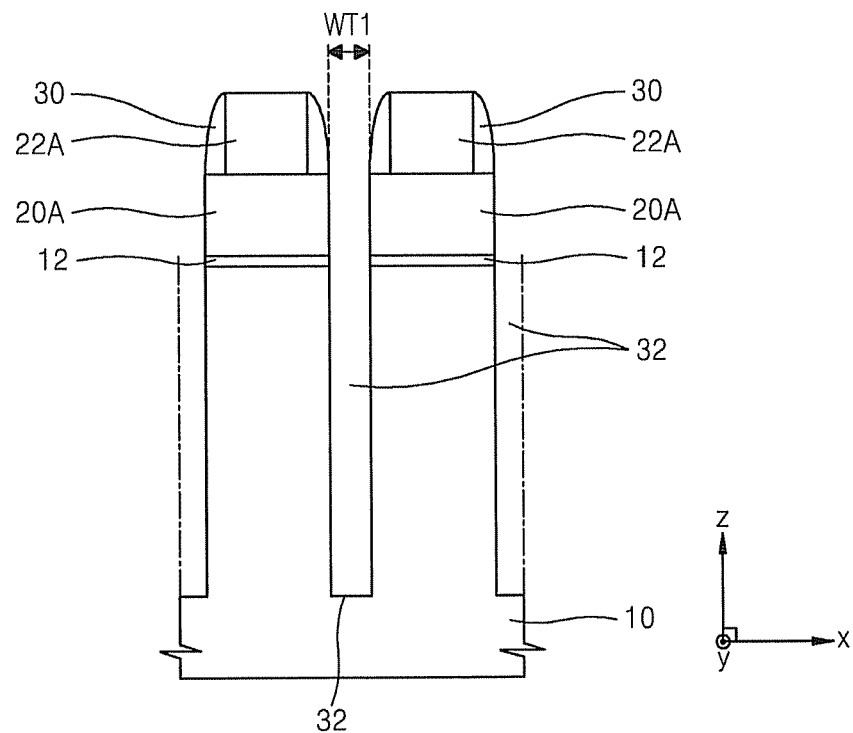

Referring to FIG. 1D, a plurality of sacrificial layer patterns 20A may be formed by etching the sacrificial layer 20 using the plurality of first hard mask patterns 22A and the plurality of first spacers 30 as etch masks. While the sacrificial layer 20 may be etched, the plurality of first hard mask patterns 22A and the plurality of first spacers 30 may be partially removed. Referring to FIG. 1E, the plurality of first trenches 32 may be formed in the substrate 10 by etching the pad oxide layer 12 and the substrate 10 using the plurality of first hard mask patterns 22A, the plurality of first spacers 30, and the plurality of sacrificial layer patterns 20A as etch masks. In a top view, the plurality of first trenches 32 may be a plurality of line shapes that extend in parallel with each other. The plurality of first trenches 32 may be formed in the even or odd-numbered trench regions from among the plurality of trench regions of the substrate 10.

Figure 1F:
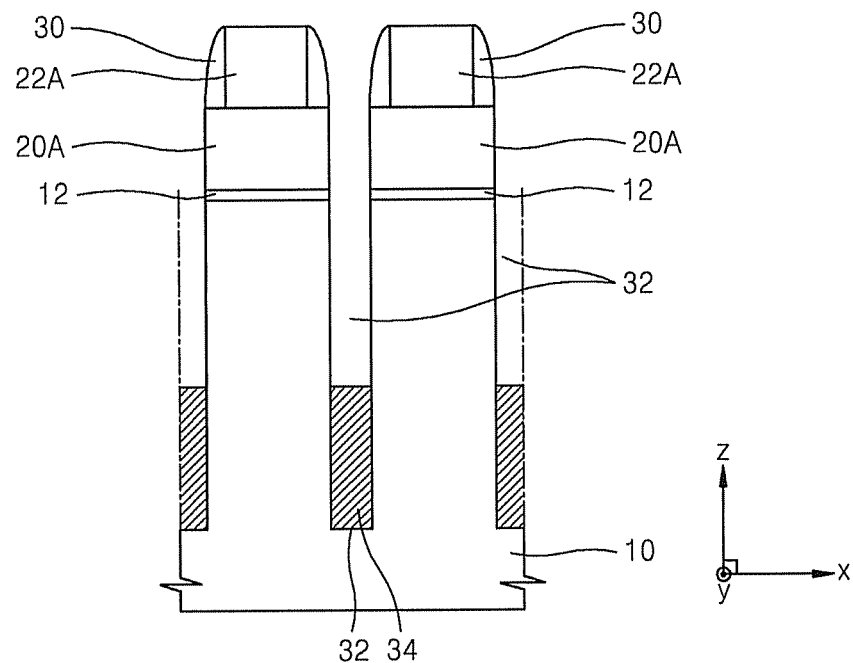

Referring to FIG. 1F, a plurality of conductive layers 34 may be formed in the plurality of first trenches 32, respectively. The plurality of first trenches 32 may be partially filled with the plurality of conductive layers 34, respectively, but example embodiments of the inventive concepts are not limited thereto. The shapes of the plurality of conductive layers 32 to may be formed in the plurality of trenches 32 may vary according to the type and shape of a device to be formed on the substrate 10. The plurality of conductive layers 34 may include, for example, doped polysilicon, metal, a metallic nitride, a metal silicide, and/or the like. In order to form the plurality of conductive layers 34 of FIG. 1F, a conductive material layer may be formed in the plurality of first trenches 32 in such a manner that the insides of the plurality of first trenches 32 may be filled with the conductive material layer, and the conductive material layer may be etched (e.g., using an etch-back) in such a manner that only the plurality of conductive layers 34 remain.

Figure 1G:
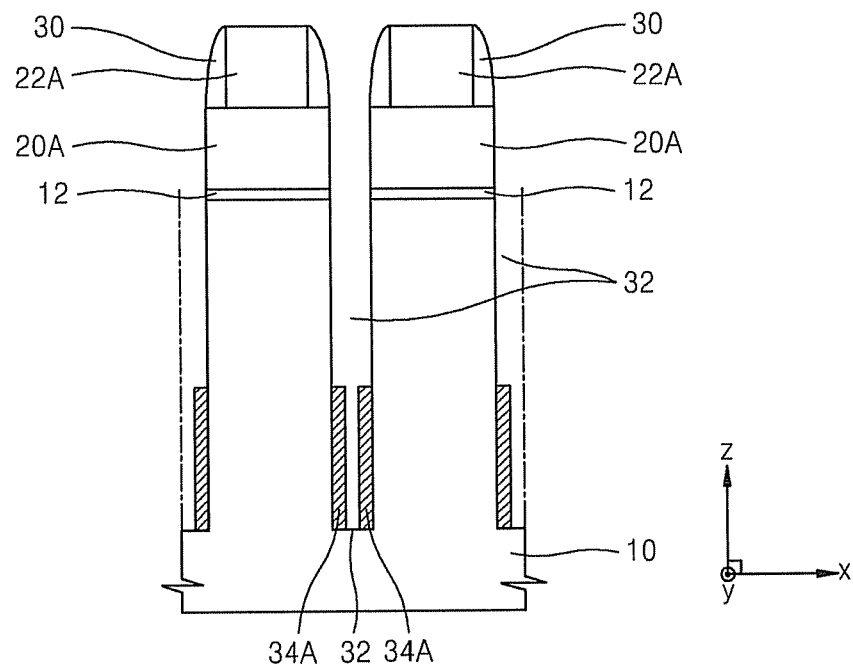
Figure 1H:
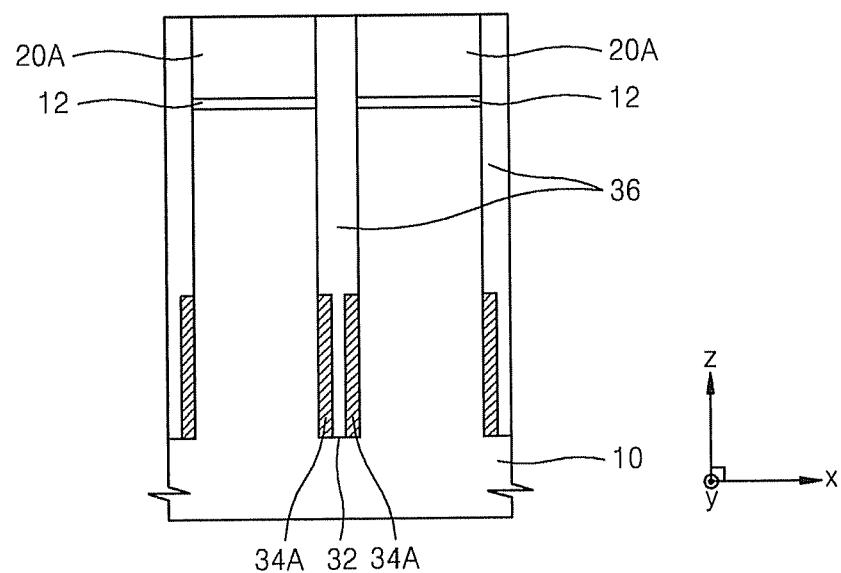

Referring to FIG. 1G, a plurality of conductive patterns 34A may be formed by dividing each of the plurality of conductive layers 34, which may be formed in the plurality of first trenches 32, respectively, into parts. An additional etch mask (not shown) may be used to form the plurality of conductive patterns 34A. According to other example embodiments of the inventive concepts, the plurality of conductive layers 34 described above with reference to FIG. 1F and the plurality of conductive patterns 34A described above with reference to FIG. 1G, may not be formed. Referring to FIG. 1H, a first buried layer (not shown) may be formed in the plurality of first trenches 32 in such a manner that the insides of the plurality of first trenches 32 may be completely filled with the first buried layer and the plurality of conductive patterns 34A may be covered by the first buried layer. The first buried layer may be planarized so as to remove material formed on the sacrificial layer pattern 20A until upper surfaces of the plurality of sacrificial layer patterns 20A are exposed, thereby forming a plurality of first buried patterns 36 in the plurality of first trenches 32. As an example, chemical mechanical polishing (CMP) may be used to planarize the first buried layer.

Figure 1I:
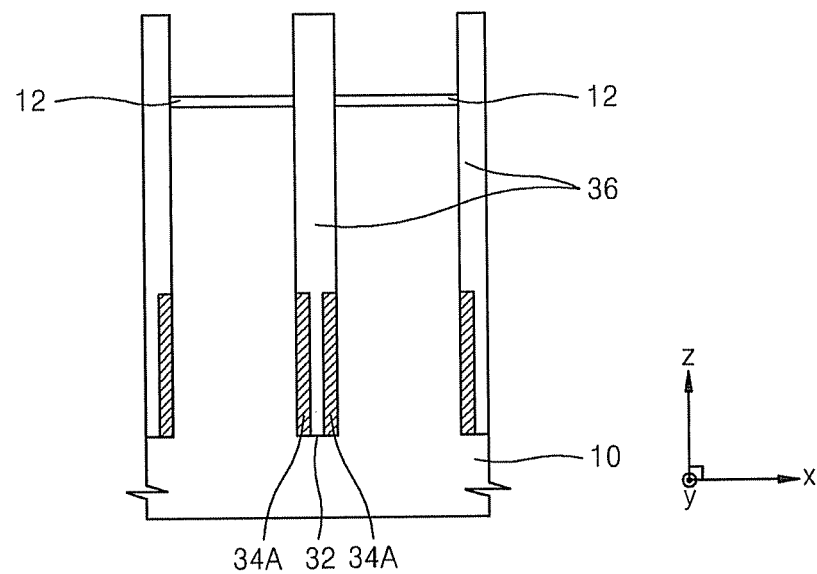

If the above operations described with reference to FIGS. 1F and 1G are omitted, then the insides of the plurality of first trenches 32 may be filled only with the plurality of first buried patterns 36 without the plurality of conductive patterns 34A. The plurality of first buried patterns 36 may be formed of at least one of various materials according to use thereof. The plurality of first buried patterns 36 may include, for example, an oxide, a nitride and/or a compound thereof. The plurality of first buried patterns 36 may be formed of a single or multi-layer structure. Referring to FIG. 1I, the first sacrificial layer pattern 20A may be removed so that upper sidewalls of the plurality of first buried patterns 36 may protrude from an upper surface of the pad oxide layer 12.

Figure 1J:
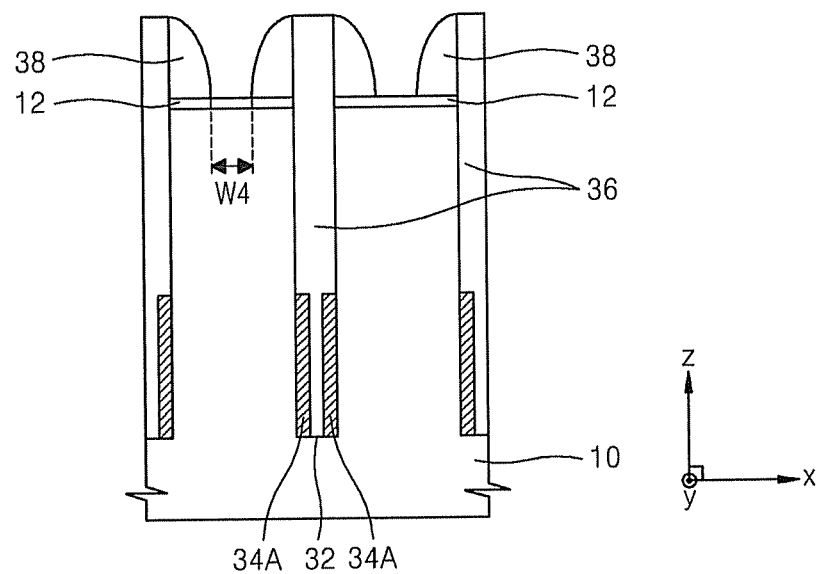

Referring to FIG. 1J, a plurality of second spacers 38 may be formed on the pad oxide layer 12 to cover sidewalls of the plurality of first buried patterns 36, respectively. In order to form the plurality of second spacers 38, a second spacer layer (not shown) may be formed on the resultant structure in which the upper sidewalls of the plurality of first buried patterns 36 protrude from the upper surface of the pad oxide layer 12, covering upper surfaces and sidewalls of the plurality of first buried patterns 36, and may then be etched (e.g., by etch-back) in such a manner that the plurality of second spacers 38 may remain. The plurality of second spacers 38 may include, for example, a silicon oxide layer. A width WT2 of each of a plurality of second trenches 42 (see FIG. 1K), which may be formed in the substrate 10, may be determined by a fourth width W4 that may be the distance between two adjacent second spacers 38 from among the plurality of second spacers 38.

Figure 1K:
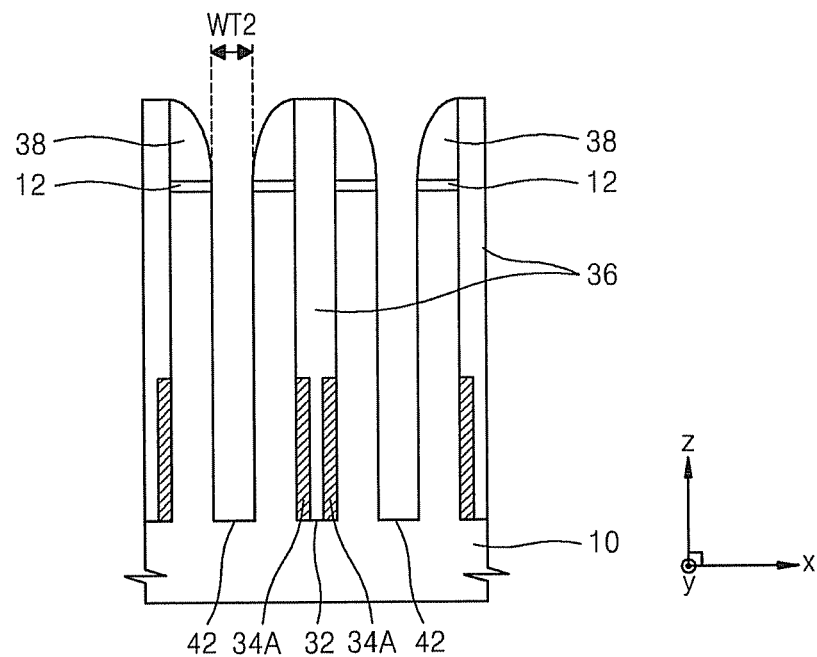

Referring to FIG. 1K, the plurality of second trenches 42 may be formed in the substrate 10 by etching the exposed pad oxide layer 12 using the plurality of first buried patterns 36 and the plurality of second spacers 38 as etch masks and etching the substrate 10 exposed by the etching of the pad oxide layer 12. In a top view, the plurality of second trenches 42 may extend in parallel with each other in the Y-axis direction as a plurality of line shapes. The plurality of second trenches 42 may be formed between the plurality of first trenches 32 in the substrate 10.

The depths of the plurality of second trenches 42 in the substrate 10 may be appropriately determined as occasion demands. For example, the depths of the plurality of second trenches 42 may be determined in such a manner that in the substrate 10, bottom surfaces of the plurality of second trenches 42 may be level with or lower than those of the plurality of conductive patterns 34A. Otherwise, the depths of the plurality of second trenches 42 may be determined in such a manner that the bottom surfaces of the plurality of second trenches 42 may be higher than those of the plurality of conductive patterns 34A.

Figure 1L:
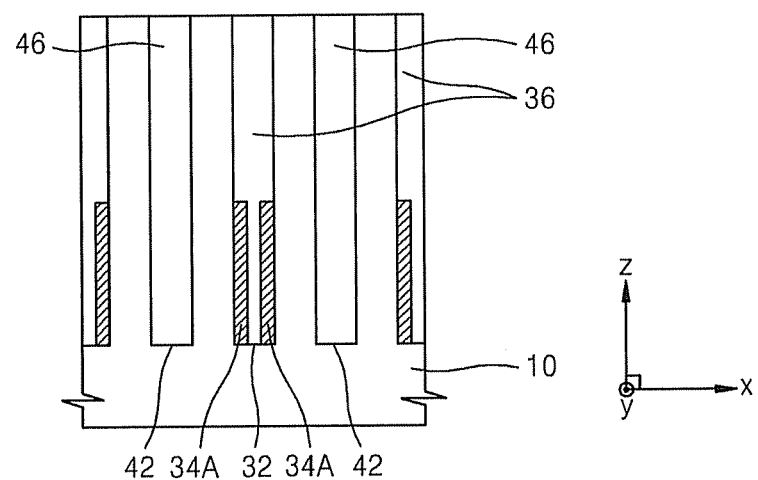

Referring to FIG. 1L, a second buried layer (not shown) may be formed to completely fill the insides of the plurality of second trenches 42 with the second buried layer and may then be planarized to remove layers from the substrate 10 until the upper surface of the substrate 10 may be exposed, thereby forming a plurality of second buried patterns 46 in the plurality of second trenches 42. The planarization process may be, for example, CMP. The plurality of second buried patterns 46 may be formed of at least one of various materials according to use thereof. For example, the plurality of second buried patterns 46 may include at least one of an oxide, a nitride, and a compound thereof. An active region in the substrate 10, which may be defined by two adjacent first buried patterns 36 from among the plurality of first buried patterns 36, may be divided into two parts by the second buried pattern 46 disposed between the two adjacent first buried patterns 36. A memory cell including the plurality of conductive patterns 34A may be individually formed in each of the two parts of the active region, for example.

In the methods of manufacturing a semiconductor device described above with reference to FIGS. 1A-1L, the plurality of first trenches 32 may first be formed from among a plurality of trenches, and then, the plurality of second trenches 42 which may be the other trenches may be formed between every two adjacent first trenches 32 from among the plurality of first trenches 32, respectively. Accordingly, it may be possible to form a plurality of trenches having a fine width at fine intervals using a pattern, the size of which may fall within the range of resolutions that may be achieved by using exposure equipment and techniques that may be supported by a contemporary lithography technology even when the plurality of trenches may have a fine size according to a decreasing design rule. Furthermore, it may be possible to form the plurality of trenches while securing a sufficient process margin.

According to the method of FIGS. 1A-1L, a cross-section of the substrate 10 between an adjacent first trench 32 and second trench 42 may have an asymmetric shape in the horizontal direction, because the plurality of first trenches 32 may be formed and the plurality of second trenches 42 may then be formed between every two adjacent first trenches 32, respectively. A plurality of regions of the substrate 10 may be defined by the plurality of first trenches 32 and the plurality of second trenches 42, and may be designed to have various cross-sections in terms of size and/or shape by adjusting the widths or depths of the plurality of first trenches 32 and the plurality of second trenches 42 and/or adjusting the distances between the plurality of first trenches 32 and the plurality of second trenches 42.

Figure 2A:
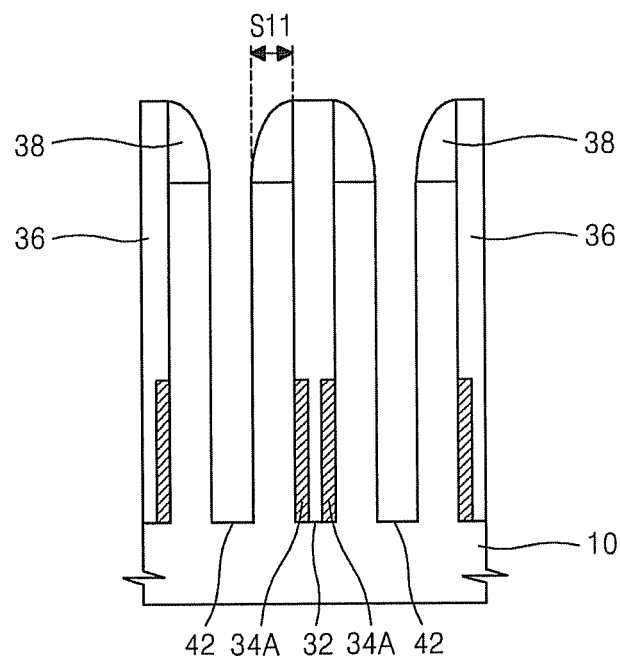
FIGS. 2A-2K are cross-sectional diagrams illustrating variations of the semiconductor devices fabricated by the methods illustrated in FIGS. 1A-1L according to various example embodiments of the inventive concepts.
Figure 2B:
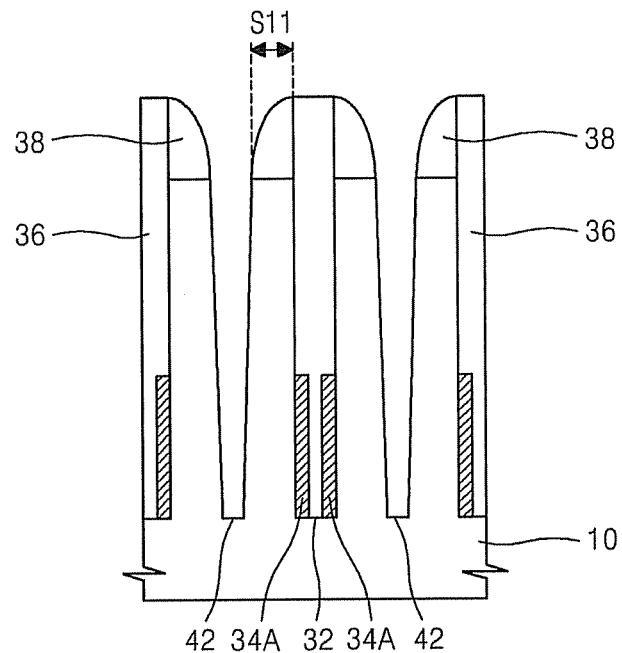
Figure 2C:
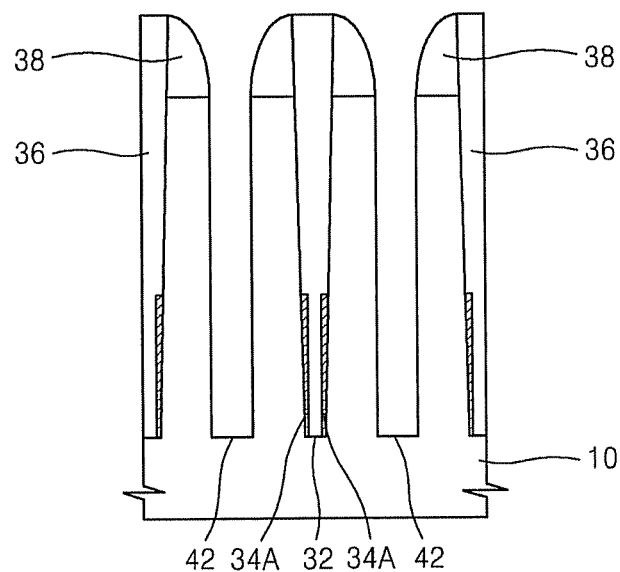
Figure 2D:
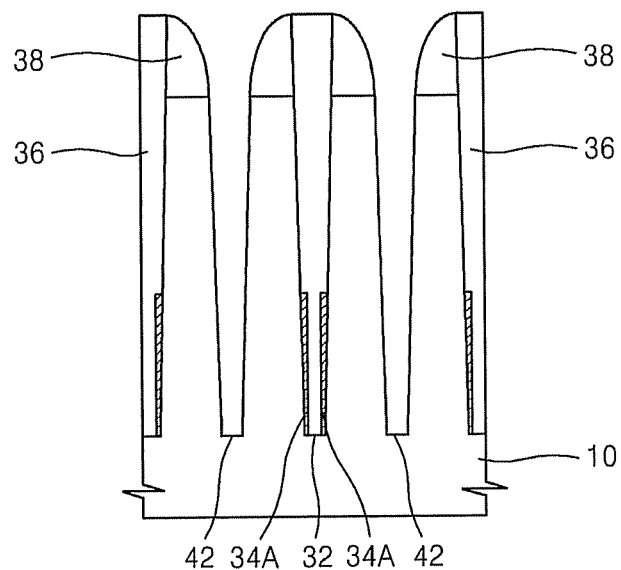
Figure 2E:
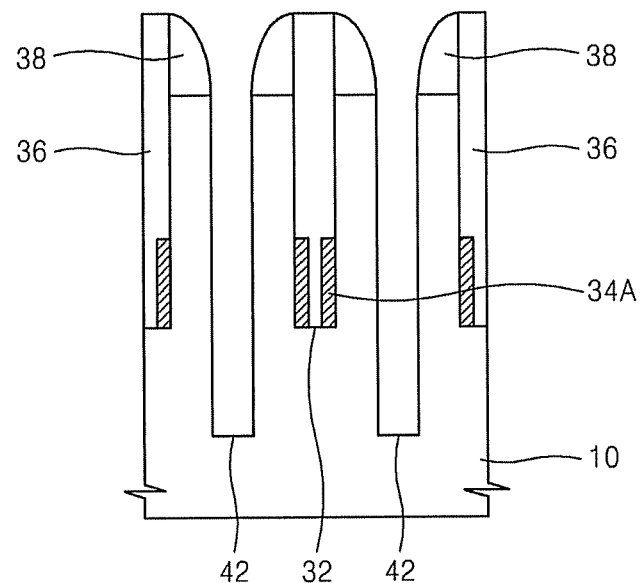
Figure 2F:
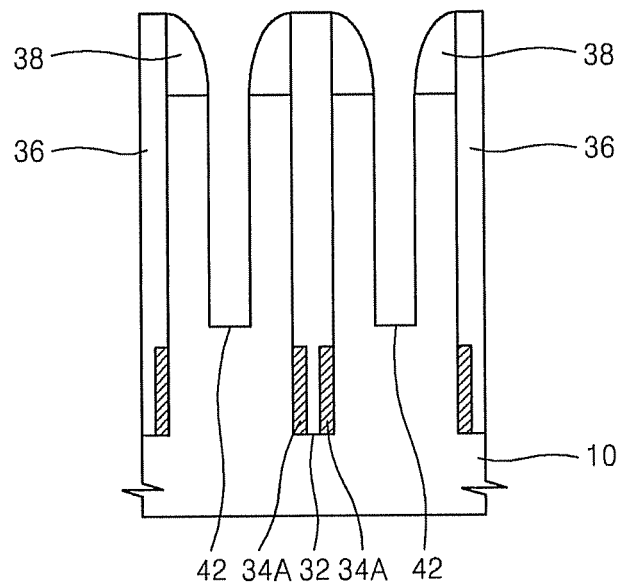
Figure 2G:
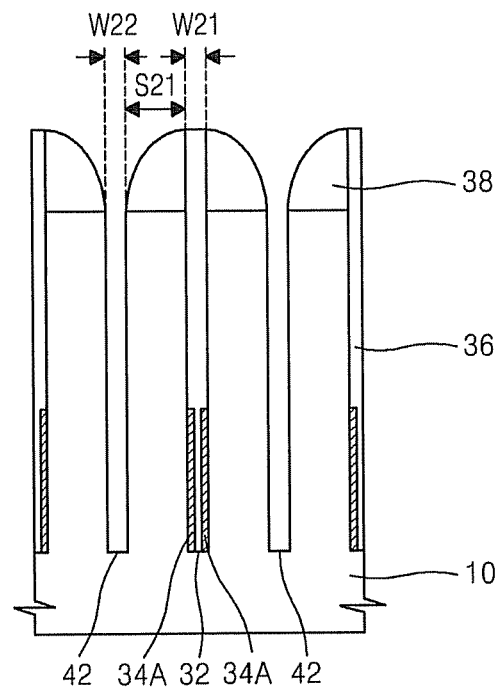
Figure 2H:
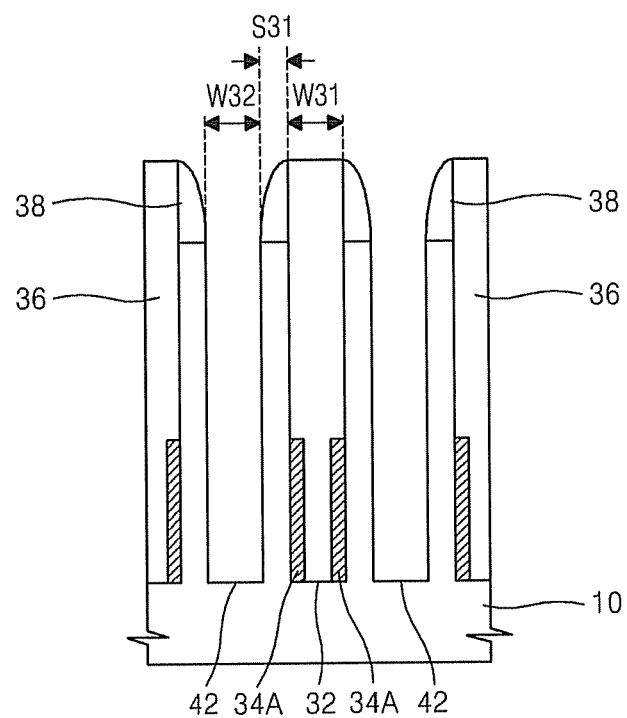
Figure 2I:
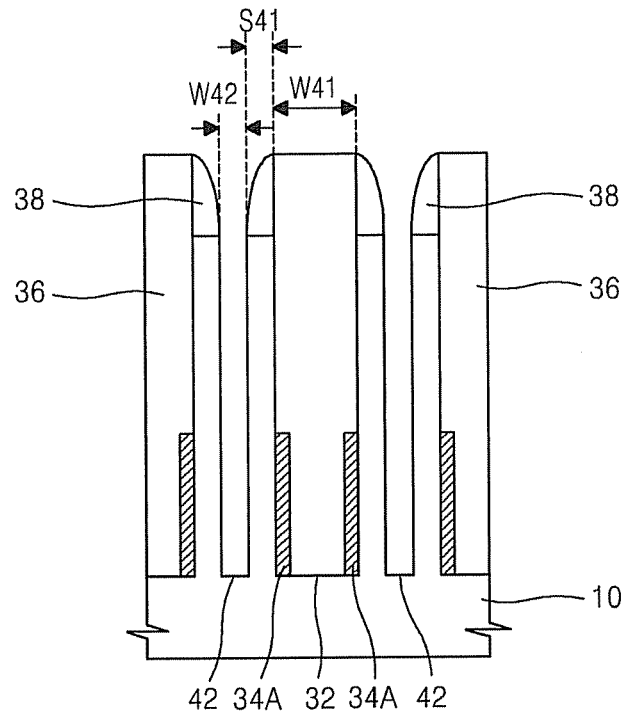
Figure 2J:
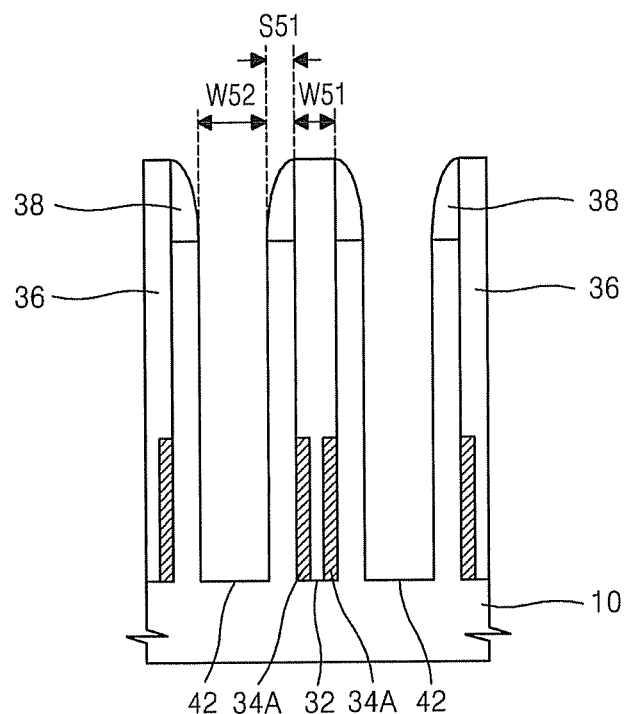
Figure 2K:
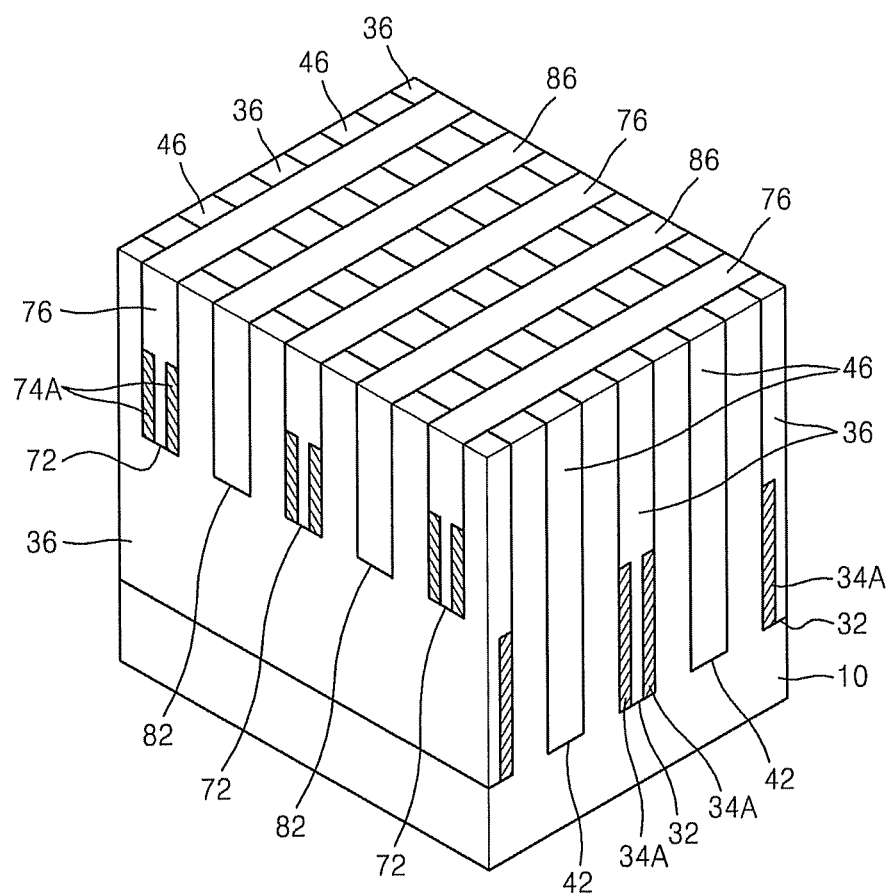

FIGS. 2A-2K are cross-sectional diagrams illustrating variations of the semiconductor devices fabricated by the methods illustrated in FIGS. 1A-1L, and particularly, a plurality of first trenches 32 and a plurality of second trenches 42 of the semiconductor device according to various example embodiments of the inventive concept. FIG. 2K may be a perspective view of a part of structures that may be obtained by sequentially performing the operations of or operations corresponding to FIGS. 1A-1L twice. In FIGS. 2A-2K, for convenience of explanation, an element corresponding to that of FIGS. 1A-1L may be denoted by the same reference numeral. Although the pad oxide layer 12 is not illustrated, the pad oxide layer 12 may or may not be present.

Referring to FIG. 2A, a plurality of first trenches 32 and a plurality of second trenches 42 may be formed to a same depth and width at regular intervals. Elements may be formed on a substrate 10 that may be located between the plurality of first trenches 32 and the plurality of second trenches 42 and may be defined by the plurality of first trenches 32, and the plurality of second trenches 42 may have a width S11 and the same shape. FIG. 2B may illustrate a case where depths of the plurality of first trenches 32 may be the same as those of the plurality of second trenches 42 but cross-sectional profiles of the plurality of first trenches 32 may be different from those of the plurality of second trenches 42. For example, inclinations of sidewalls of the plurality of second trenches 42 may be less than those of sidewalls of the plurality of first trenches 32. Referring to FIG. 2B, widths of active regions of the substrate 10, which may be located between the plurality of first trenches 32 and the plurality of second trenches 42 and may be defined by the plurality of first trenches 32 and the plurality of second trenches 42, and may increase from top to bottom. The cross-sections of two active regions of the substrate 10 that may be present at both sides of one of the plurality of first trenches 32 or one of the plurality of second trenches 42, respectively, may be different in terms of shape or may be linearly symmetrical with each other.

FIG. 2C may illustrate a case where depths of the plurality of first trenches 32 may be the same as those of the plurality of second trenches 42 but cross-sectional profiles of the plurality of first trenches 32 may be different from those of the plurality of second trenches 42. Inclinations of sidewalls of the plurality of first trenches 42 may be less than those of sidewalls of the plurality of second trenches 32. Referring to FIG. 2C, the widths of the active regions of the substrate 10, which may be located between the plurality of first trenches 32 and the plurality of second trenches 42, and may be defined by the plurality of first trenches 32 and the plurality of second trenches 42, may increase from top to bottom. The cross-sections of two active regions of the substrate 10 that may be present at both sides of one of the plurality of first trenches 32 and/or one of the plurality of second trenches 42, respectively, may be different in terms of shape or may be linearly symmetrical with each other.

FIG. 2D may illustrate a case where the depths of the plurality of first trenches 32 may be the same as those of the plurality of second trenches 42, and inclinations of the sidewalls of the plurality of first trenches 32 and the plurality of second trenches 42 may be greater than in the case of FIG. 2A. Referring to FIG. 2D, the widths of the active regions of the substrate 10, which may be located between the plurality of first trenches 32 and the plurality of second trenches 42, and may be defined by the plurality of first trenches 32 and the plurality of second trenches 42, may increase from top to bottom. The shapes of the cross-sections of two active regions of the substrate 10 that may be present at both sides of one of the plurality of first trenches 32 and/or one of the plurality of second trenches 42, respectively, may be the same or may be different according to the inclinations of the sidewalls of the plurality of first trenches 32 and the plurality of second trenches 42.

FIG. 2E may illustrate a case where the cross-sectional profiles of the plurality of first trenches 32 may be similar to those of the plurality of second trenches 42, as illustrated in FIG. 2A, but the depths of the plurality of first trenches 32 may be different from those of the plurality of second trenches 42. FIG. 2E may illustrate a case where the depths of the plurality of second trenches 42 may be greater than those of the plurality of first trenches 32. FIG. 2F may illustrates a case where the cross-sectional profiles of the plurality of first trenches 32 may be similar to those of the plurality of second trenches 42, as illustrated in FIG. 2A but the depths of the plurality of first trenches 32 may be different from those of the plurality of second trenches 42. FIG. 2F may illustrate a case where the depths of the plurality of first trenches 32 may be greater than those of the plurality of second trenches 42.

FIG. 2G may illustrate a case where the cross-sectional profiles and depths of the plurality of first trenches 32 may be similar to those of the plurality of second trenches 42, respectively, but widths W21 of the plurality of first trenches 32 and widths W22 of the plurality of second trenches 42 may be less than in the case of FIG. 2A. FIG. 2G may illustrate a case where widths S21 of active regions of the substrate 10, which may be located between the plurality of first trenches 32 and the plurality of second trenches 42, and may be defined by the plurality of first trenches 32 and the plurality of second trenches 42, may be greater than the widths W21 of the plurality of first trenches 32 and the widths W22 of the plurality of second trenches 42. Referring to FIG. 2G, the active regions located between the plurality of first trenches 32 and the plurality of second trenches 42, and defined by the plurality of first trenches 32 and the plurality of second trenches 42, may be a width S21 and may be the same shape.

FIG. 2H illustrates a case where the cross-sectional profiles and depths of the plurality of first trenches 32 are similar to those of the plurality of second trenches 42, respectively, but widths W31 of the plurality of first trenches 32 and widths W32 of the plurality of second trenches 42 may be greater than in the case of FIG. 2A. FIG. 2H may illustrate a case where widths S31 of active regions of the substrate 10, which may be located between the plurality of first trenches 32 and the plurality of second trenches 42, and may be defined by the plurality of first trenches 32 and the plurality of second trenches 42, may be less than the widths W31 of the plurality of first trenches 32 and the widths W32 of the plurality of second trenches 42. Referring to FIG. 2H, the active regions located between the plurality of first trenches 32 and the plurality of second trenches 42, and defined by the plurality of first trenches 32 and the plurality of second trenches 42, may be a width S31 and may be a same shape.

FIG. 2I may illustrate a case where depths of the plurality of first trenches 32 may be similar to those of the plurality of second trenches 42 but widths W41 of the plurality of first trenches 32 may be different from widths W42 of the plurality of second trenches 42. FIG. 2I may illustrate a case where the widths W41 of the plurality of first trenches 32 may be greater than the widths W42 of the plurality of second trenches 42. Referring to FIG. 2I, the active regions that may be defined by the plurality of first trenches 32 and the plurality of second trenches 42 after the plurality of first trenches 32 and the plurality of second trenches 42 may be formed in the substrate 10 may be a width S41 and may be a same shape.

FIG. 2J may illustrate a case where depths of the plurality of first trenches 32 are similar to those of the plurality of second trenches 42 but widths W51 of the plurality of first trenches 32 may be different from widths W52 of the plurality of second trenches 42. FIG. 2J may illustrate a case where the widths W51 of the plurality of first trenches 32 may be less than the widths W52 of the plurality of second trenches 42. Referring to FIG. 2J, the active regions that may be defined by the plurality of first trenches 32 and the plurality of second trenches 42 after the plurality of first trenches 32 and the plurality of second trenches 42 are formed in the substrate 10 may be a width S51 and may be a same shape.

FIG. 2K is a perspective diagram illustrating structures obtained by sequentially performing the operations of FIGS. 1A-1L twice according to other example embodiments of the inventive concepts. A plurality of third trenches 72 and a plurality of fourth trenches 82 may be formed in parallel to one another and may intersect a plurality of first trenches 32 and a plurality of second trenches 42 by using one of the operations described above with reference to FIGS. 2A-2J. Referring to FIG. 2K, the plurality of third trenches 72 may be formed by performing an operation similar to the operation that may be performed to form the plurality of first trenches 32. The plurality of fourth trenches 82 may be formed by performing an operation similar to the operation that may be performed to form the plurality of second trenches 42.

In the plurality of third trenches 72, a plurality of conductive patterns 74A similar to the plurality of conductive patterns 34A of FIG. 1G and a plurality of third buried patterns 76 similar to the plurality of first buried patterns 36 of FIG. 1H may be formed. In the plurality of fourth trenches 82, a plurality of fourth buried patterns 86 similar to the plurality of second buried patterns 46 of FIG. 1L may be formed. According to other example embodiments of the inventive concepts, some or all of the plurality of conductive patterns 34A and the plurality of conductive patterns 74A illustrated in FIG. 2K may not be formed.

FIG. 2K may illustrate a case where a direction in which the plurality of third trenches 72 and the plurality of fourth trenches 82 extend, may be perpendicular to a direction in which the plurality of first trenches 32 and a plurality of second trenches 42 extend, but example embodiments of the inventive concepts are not limited thereto. According to example embodiments of the inventive concepts, the direction in which the plurality of third trenches 72 and the plurality of fourth trenches 82 extend may not be limited. For example, the direction in which the plurality of third trenches 72 and the plurality of fourth trenches 82 extend may be the same as or may differ from the direction in which the plurality of first trenches 32 and the plurality of second trenches 42 may extend.

Figure 3A:
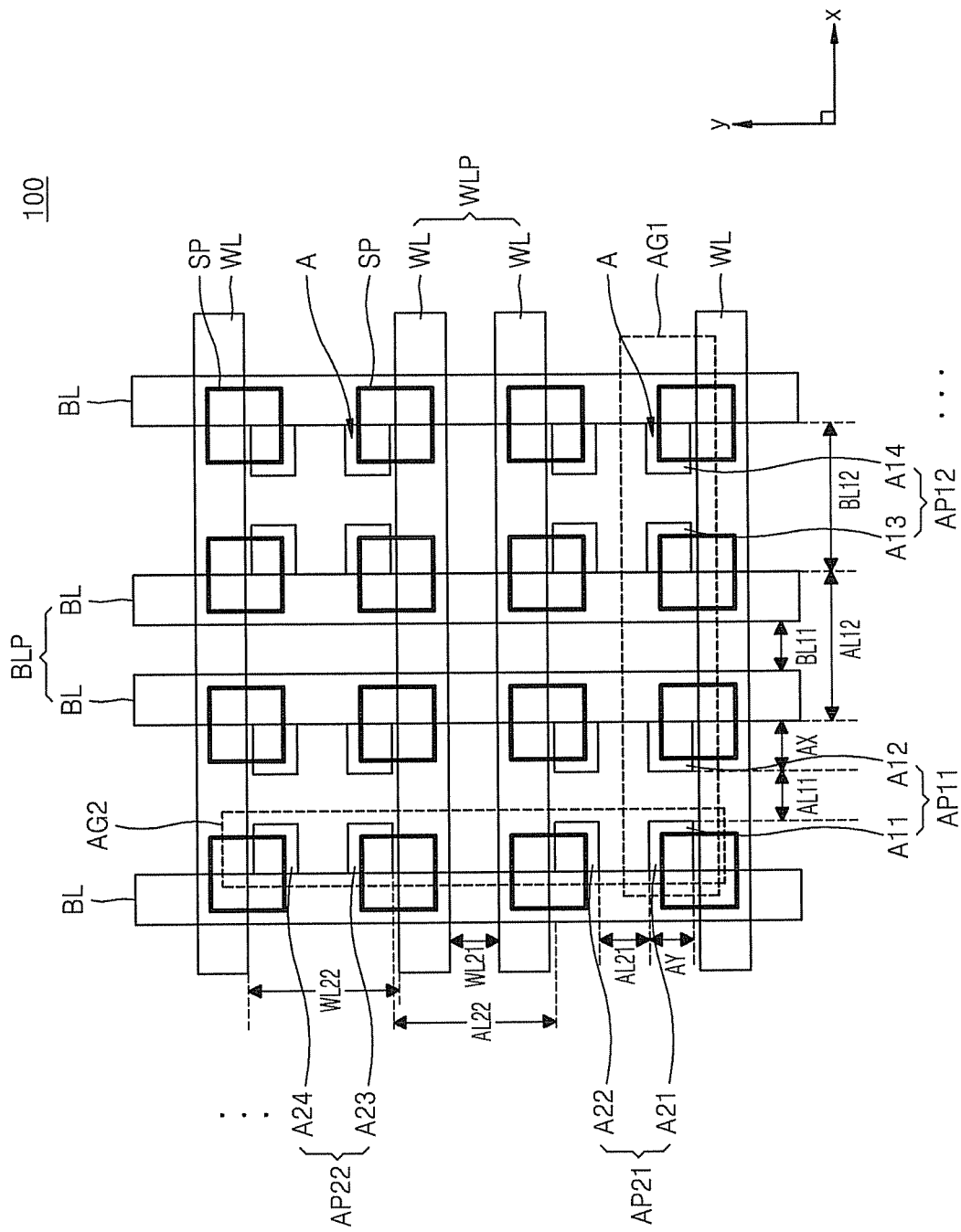
FIG. 3A is a layout plan view illustrating semiconductor devices according to example embodiments of the inventive concepts.
Figure 3B:
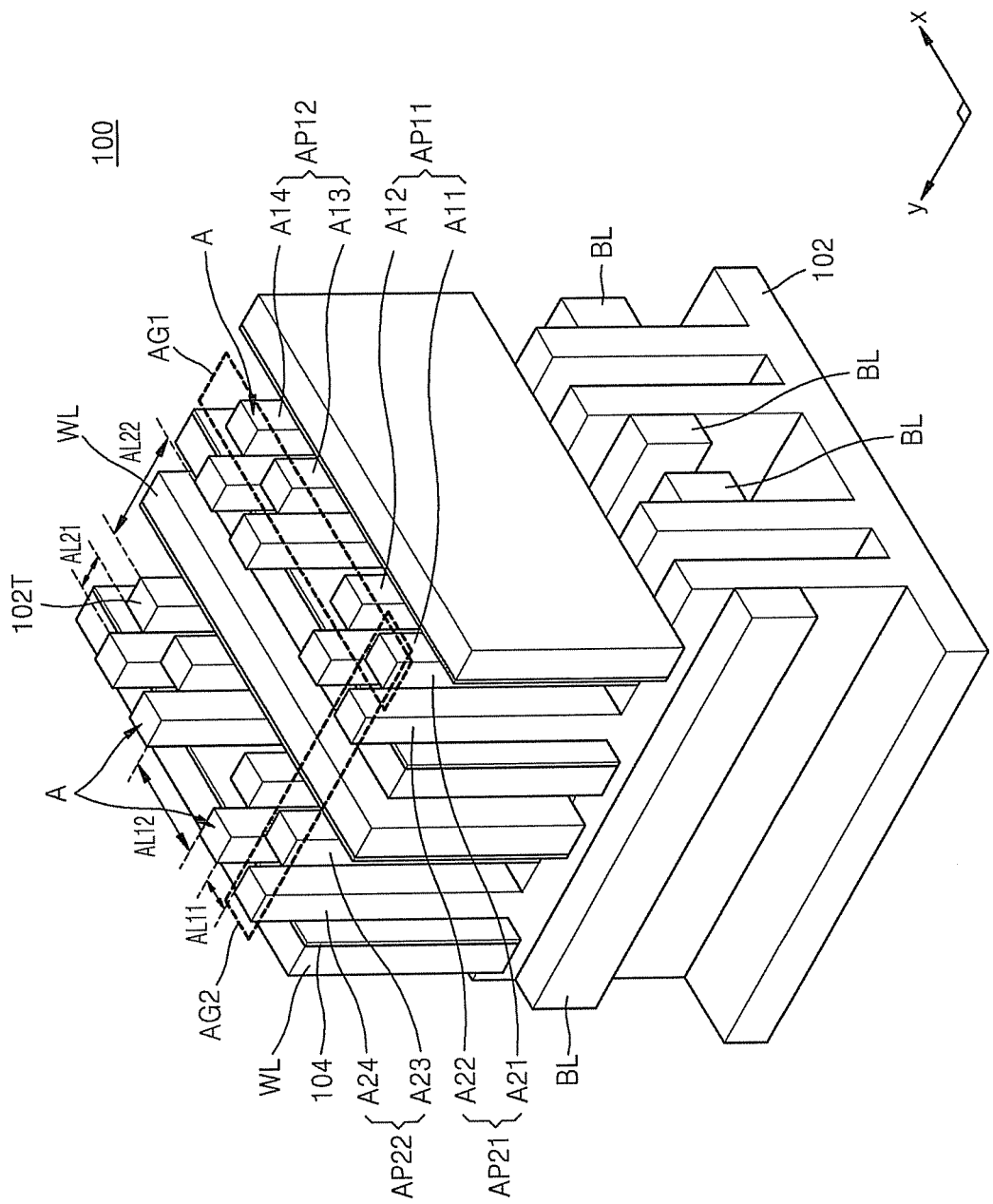
FIG. 3B is a perspective view illustrating part of a three-dimensional (3D) arrangement of the semiconductor devices illustrated in FIG. 3A according to example embodiments of the inventive concepts.

FIG. 3A is a layout plan view illustrating semiconductor devices 100 according to example embodiments of the inventive concepts. FIG. 3B is a perspective view illustrating part of a three-dimensional (3D) arrangement of the semiconductor devices illustrated in FIG. 3A according to example embodiments of the inventive concepts. Referring to FIGS. 3A and 3B, a semiconductor device 100 may include a plurality of active regions A that may be separately formed in a substrate 102 in a first direction (X-axis direction) and a second direction (Y-axis direction). The first direction and the second direction may be perpendicular to each other as illustrated in FIGS. 3A and 3B. The plurality of active regions A may include a first group AG1 of active regions that may be arranged in a line in the first direction (X-axis direction). The plurality of active regions A may further include a second group AG2 of active regions that may be arranged in a line in the second direction (Y-axis direction). The first group AG1 of active regions may include a plurality of active regions A11, A12, A13, A14, . . . that may be arranged in a line in the first direction. The second group AG2 of active regions may include a plurality of active regions A21, A22, A23, A24, . . . that may be arranged in a line in the second direction.

A plurality of buried word lines WL may extend in the first direction (x-axis direction), and upper surfaces of the plurality of buried word lines WL may be lower than an upper surface 102T of the substrate 102. The plurality of buried word lines WL may face sidewalls of the first group AG1 of active regions, respectively. The plurality of buried word lines WL may be bar shaped and extend in the first direction (X-axis direction) at a side of the first group AG1 of active regions. A plurality of buried bit lines BL may extend in the second direction (Y-axis direction), and upper surfaces of the plurality of buried bit lines BL may be lower than the upper surface 102T of the substrate 102. The plurality of buried bit lines BL may face sidewalls of the second group AG2 of active regions, respectively.

The first group AG1 of active regions may include a plurality of pairs of first active regions AP11, AP12, . . . . The distance AL11 between two active regions A that constitute a pair of first active regions from among the plurality of pairs of first active regions AP11, AP12, may be less than the distance AL12 between two adjacent active regions A with two buried bit lines BL therebetween from among the first group AG1 of active regions. The plurality of pairs of first active regions AP11, AP12, may be arranged with two adjacent buried bit lines BL there between. The second group AG2 of active regions may include a plurality of pairs of second active regions AP21, AP22, . . . . The distance AL21 between two active regions A that constitute a pair of second active regions from among the plurality of pairs of second active regions AP21, AP22, . . . , may be less than the distance AL22 between two adjacent active regions A having two buried word lines WL there between from among the second group AG2 of active regions. The plurality of pairs of second active regions AP11, AP12, . . . may be arranged having two adjacent buried word lines WLP therebetween from among the plurality of buried word lines WL.

In a semiconductor device 100 of FIGS. 3A and 3B, each of the plurality of buried word lines WL may face a sidewall of a corresponding active region from among the first group AG1 of active regions. A single-gate transistor including a buried word line WL from among the plurality of buried word lines WL may be formed on each of the plurality of active regions A. The plurality of buried bit lines BL may be arranged in such a manner that pairs of buried bit lines BL may be disposed between the plurality of pairs of first active regions AP11, AP12, . . . , respectively. The distances BL11 between pairs of buried bit lines BLP that may be present between the plurality of pairs of first active regions AP11, AP12, . . . , may be less than the distances BL12 between two adjacent buried bit lines BL with the plurality of pairs of first active regions AP11, AP12, . . . there between.

The plurality of buried word lines WL may be arranged in such a manner that pairs of buried word lines WLP may be disposed between the plurality of pairs of second active regions AP21, AP22, . . . , respectively. The distances WL21 between the pairs of buried word lines WL that may be present between the plurality of pairs of second active regions AP21, AP22, . . . , may be less than the distances WL22 between two adjacent buried word lines WL that may have the plurality of pairs of second active regions AP21, AP22, therebetween. As illustrated in FIG. 3B, the thicknesses of the plurality of buried bit lines BL, which may correspond to the lengths of the plurality of buried bit lines BL extending in a direction from bottom to top of the substrate 102, may be less than those of the plurality of buried word lines WL, which may correspond to the lengths of the plurality of buried word lines WL extending in the direction from bottom to top of the substrate 102.

Because the plurality of buried word lines WL may face the sidewalls of the active regions by the thicknesses of the plurality of buried word lines WL, a gate length may be determined by the thicknesses of the plurality of buried word lines WL. The gate length may be determined in such a manner that a short channel effect may be prevented from occurring and/or reduced. The thicknesses of the plurality of buried word lines WL may be formed to be relatively long. When the plurality of buried bit lines BL may be too thick, problems may occur, due to a parasitic capacitance that may be generated in the substrate 102. The thicknesses of the plurality of buried bit lines BL may be determined not to be very large so as to minimize problems caused by such a parasitic capacitance.

In FIG. 3A, reference numeral 'SP' may denote a plurality of storage electrodes of a plurality of capacitors. Referring to FIG. 3A, the plurality of storage electrodes SP may be formed to partially cover the first group AG1 of active regions A11, A12, A13, A14, . . . and the second group AG2 of active regions A21, A22, A23, A24, . . . , but example embodiments of the inventive concepts may not be limited thereto. For example, the plurality of storage electrodes SP may be formed to completely cover upper surfaces of the first group AG1 of active regions A11, A12, A13, A14, . . . and the second group AG2 of active regions A21, A22, A23, A24, . . . . The upper surfaces of some active regions may be partially covered by the plurality of storage electrodes SP and the upper surfaces of some active regions may be completely covered by the plurality of storage electrodes SP, from among the first group AG1 of active regions A11, A12, A13, A14, . . . and the second group AG2 of active regions A21, A22, A23, A24, . . . . In FIG. 3B, reference numeral '104' may denote gate insulating layers that may be disposed between the active regions A and the plurality of word lines WL.

Figure 4A:
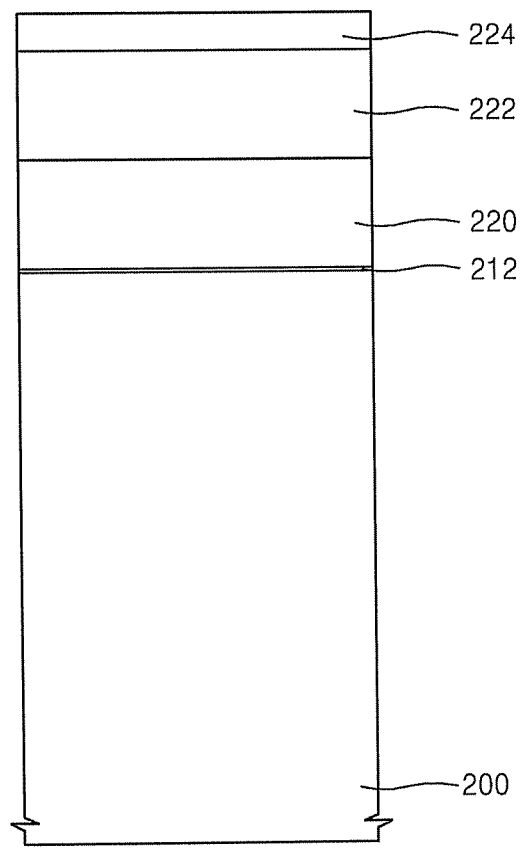
FIGS. 4A-4N are cross-sectional diagrams illustrating methods of manufacturing the semiconductor devices illustrated in FIGS. 3A and 3B according to still other example embodiments of the inventive concepts.
Figure 4B:
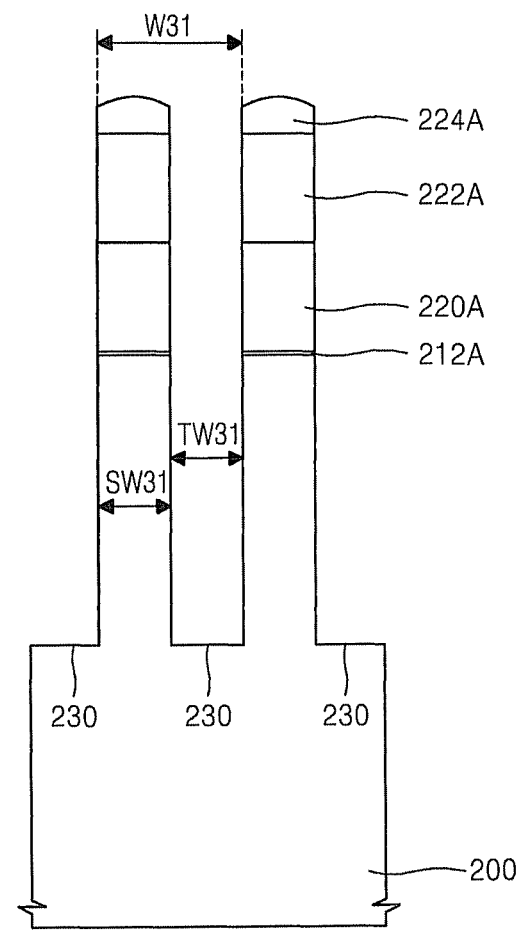
Figure 4C:
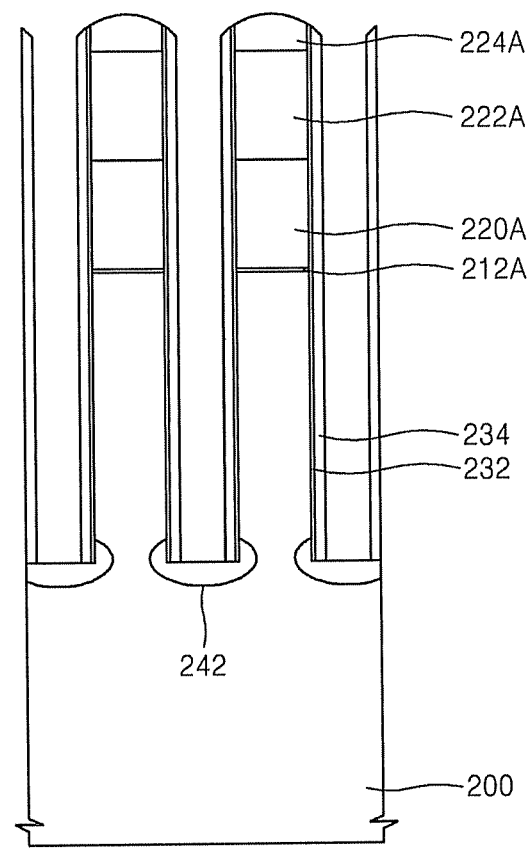
Figure 4D:
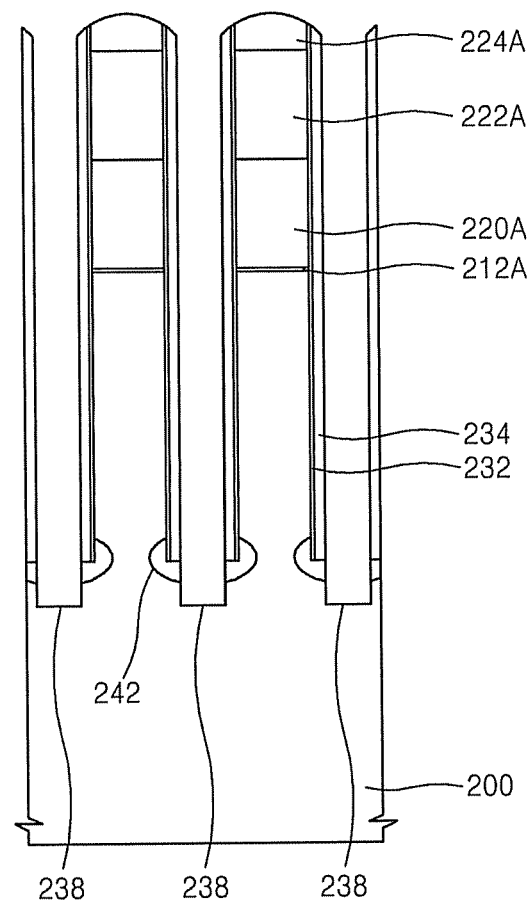
Figure 4E:
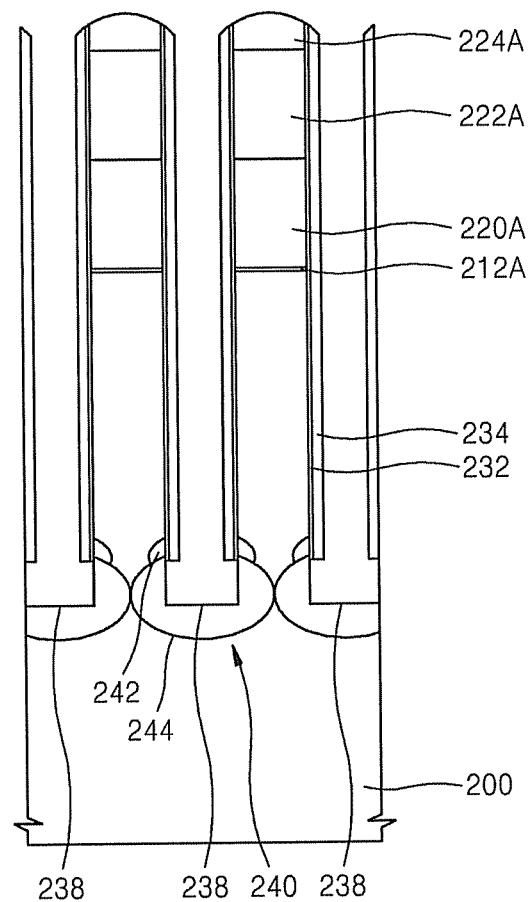
Figure 4F:
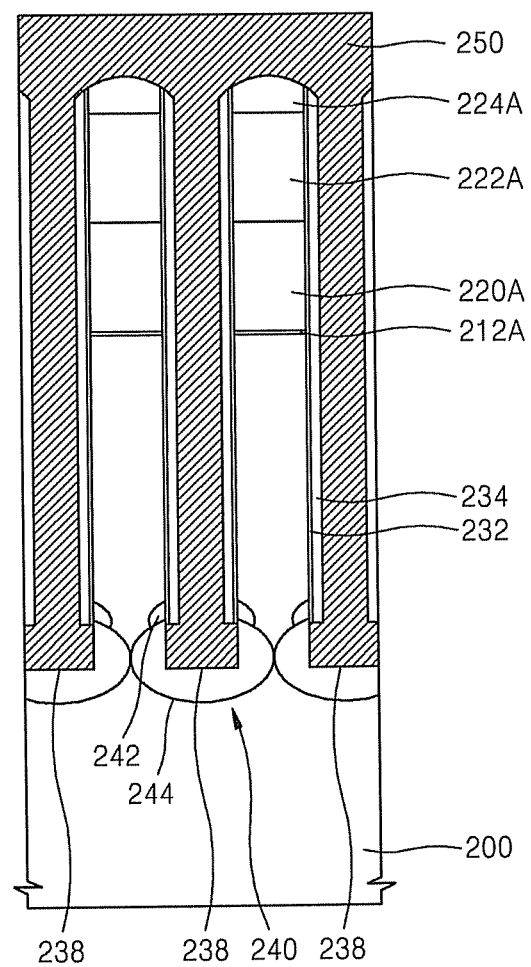
Figure 4G:
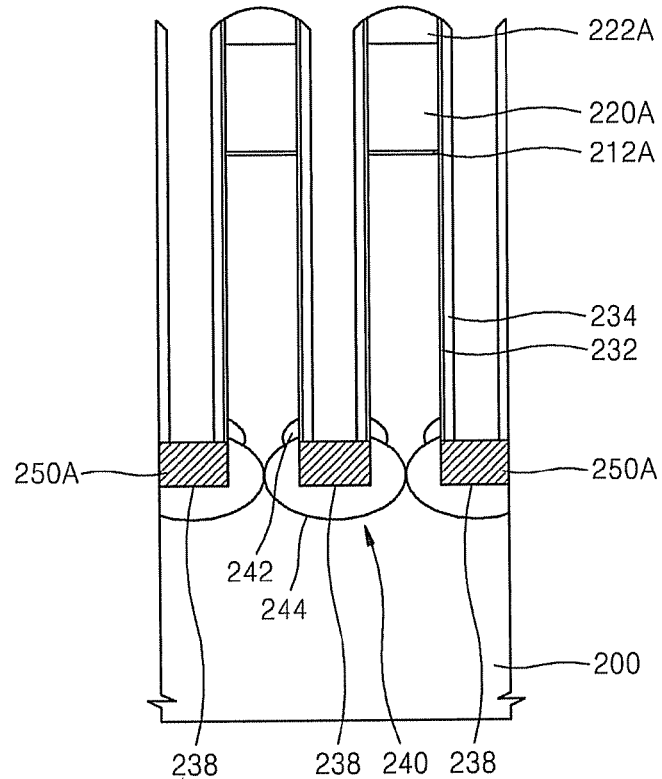
Figure 4H:
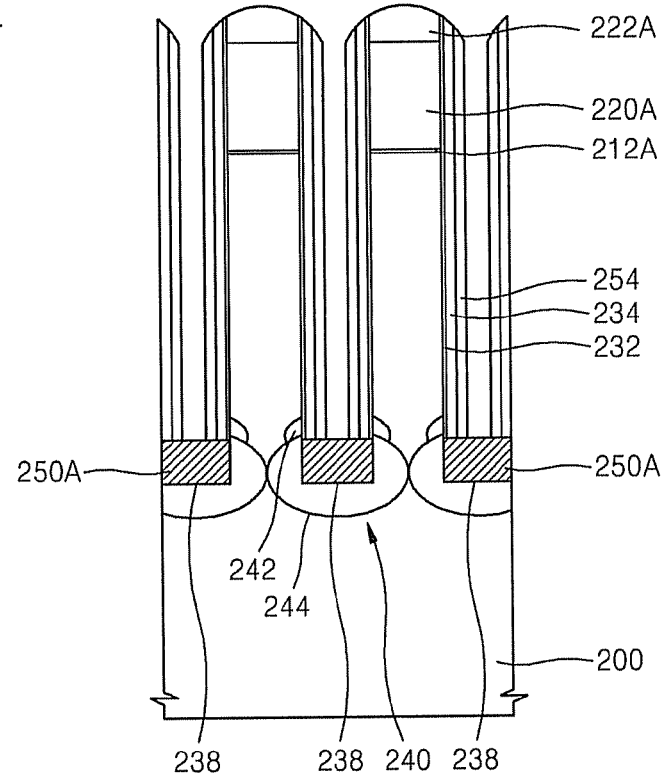
Figure 4I:
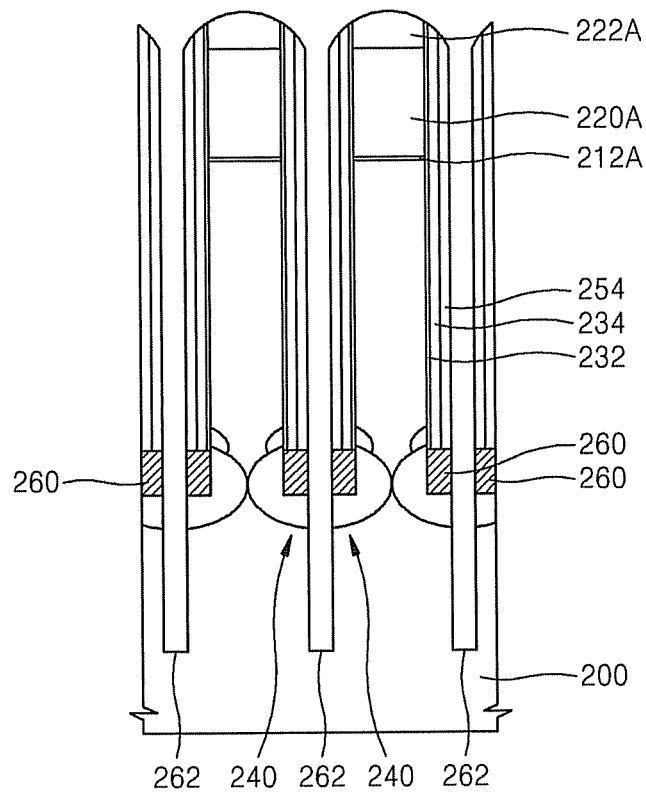
Figure 4J:
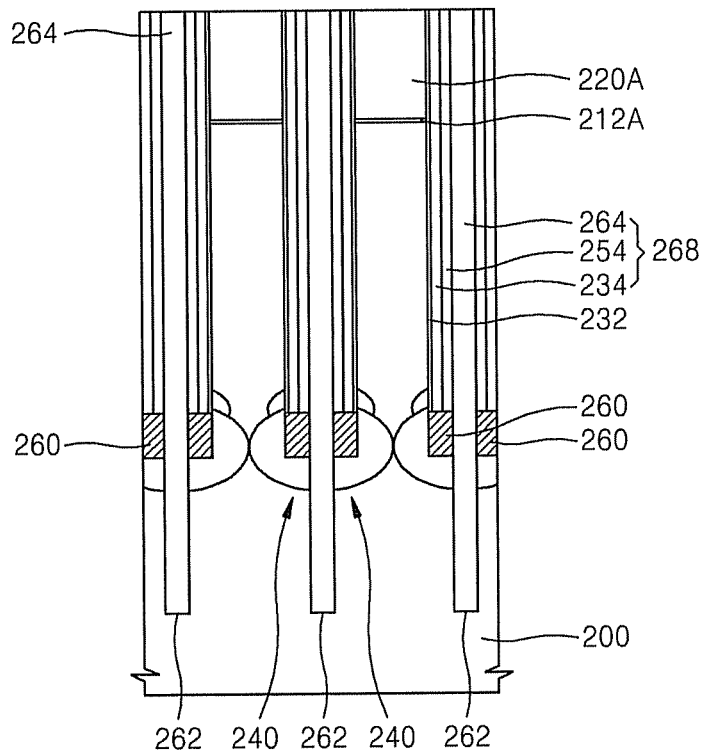
Figure 4K:
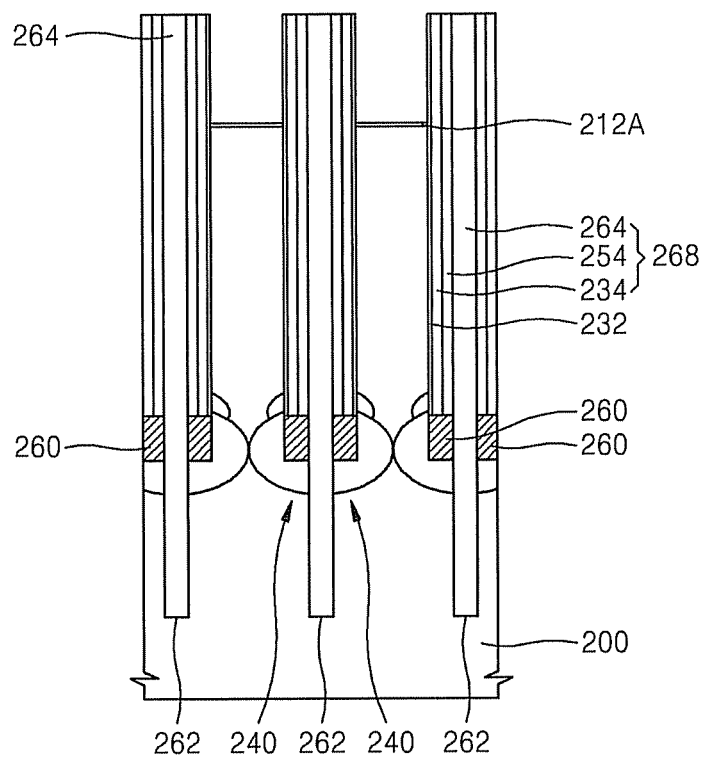
Figure 4L:
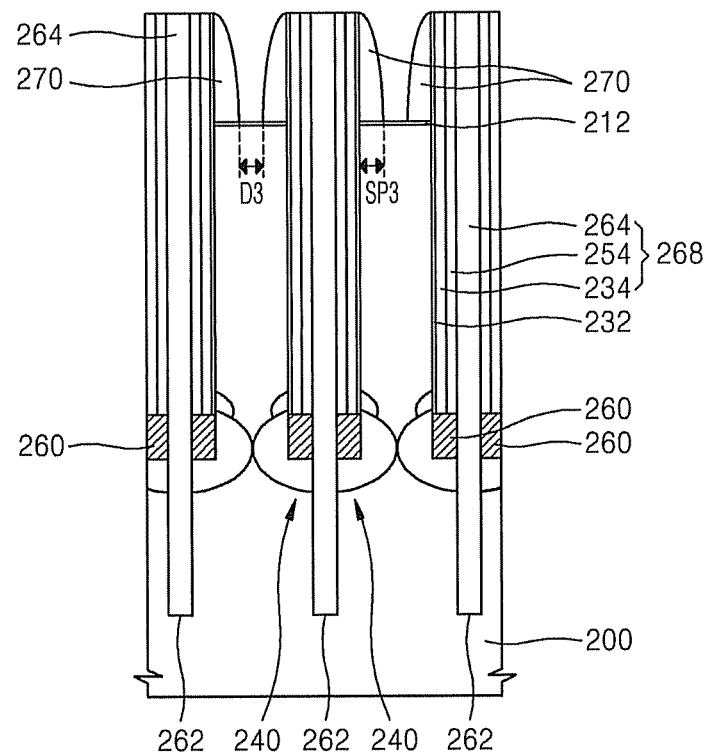
Figure 4M:
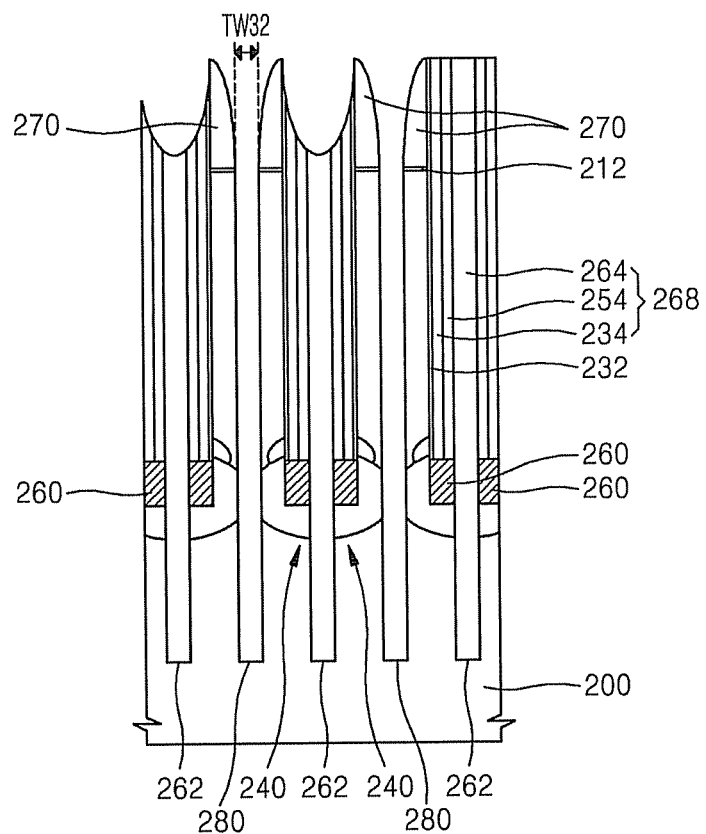
Figure 4N:
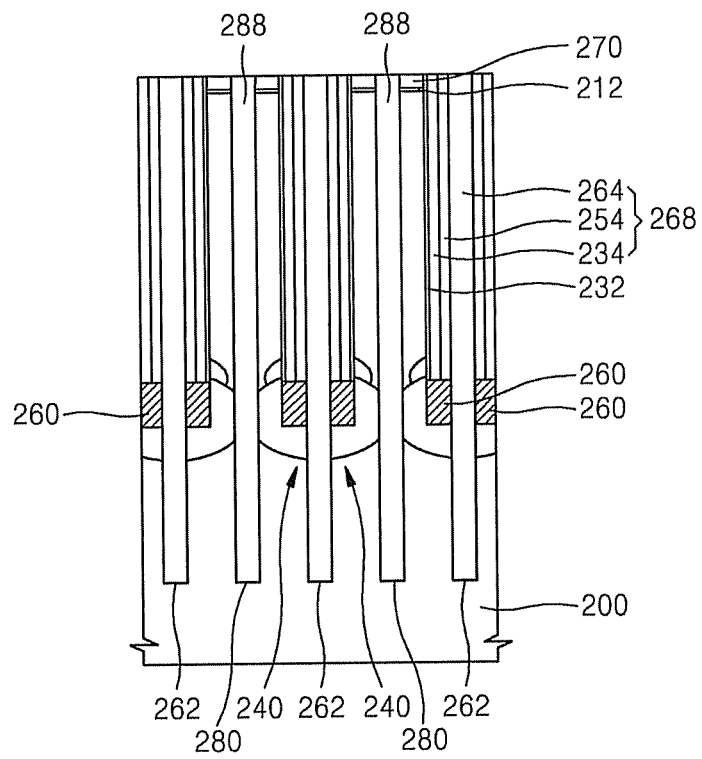

FIGS. 4A-4N are cross-sectional diagrams illustrating methods of fabricating semiconductor devices 100 illustrated in FIGS. 3A and 3B according to still other example embodiments of the inventive concepts. The operations illustrated in FIGS. 4A-4N according to example embodiments of the inventive concepts may be applied to, for example, form a plurality of buried bit lines BL described above with reference to FIGS. 3A and 3B. According to example embodiments, a plurality of buried bit lines 260 (see FIG. 4I) may be formed in a substrate 200 in such a manner that upper surfaces of the plurality of buried bit lines 260 may be lower than an upper surface of the substrate 200. Referring to FIG. 4A, a pad oxide layer 212 and a sacrificial layer 220 may be formed on the substrate 200 (e.g., sequentially formed).

A first hard mask layer 222 and a second hard mask layer 224 may be formed (e.g., sequentially) on the first sacrificial layer 220. The substrate 200, the pad oxide layer 212, the first sacrificial layer 220, the first hard mask layer 222, and the second hard mask layer 224 may be the same or similar to the substrate 10, the pad oxide layer 12, the sacrificial layer 20, the first hard mask layer 22, and the second hard mask layer 24 described above with reference to FIG. 1A, respectively. The substrate 200, the pad oxide layer 212, the first sacrificial layer 220, the first hard mask layer 222, and the second hard mask layer 224 may not be described.

Referring to FIG. 4B, a plurality of second hard mask patterns 224A may be formed by patterning the second hard mask layer 224 by using, for example, a photolithographic process, and a plurality of first hard mask patterns 222A may be formed by etching the first hard mask layer 222 using the plurality of second hard mask patterns 224A as an etch mask. A plurality of first sacrificial layer patterns 220A may be formed by etching the first sacrificial layer 220 by using the plurality of first hard mask patterns 222A as an etch mask. A plurality of first trenches 230 may be formed in the substrate 200 by etching the pad oxide layer 212 to form pad oxide patterns 212A and the substrate 200 using the plurality of first sacrificial layer patterns 220A as an etch mask. After the plurality of first trenches 230 are formed, the plurality of second hard mask patterns 224A may be partially removed.

In a top view, the plurality of first trenches 230 may be a plurality of line shaped trenches that extend in parallel with each other. Widths TW31 of the plurality of first trenches 230 may correspond to the distance AL12 between two adjacent active regions A having two buried bit lines BL therebetween from among the first group AG1 of active regions of FIGS. 3A and 3B. A width SW31 of a region of the substrate 200, which may be located between two adjacent first trenches 230 and may be defined by the two adjacent first trenches 230, may similar to the distance BL12 between two buried bit lines BL that may include one of the pairs of first active regions AP11, AP12, . . . of FIGS. 3A and 3B therebetween. The sum W31 of the width TW31 of the first trench 230 and the width SW31 of the region of the substrate 200 may be equal to a width of a region in which two buried bit lines BL and two active regions A of FIGS. 3A and 3B may be formed in the first direction (X-axis direction).

Referring to FIG. 4C, a sidewall oxide layer 232 and a first nitride layer spacer 234 may be formed (e.g., sequentially formed) on inner sidewalls of each of the plurality of first trenches 230. For example, the sidewall oxide layer 232 and the first nitride layer spacer 234 may be formed by forming an oxide layer and a nitride layer to cover all surfaces of the resultant structure including the plurality of first trenches 230 therein, and then etching (e.g., using an etch-back process) the oxide layer and the nitride layer in such a manner that the sidewall oxide layer 232 and the first nitride layer spacer 234 may remain on only the inner sidewalls of the plurality of first trenches 230. Bottom surfaces of the plurality of first trenches 230 may be exposed via the first nitride layer spacers 234 that are formed in the plurality of first trenches 230, respectively.

A low-concentration doped region 242 may be formed by ion-implantation into the exposed bottom surfaces of the plurality of first trenches 230 (e.g., exposed surface of the substrate in the first trenches 230) to form first source/drain regions 240 (see FIG. 4e) in the substrate 200. For example, the low-concentration doped region 242 may be formed of N-type impurity ions but example embodiments of the inventive concepts are not be limited thereto. Referring to FIG. 4D, a plurality of extended first trenches 238 may be formed by etching the substrate 200 exposed at the bottom surfaces of the plurality of first trenches 230 to a depth by using the plurality of second hard mask patterns 224A, the sidewall oxide layer 232, and the first nitride layer spacer 234 as an etch mask.

Referring to FIG. 4E, widths of spaces defined by the plurality of extended first trenches 238 may be increased by removing inner sidewalls of the plurality of extended first trenches 238 to a width. Isotropic wet etching may be performed on the substrate 200 exposed via the inner sidewalls of the plurality of extended first trenches 238. If the widths of the spaces defined by the plurality of extended first trenches 238 may be increased as described above, then two buried bit lines that may be formed in the spaces may be disposed apart from each other by an appropriate distance. A high-concentration doped region 244 may be formed by ion-implantation into the substrate 200 via the spaces that may be defined by the plurality of extended first trenches 238 to form the first source/drain regions 240 in the substrate 200. For example, the high-density doped region 244 may include impurity ions (e.g., N-type impurity ions), the conductive type of which may be the same as that of impurity ions in the low-density doped region 242. The plurality of first source/drain regions 240 may be formed in the substrate 200 around the spaces that may be defined by the plurality of extended first trenches 238.

Referring to FIG. 4F, a conductive layer 250 may be formed on the resultant structure with the first source/drain regions 240 therein, in such a manner that the insides of the plurality of first trenches 230 and the plurality of extended first trenches 238 may be completely filled with the conductive layer 250. The conductive layer 250 may include, for example, a metal nitride, a metal silicide, and/or a combination thereof. For example, the conductive layer 250 may include tungsten (W), aluminum (Al), copper (Cu), molybdenum (Mo), titanium (Ti), tantalum (Ta), and/or ruthenium (Ru). The conductive layer 250 may include a metal nitride, for example, TiN, TiN/W, Ti/TiN, WN, W/WN, TaN, Ta/TaN, TiSiN, TaSiN, and/or WSiN. The conductive layer 250 may include a metallic silicide, for example, $CoSi_2$, $TiSi_2$, and/or $WSi_2$. For example, a structure of the conductive layer 250 may include cobalt silicide, Ti, TiN, and W sequentially stacked.

Referring to FIG. 4G, a plurality of conductive patterns 250A may be formed in spaces that may be defined by the plurality of extended first trenches 238, by etching (e.g., using an etch-back) the conductive layer 250. While the conductive layer 250 is etched (e.g., during the etch), the plurality of second hard mask patterns 224A and the plurality of first hard mask patterns 222A may be removed. According to example embodiments, the first hard mask patterns 222A may remain.

Referring to FIG. 4H, a plurality of second nitride layer spacers 254 may be formed on the plurality of conductive patterns 250A and the plurality of first nitride layer spacers 234. In order to form the plurality of second nitride layer spacers 254, a nitride layer (not shown) may be formed covering surfaces of the plurality of first nitride layer spacers 234 and the plurality of conductive patterns 250A exposed via the inner sidewalls and bottom surfaces of the plurality of first trenches 230, and may be etched (e.g., using an etch-back) in such a manner that the plurality of second nitride layer spacers 254 may remain on the plurality of first nitride layer spacers 234 formed on the inner sidewalls of the plurality of first trenches 230, respectively. Upper surfaces of the plurality of conductive patterns 250A may be exposed in the plurality of first trenches 230 via the plurality of second nitride layer spacers 254.

Referring to FIG. 4I, the buried bit lines 260 may be formed below the plurality of second nitride layer spacers 254, respectively, by dividing each of the plurality of conductive patterns 250A which may be formed in the plurality of extended first trenches 238, respectively, into two parts. For example, when each of the plurality of conductive patterns 250A is divided into two parts, the plurality of exposed conductive patterns 250A may be etched by using the plurality of second nitride layer spacers 254, the plurality of first hard mask patterns 222A, and the plurality of first sacrificial layer patterns 220A as an etch mask. After each of the plurality of conductive patterns 250A is divided into two parts, a plurality of first separation trenches 262, which may be connected to the plurality of first trenches 230, respectively, may be formed by over-etching the plurality of conductive patterns 250A so as to partially remove the substrate 200 exposed via the plurality of extended first trenches 238.

While the plurality of buried bit lines 260 may be formed by dividing each of the plurality of conductive patterns 250A into two parts and the plurality of first separation trenches 262 are formed, the first hard mask patterns 222A may be removed or partially removed. Each of the plurality of first source/drain regions 240 may be divided into two parts by one of the plurality of first separation trenches 262. Two buried bit lines from among the plurality of buried bit lines 260 may be formed in each of the plurality of first trenches 230. A pair of buried bit lines 260 may be present in each of the plurality of extended first trenches 238. In a top view, the plurality of buried bit lines 260 may be bar shaped and extend in parallel with each other.

The plurality of buried bit lines 260 may be the same or similar to the plurality of buried bit lines BL illustrated in FIGS. 3A and 3B, and a pair of buried bit lines 260 may be formed in each of the plurality of extended first trenches 238 and may be the same or similar to a pair of buried bit lines BL of FIGS. 3A and 3B that may be adjacent to each other by the distance BL11. Similarly to the plurality of buried bit lines BL described above with reference to FIG. 3B, the thicknesses of the plurality of buried bit lines 260 in a direction from top to bottom of the plurality of first trenches 230 may be less than thicknesses 340L of a plurality of buried word lines 340W which are described with reference to FIG. 6F. If the plurality of buried bit lines 260 may be too thick, problems may occur, due to a parasitic capacitance that may be generated in the substrate 102. The plurality of buried bit lines 260 may be formed to not be too thick so as to minimize and/or reduce problems due to parasitic capacitance.

Referring to FIG. 4J, a plurality of buried insulating layers 264 may be formed in such a manner that the plurality of first trenches 230 and the plurality of first separation trenches 262 connected to the plurality of first trenches 230, respectively, may be filled (e.g., completely filled) with the plurality of buried insulating layers 264. In order to form the plurality of buried insulating layers 264, an insulating layer (not shown) may be formed on the substrate 200 in such a manner that the plurality of first trenches 230 and the plurality of first separation trenches 262 may be filled (e.g., completely filled) with the insulating layer. A planarization process may be performed on the resultant structure so as to remove layers therefrom until upper surfaces of the plurality of first sacrificial layer patterns 220A are exposed, and the plurality of buried insulating layers 264 may be formed in the plurality of first trenches 230 and the plurality of first separation trenches 262. The planarization process may be, for example, CMP. The plurality of first nitride layer spacers 234, the plurality of second nitride layer spacers 254, and the plurality of buried insulating layers 264 may constitute a plurality of first buried patterns 268.

Referring to FIG. 4K, the first sacrificial layer pattern 220A may be removed so that upper parts of the plurality of buried insulating layers 264, the plurality of second nitride layer spacers 254 each covering both sidewalls of one of the plurality of buried insulating layers 264, the plurality of first nitride layer spacers 234, and the plurality of sidewall oxide layers 232 (hereinafter referred to as 'first protrusions') may protrude from the upper surface of the substrate 200. Wet etching may be performed to remove the plurality of first sacrificial layer patterns 220A. Referring to FIG. 4L, a plurality of spacers 270 may be formed on the substrate 200 to cover exposed sidewalls of the first protrusions, respectively. In order to form the plurality of spacers 270, a spacer layer (not shown) may be formed on the resultant structure from which the plurality of first hard mask patterns 220A are removed so as to cover upper surfaces and sidewalls of the first protrusions, and then the spacer layer may be etched (e.g., using an etch-back process).

The plurality of spacers 270 may include, for example, silicon oxide layers. If the plurality of spacers 270 are formed, then widths TW32 of a plurality of second trenches 280 (see FIG. 4M) may be determined by the distances D3 between two adjacent spacers 270 in spaces between the first protrusions. Widths SP3 of the plurality of spacers 270 may be equal to the width AX of the active region A which may be illustrated in FIGS. 3A and 3B in the first direction (X-axis direction). Referring to FIG. 4M, the plurality of second trenches 280 may be formed in the substrate 200 by etching the exposed pad oxide patterns 212A using the plurality of first protrusions and the plurality of spacers 270 as etch masks, and etching the substrate 200 exposed by the etching of the pad oxide patterns 212.

In a top view, the plurality of second trenches 280 may be line shaped and extend in parallel to each other. The plurality of second trenches 280 may be formed between the plurality of first trenches 230 and the plurality of first separation trenches 262 in the substrate 200. Depths of the plurality of second trenches 280 in the substrate 200 may be appropriately determined as the occasion demands. FIG. 4M may illustrate a case where in the substrate 200, the bottom surfaces of the plurality of second trenches 280 may be almost level with those of the plurality of first separation trenches 262 but example embodiments of the inventive concepts are not limited thereto. While the substrate 200 may be etched to form the plurality of second trenches 280, the plurality of spacers 270 and the first protrusions between the plurality of spacers 270 may be partially removed.

Figure 5:
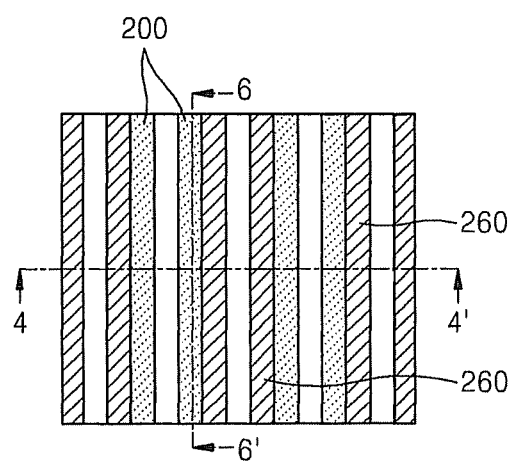

Referring to FIG. 4N, a second buried layer (not shown) may be formed to fill (e.g., completely fill) the insides of the plurality of second trenches 280 and may be planarized to remove layers from the substrate 200, thereby forming a plurality of second buried patterns 288 in the plurality of second trenches 280. The planarization process may be, for example, CMP. The plurality of second buried patterns 288 may be formed of at least one of various materials according to use thereof. For example, the plurality of second buried patterns 288 may include an oxide, a nitride, and/or a compound thereof. Although FIG. 4N may illustrate that a part of the plurality of spacers 270 remains on the substrate 200, example embodiments of the inventive concepts may not be limited thereto. FIG. 5 is a layout plan view of structures that may be obtained by performing methods illustrated in FIGS. 4A-4N according to example embodiments of the inventive concepts. FIG. 5 may be a layout plan diagram of the upper surface of the substrate 200 and the plurality of buried bit lines 260. In FIG. 5, a layout plan diagram taken along the line IV N-IV N' may correspond to the resultant structure illustrated in FIG. 4N.

FIGS. 6A-6L are cross-sectional diagrams illustrating methods of manufacturing the semiconductor devices illustrated in FIGS. 3A and 3B according to yet other example embodiments of the inventive concepts. FIGS. 6A-6L may illustrate operations of forming a plurality of buried word lines WL of FIGS. 3A and 3B, which may be included in methods of manufacturing a semiconductor device 100 of FIGS. 3A and 3B according to example embodiments of the inventive concepts. According to example embodiments, the plurality of buried word lines 340W (see FIG. 6F) may be formed in the substrate 200 in such a manner that upper surfaces of the plurality of buried word lines 340W may be lower than an upper surface of the substrate 200. The operations of FIGS. 6A-6L may be performed, for example, after the operations of FIGS. 4A-4N are performed. FIGS. 6A-6L may be cross-sectional diagrams taken along the line VI-VI' of FIG. 5. For ease of understanding of the current embodiment, FIG. 6A may illustrate both the cross-sectional diagram taken along the line IV N-IV N' and the cross-sectional diagram taken along the line VI-VI'.

Figure 6B:
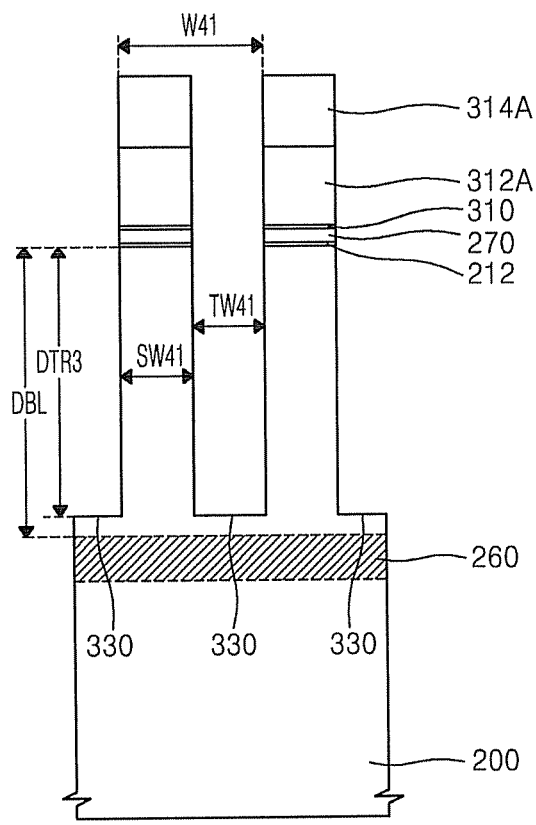

In FIGS. 6A-6L, reference numerals that are the same as those of FIGS. 4A-4N may denote the same elements, and thus, their operations or characteristics may not be described. Referring to FIG. 6A, an etch stop insulating layer 310, a second sacrificial layer 312, a third hard mask layer 314, and a fourth hard mask layer 316 may be formed (e.g., sequentially formed) on a resultant structure in which the plurality of buried bit lines 260, the plurality of first buried patterns 268, and the plurality of second buried patterns 288 may be formed by performing the operations of FIGS. 4A-4N. The etch stop insulating layer 310 may be, for example, an oxide layer. The second sacrificial layer 312, the third hard mask layer 314, and the fourth hard mask layer 316 may be the same or similar to the sacrificial layer 20, the first hard mask layer 22, and the second hard mask layer 24 described above with reference to FIG. 1A, respectively. The second sacrificial layer 312, the third hard mask layer 314, and the fourth hard mask layer 316 may not be described.

An anti-reflection layer 318 and a plurality of photoresist patterns 320 may be formed (e.g., sequentially formed) on the fourth sacrificial layer 316. The anti-reflection layer 318 may be include, for example, a silicon nitride layer. The plurality of photoresist patterns 320 may include a plurality of line patterns that extend with a width DRW4 and with an interval SP4 therebetween. In FIG. 6A, for ease of understanding of example embodiments the plurality of buried bit lines 260 may be marked by a dotted line in the cross-sectional diagram taken along the line VI-VI' of FIG. 5.

Referring to FIG. 6B, a plurality of fourth hard mask patterns (not shown) may be formed by etching the anti-reflection layer 318 and the fourth hard mask layer 316 by using the plurality of photoresist patterns 320 as an etch mask. A plurality of third hard mask patterns 314A may be formed by etching the third hard mask layer 314 using the plurality of fourth hard mask patterns as an etch mask. A plurality of second sacrificial layer patterns 312A may be formed by etching the second sacrificial layer 312 by using the plurality of third hard mask patterns 314A as an etch mask. A plurality of third trenches 330 may be formed in the substrate 200 by etching the etch stop insulating layer 310, the spacers 270, the pad oxide layer 212, and the substrate 200 using the plurality of second sacrificial layer patterns 312A as an etch mask.

After the plurality of third trenches 330 are formed, the plurality of fourth hard mask patterns may be partially or entirely removed. According to example embodiments described with respect to FIG. 6B, the plurality of fourth hard mask patterns may be entirely removed. Depths of the plurality of third trenches 330 may be determined in such a manner that the distance DTR3 between the upper surface of the substrate 200 and bottom surfaces of the plurality of third trenches 330 may be less than the distance DBL between the upper surface of the substrate 200 and upper surfaces of the plurality of buried bit lines 260. In a top view, the plurality of third trenches 330 may be line shaped and extend in parallel with each other. The plurality of third trenches 330 may extend in a direction perpendicular to a direction in which the plurality of first trenches 230 and the plurality of first separation trenches 262 extend (see FIG. 6A).

Widths TW41 of the plurality of third trenches 330 may be similar to the distance AL22 between two adjacent active regions A having two buried word lines WL therebetween from among the second group AG2 of active regions in FIGS. 3A and 3B. A width SW41 of a region of the substrate 200, which is located between two adjacent third trenches 330 and is defined by the two adjacent third trenches 230, may be similar to the distance WL22 between two buried word lines WL having one of the pairs of first active regions AP21, AP22, . . . of FIGS. 3A and 3B therebetween. The sum W41 of the width TW31 of the third trench 330 and the width SW41 of the region of the substrate 200 may be equal to a width of a region in which two buried word lines WL and two active regions A of FIGS. 3A and 3B may be formed in a second direction (Y-axis direction).

Figure 6C:
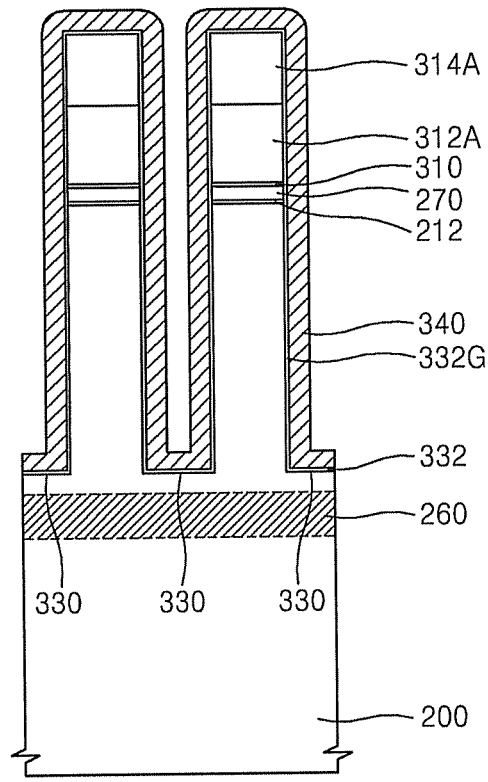

Referring to FIG. 6C, an insulating layer 332 may be formed on the entire resultant structure of FIG. 6B in such a manner that a gate insulating layer 332G may be formed on inner sidewalls of the plurality of third trenches 330, and a conductive layer 340 may be formed on the insulating layer 332. The conductive layer 340 may be formed so as to form the plurality of buried word lines 340W (see FIG. 6F) using a patterning process. The insulating layer 332 may be formed by, for example, radical oxidation, thermal oxidation, chemical vapor deposition (CVD), and/or atomic layer deposition (ALD).

The conductive layer 340 may include, for example, a metal, a metal nitride, doped polysilicon, and/or a combination thereof. For example, the conductive layer 340 may be formed of a single material, for example, TiN. The conductive layer 340 may be a structure in which a doped polysilicon layer, a tungsten silicide layer, and a tungsten layer may be stacked sequentially. The conductive layer 340 is not limited thereto and may be formed of, for example, metal (e.g., W and/or Ta), a metal nitride, a metal silicide, TaCN, TaSiN, TiSiN, and/or the like, according to use thereof.

Figure 6D:
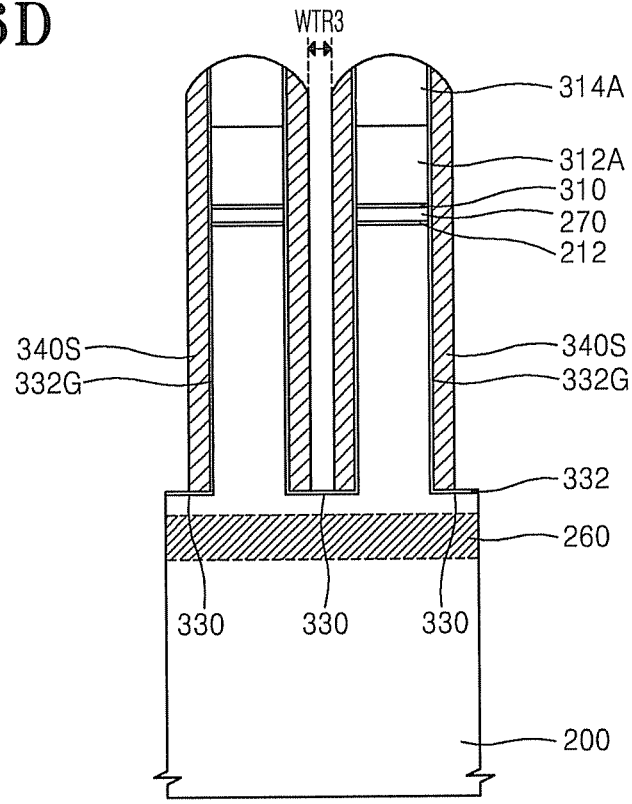

Referring to FIG. 6D, the conductive layer 340 may be anisotropically etched so as to form two conductive spacers 340S in each of the plurality of third trenches 330. The conductive spacers 340S may be formed on the gate insulating layer 332G of the inner sidewalls of the third trench 330. When the plurality of conductive spacers 340S may be formed, a space having a predetermined width WTR3 may be formed between two conductive spacers 340S in each of the plurality of third trenches 330. A part of the plurality of third hard mask patterns 314A and layers that may be formed on the plurality of third hard mask patterns 314A may be removed while anisotropic etching is performed to form the plurality of conductive spacers 340S.

Figure 6E:
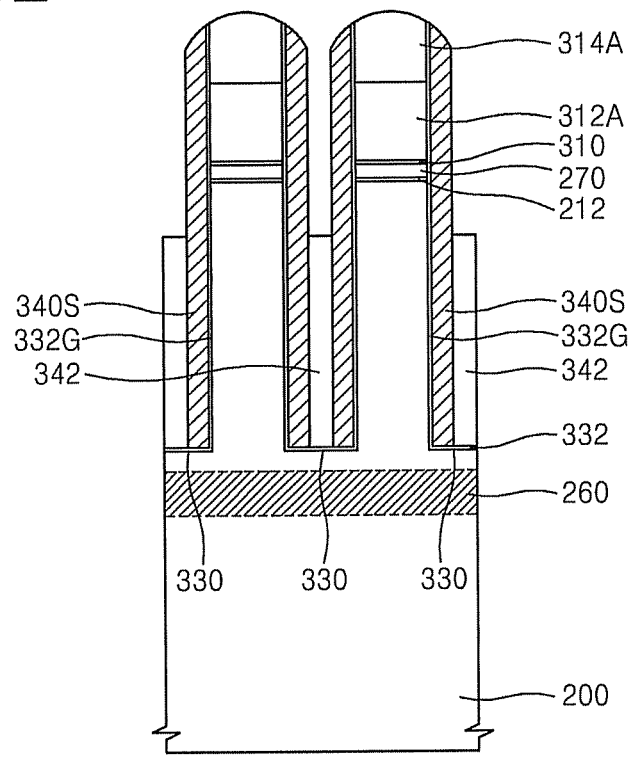

Referring to FIG. 6E, a plurality of buffer layers 342 may be formed in such a manner that spaces between every two conductive spacers 340S in the plurality of third trenches 330 may be partially filled or filled with the plurality of buffer layers 342. The plurality of buffer layers 342 may be formed in such a manner that the plurality of third trenches 330 may be filled with the plurality of buffer layers 342 to a depth starting from the bottom surfaces of the plurality of third trenches 330. When the plurality of buffer layers 342 are formed, upper parts of the plurality of third trenches 330 may remain empty. The plurality of buffer layers 342 may be formed of, for example, an oxide layer and/or a SOH layer.

Figure 6F:
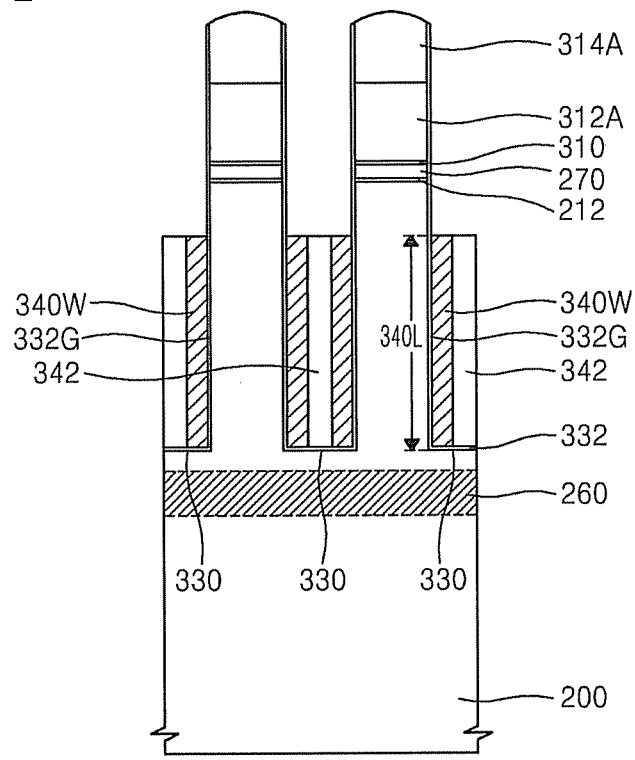

Referring to FIG. 6F, parts of the plurality of conductive spacers 340S, which may protrude upward from the plurality of buffer layers 342 in the plurality of third trenches 330, may be etched to be removed, while lower parts of the plurality of conductive spacers 340S may be protected by the plurality of buffer layers 342, thereby forming the plurality of buried word lines 340W that may be formed of the plurality of remnant conductive spacers 340S. Thicknesses of the plurality of buried word lines 340W in a direction from top to bottom of the third trench 330 may be considered as gate lengths 340L of a plurality of gates that may be formed of the plurality of buried word lines 340W, respectively. The gate length 340L may be greater than the thicknesses of the plurality of buried bit lines 260 described above with reference to FIG. 4I. The gate length 340L may be determined to prevent and/or reduce short channel effects from occurring.

Figure 6G:
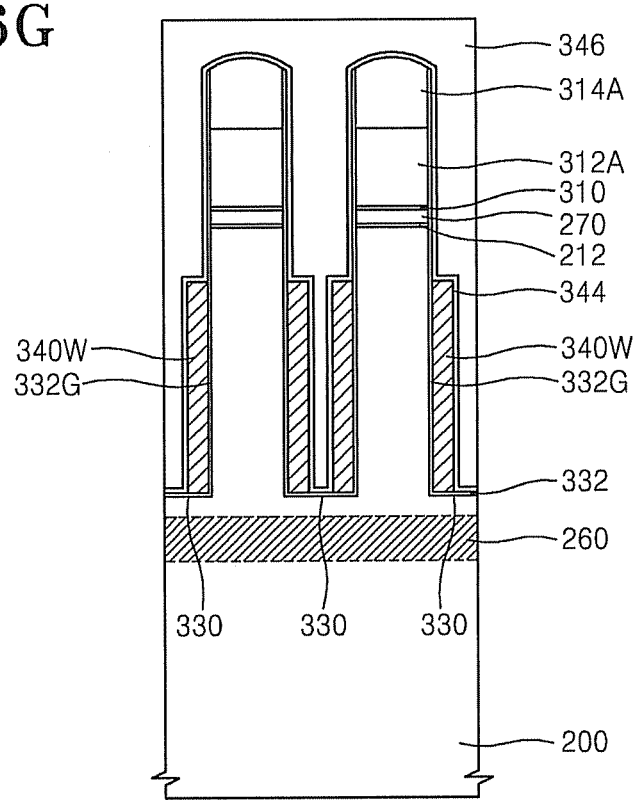

Referring to FIG. 6G, the plurality of buffer layers 342 may be removed, and then a capping layer 344 may be formed covering the plurality of buried word lines 340W in the plurality of third trenches 330, and a third buried layer 346 may be formed on the capping layer 344 in such a manner that the insides of the plurality of third trenches 330 may be filled with the third buried layer 346. The capping layer 344 may include, for example, a silicon nitride layer. The third buried layer 346 may include, for example, an oxide layer. According to example embodiments described with respect to FIG. 6G, the plurality of buffer layers 342 may be removed but example embodiments of the inventive concepts are not limited thereto. For example, if the plurality of buffer layers 342 are formed of an oxide layer, then the plurality of buffer layers 342 may not be removed, and the capping layer 344 and the third buried layer 346 may be formed on the plurality of buffer layers 342.

Figure 6H:
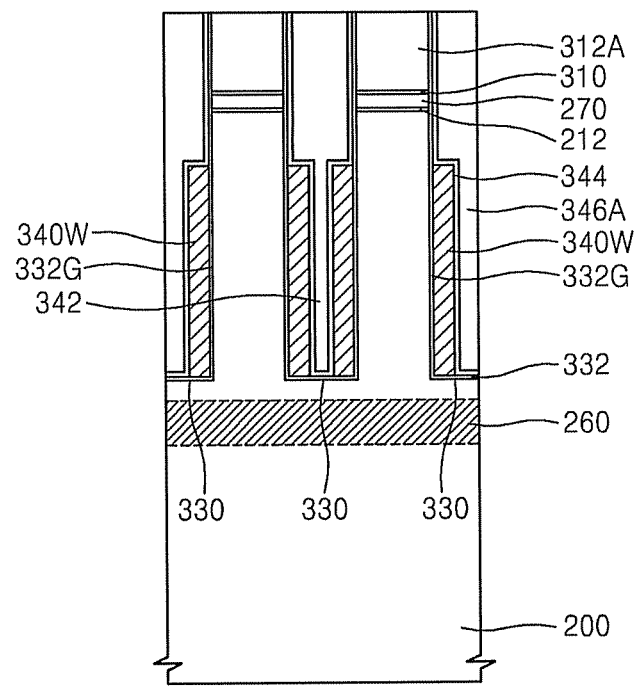
Figure 6I:
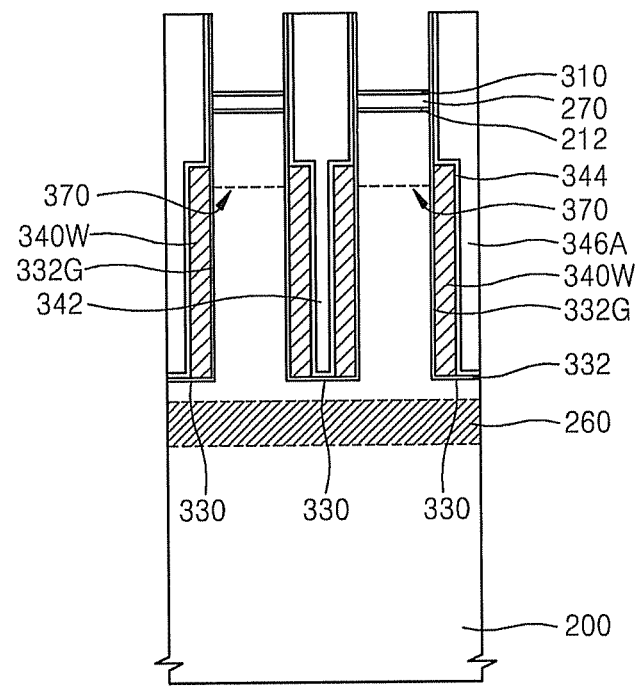

Referring to FIG. 6H, a planarization process may be performed to remove layers until upper surfaces of the plurality of second sacrificial layer patterns 312A may be exposed, and a plurality of third buried patterns 346A are formed in the plurality of third trenches 330, respectively. The planarization process may be, for example, CMP. Referring to FIG. 6I, the plurality of second sacrificial layer patterns 312A may be removed so that upper parts of the plurality of third buried patterns 346A, the capping layer 344 covering both sidewalls of the plurality of third buried patterns 346A, and the insulating layer 332 (hereinafter referred to as 'second protrusions') may protrude from the upper surface of the substrate 200. Wet etching may be performed to remove the plurality of second sacrificial layer patterns 312A.

Dopant ions may be implanted into the substrate 200 via spaces that may be formed by removing the plurality of second sacrificial layer patterns 312A, thereby forming a plurality of second source/drain regions 370 in the upper surface of the substrate 200. In order to form the second source/drain regions 370, impurity ions, the conductive type of which may be the same as those of the first source/drain regions 240, may be implanted into the substrate 200. For example, the second source/drain regions 370 may be formed by implanting dopants formed of N-type impurity ions into the substrate 200. In some cases, the implanting of the dopant may be performed during a subsequent process so as to form the second source/drain regions 370.

Figure 6J:
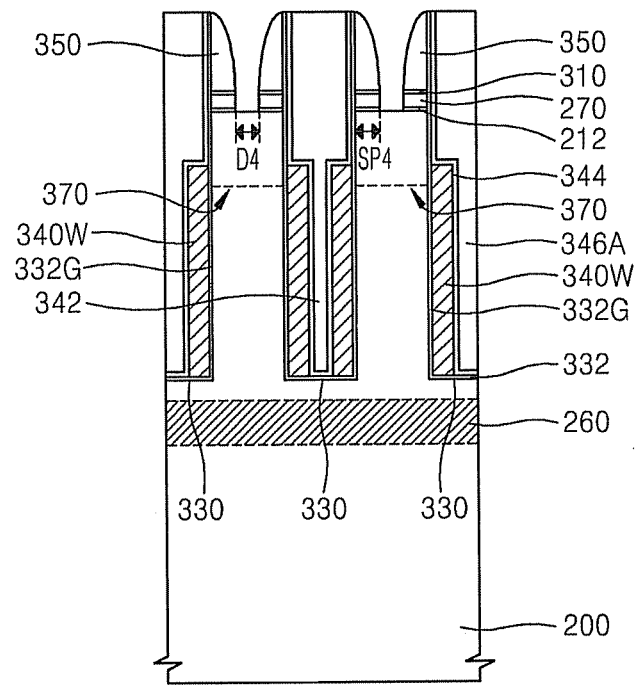

Referring to FIG. 6J, a plurality of spacers 350 may be formed on the substrate 200 to cover exposed sidewalls of the second protrusions, respectively. In order to form the plurality of spacers 350, a spacer layer (not shown) may be formed on the resultant structure from which the plurality of second sacrificial layer patterns 312A have been removed, so as to cover upper surfaces and sidewalls of the second protrusions, and then the spacer layer may be etched (e.g., using an etch-back process). In this case, the etch stopper insulating layer 310, the spacers 270 and pad oxide layer 212 below the etch stopper insulating layer 310, which may be exposed during the etching of the spacer layer, may be etched so as to expose the upper surface of the substrate 200 between every two spacers 350.

The plurality of spacers 350 may be formed of, for example, silicon oxide layers. If the plurality of spacers 350 are formed, then widths TW42 of a plurality of fourth trenches 360 (see FIG. 6K), which may be formed in the substrate 200 during a subsequent process, may be determined by the distances D4 between two adjacent spacers 350 in spaces between the second protrusions. Widths SP4 of the plurality of spacers 350 may be equal to the width AY of the active region A which may be illustrated in FIGS. 3A and 3B in the second direction (Y-axis direction).

Figure 6K:
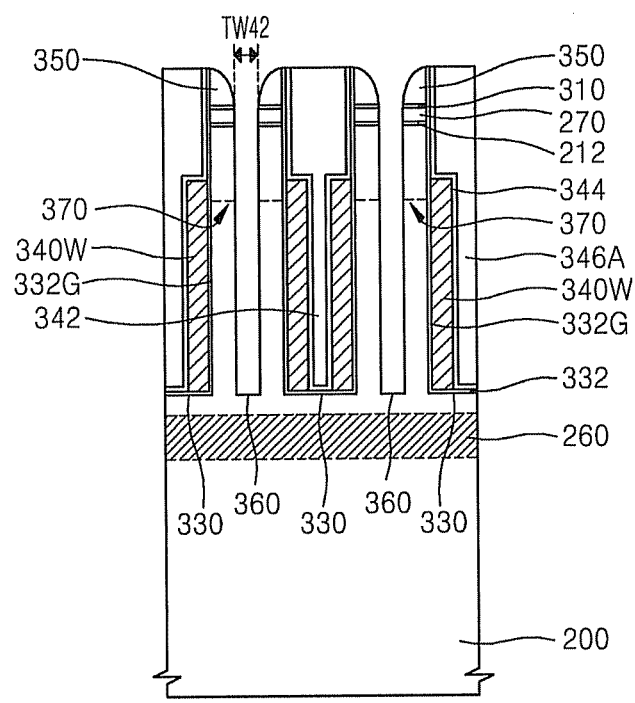
Figure 7A:
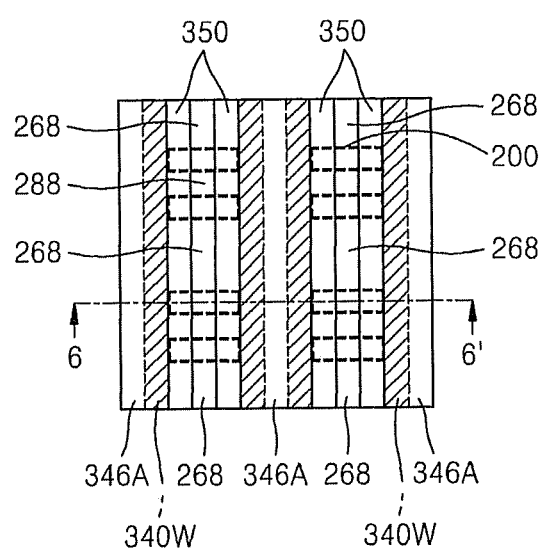
FIG. 7A-7C are plan views of structures that may be obtained by performing the operations of FIGS. 6A-6J according to example embodiments of the inventive concepts.
Figure 7B:
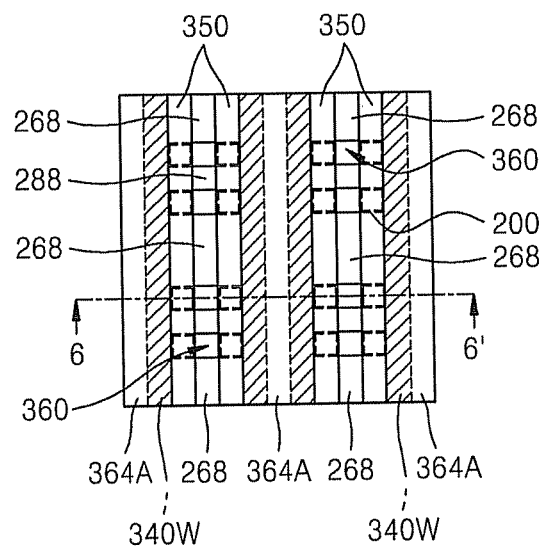
Figure 7C:
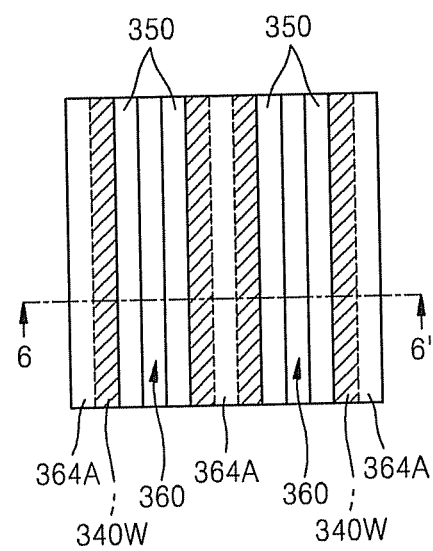

FIG. 7A-7C are plan views of structures that may be obtained by performing the operations of FIGS. 6A-6J according to example embodiments of the inventive concepts. In FIG. 7A, locations of a plurality of buried word lines 340W buried in a plurality of third buried patterns 346A may be marked, and upper surfaces of plurality of buried word lines 340W may be lower than that of the substrate 200. Referring to FIG. 6K, the plurality of fourth trenches 360 may be formed in the substrate 200 by etching the exposed substrate 200 using the plurality of second protrusions and the plurality of spacers 350 as etch masks. In a top view, the plurality of fourth trenches 360 may be line shaped and extend in parallel with each other. The plurality of fourth trenches 360 may be formed in the plurality of third trenches 330 in the substrate 200. The depths of the plurality of fourth trenches 360 in the substrate 200 may be appropriately determined as occasion demands.

FIG. 6K may illustrate a case where in the substrate 200, the bottom surfaces of the plurality of fourth trenches 360 may be about level with those of the plurality of third trenches 330 but example embodiments of the inventive concepts are not limited thereto. As seen from a plan diagram, the plurality of fourth trenches 360 may include island type hole shapes that may extend in a direction from top to bottom of the substrate 200. In a plan diagram, the plurality of fourth trenches 360 may be line shaped that may extend in parallel with the plurality of buried word lines 340W, respectively.

FIGS. 7B and 7C are plan views of a resultant structure obtained by forming the plurality of fourth trenches 360 on the substrate 200 with the operation of FIG. 6K according to example embodiments of the inventive concepts. In FIGS. 7B and 7C, locations of the plurality of buried word lines 340W buried in the plurality of third buried patterns 346A may be marked, and upper surfaces of plurality of buried word lines 340W may be lower than that of the substrate 200. FIG. 7B may illustrate a case where as seen from a plan diagram, the plurality of fourth trenches 360 may have island type hole shapes that may extend in the direction from top to bottom of the substrate 200.

In order to form the plurality of fourth trenches 360 in an island type hole pattern that may be illustrated in FIG. 7B, only the substrate 200 may be selectively etched using the spacers 350, the third buried patterns 346A, the capping layer 344, the first buried patterns 268, and the second buried patterns 288 as an etch mask. If the spacers 350, the third buried patterns 346A, and the second buried patterns 288 are formed of silicon oxide layers, the capping layer 344 and the first buried patterns 268 may be formed of silicon nitride layers, and the substrate 200 may be formed of a silicon layer, then it is possible to form the plurality of fourth trenches 360 in the island type hole shapes, based the etch selectivities of the above layers.

FIG. 7C may illustrate a case where as seen from a plan diagram, the plurality of fourth trenches 360 may have a plurality of line shapes that may extend parallel with the plurality of buried word lines 340W, respectively. In order to form the plurality of fourth trenches 360 in line shapes as illustrated in FIG. 7C, all the substrate 200, the first buried patterns 268, and the second buried patterns 288, which may be exposed in the regions from which the second sacrificial patterns 312A have been removed, via two spacers 350, may be etched by using the spacers 350, the third buried patterns 346A, and the capping layer 344 as an etch mask.

In this case, the plurality of fourth trenches 360 may be formed by performing etching under an etch condition, in which there is no difference between the etch selectivities of the substrate 200, the first buried patterns 268, and the second buried patterns 288. If the plurality of fourth trenches 360 are formed, then each of the second source/drain regions 370 formed in the upper surface of the substrate 200 may be divided into two parts. While the substrate 200 is etched to form the plurality of fourth trenches 360, the plurality of spacers 350 and the second protrusions between the plurality of spacers 350 may be partially removed.

Figure 6L:
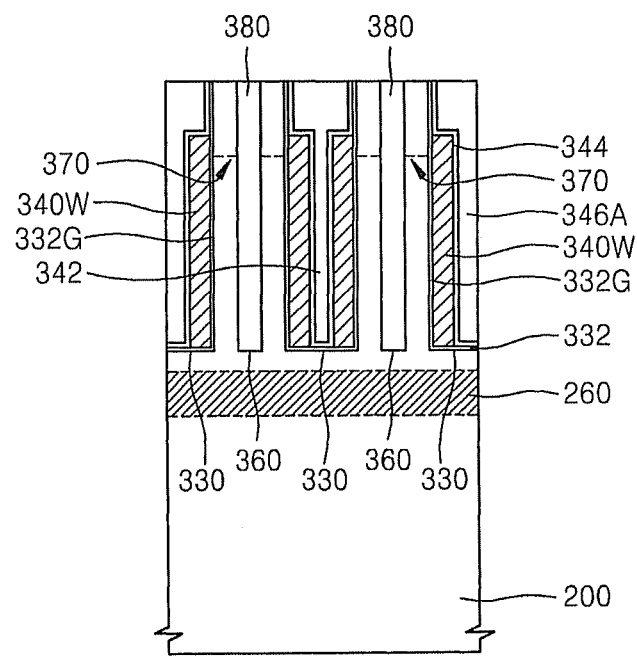

Referring to FIG. 6L, a plurality of fourth buried patterns 380 may be formed in the plurality of fourth trenches 360, respectively. A fourth buried layer (not shown) may be formed on the resultant structure in such a manner that the insides of the plurality of fourth trenches 360 may be filled with the fourth buried layer, and then the resultant structure may be planarized to remove layers therefrom, thereby forming the plurality of fourth buried patterns 380 in the plurality of fourth trenches 360. The planarization process may be, for example, CMP. The plurality of fourth buried patterns 380 may be formed of any one of various materials according to use thereof. For example, the plurality of fourth buried patterns 380 may be include an oxide layer, a nitride layer, and/or a compound thereof.

After the plurality of fourth buried patterns 380 may be formed, the upper surface of the substrate 200 may be exposed. If the implanting of the dopant to form the second source/drain regions 370 is omitted in the operation of FIG. 6I, then in the operation of FIG. 6L, after the plurality of fourth buried patterns 380 are formed, impurity ions may be implanted into the exposed upper surface of the substrate 200 so as to form the second source/drain regions 370.

FIGS. 8A-8E are cross-sectional diagrams illustrating operations included in methods of fabricating a semiconductor device 100 illustrated in FIGS. 3A and 3B according to further example embodiments of the inventive concepts. FIGS. 8A-8E illustrate operations of forming a plurality of buried word lines WL of FIGS. 3A and 3B, which are part of the methods of manufacturing the semiconductor device 100 of FIGS. 3A and 3B according to other example embodiments of the inventive concepts. The operations of FIGS. 8A-8E may illustrate modified examples of the operations described with respect to FIGS. 6A-6L. FIGS. 8A-8E may illustrate methods of manufacturing at least one semiconductor device 100, in which a floating body effect may be prevented from occurring in active regions of the substrate 200 according to example embodiments of the inventive concepts. In FIGS. 8A-8E, the same reference numerals as those of FIGS. 6A-6L may denote the same elements, and their operations or characteristics may not be described.

Figure 8A:
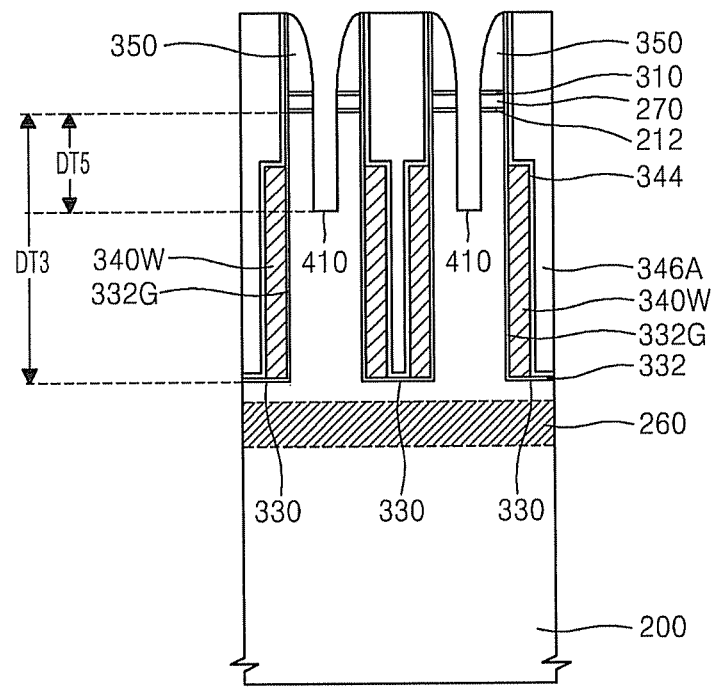
FIGS. 8A-8E are cross-sectional diagrams illustrating operations included in methods of manufacturing semiconductor devices illustrated in FIGS. 3A and 3B according to further example embodiments of the inventive concepts.

Referring to FIG. 8A, a plurality of spacers 350 may be formed on a substrate 200 to cover exposed sidewalls of second protrusions by performing the operations of FIGS. 6A-6J, and an exposed part of the substrate 200 may be etched using the second protrusions and the plurality of spacers 350 as an etch mask, forming a plurality of fifth trenches 410 in the substrate 200. The plurality of fifth trenches 410 may be similar to the plurality of fourth trenches 360 of FIG. 6K in terms of their structures. Bottom surfaces of the plurality of fifth trenches 410 may be higher than those of the plurality of third trenches 330. The distance DT5 between the upper and lower surfaces of the substrate 200 may be less than the distance DT3 between the upper surface of the substrate 200 and the bottom surfaces of the plurality of third trenches 330.

Figure 8B:
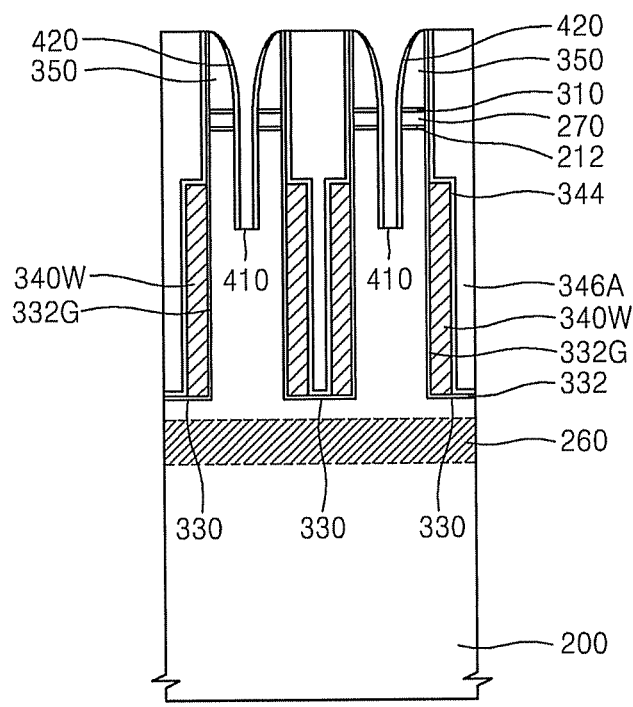
Figure 8C:
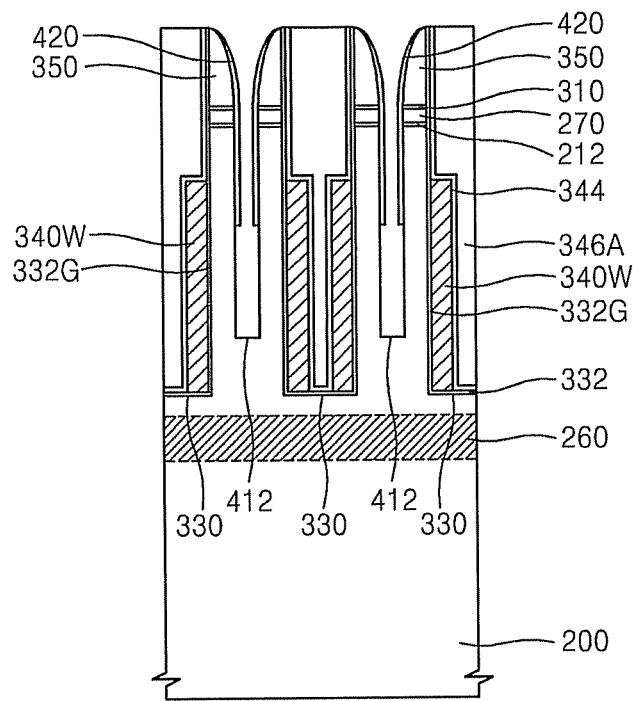

Referring to FIG. 8B, a plurality of insulating spacers 420 may be formed to cover inner sidewalls of the plurality of fifth trenches 410, respectively. An insulating layer (not shown) may be formed on the entire resultant structure having the plurality of fifth trenches 410 therein and may be etched (e.g., using an etch-back process) in such a manner that the plurality of insulating spacers 420 may be formed on only the inner sidewalls of the plurality of fifth trenches 410. The plurality of insulating spacers 420 may be formed of, for example, silicon nitride layers. Referring to FIG. 8C, a plurality of extended fifth trenches 412 connected to the plurality of fifth trenches 410, respectively, may be formed by etching the substrate 200 exposed via the plurality of insulating spacers 420 from the plurality of fifth trenches 410 using the plurality of insulating spacers 420 and the plurality of third buried patterns 346A as an etch mask.

In order to form the plurality of extended fifth trenches 412, the substrate 200 may be etched to a depth from the bottom surfaces of the plurality of fifth trenches 410. Wet etching, for example, may be performed to etch the substrate 200 exposed via lower parts of the plurality of insulating spacers 420 to a width, increasing widths of the plurality of extended fifth trenches 412 formed below the plurality of insulating spacers 420.

Figure 8D:
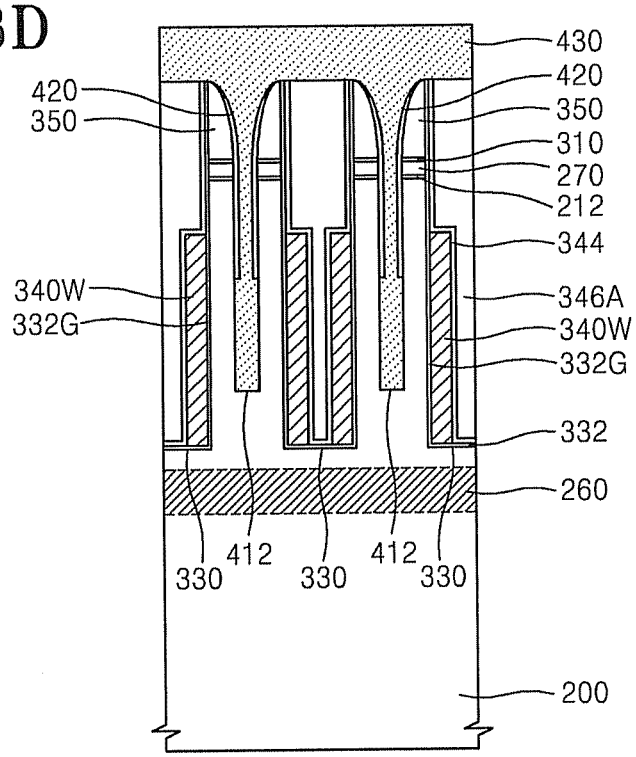
Figure 8E:
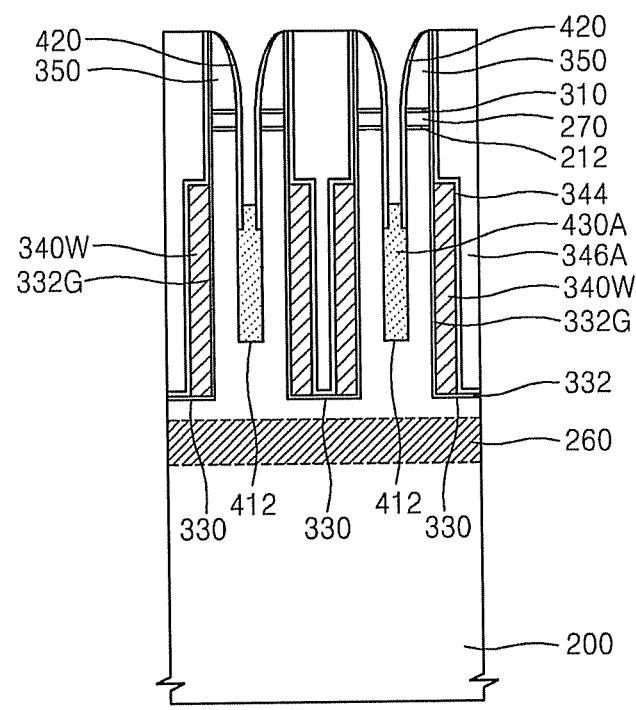

Referring to FIG. 8D, a body contact line conductive layer 430 may be formed in the plurality of extended fifth trenches 412 and on the plurality of third buried patterns 346A to fill (e.g., completely fill) the insides of the plurality of fifth trenches 410 and the plurality of extended fifth trenches 412 therewith. The body contact line conductive layer 430 may be formed of, for example, doped silicon (e.g., polysilicon doped with low-concentration P-type ions) and/or metal. Referring to FIG. 8E, a plurality of body contact lines 430A may be formed in the plurality of extended fifth trenches 412, respectively, by etching the body contact line conductive layer 430 (e.g., by using an etch-back process). It is possible to prevent and/or reduce a floating body effect from occurring in the active regions of the substrate 200 by applying a body bias to active regions of the substrate 200 adjacent to the plurality of extended fifth trenches 412 from the outside, via the plurality of body contact lines 430A.

Figure 9:
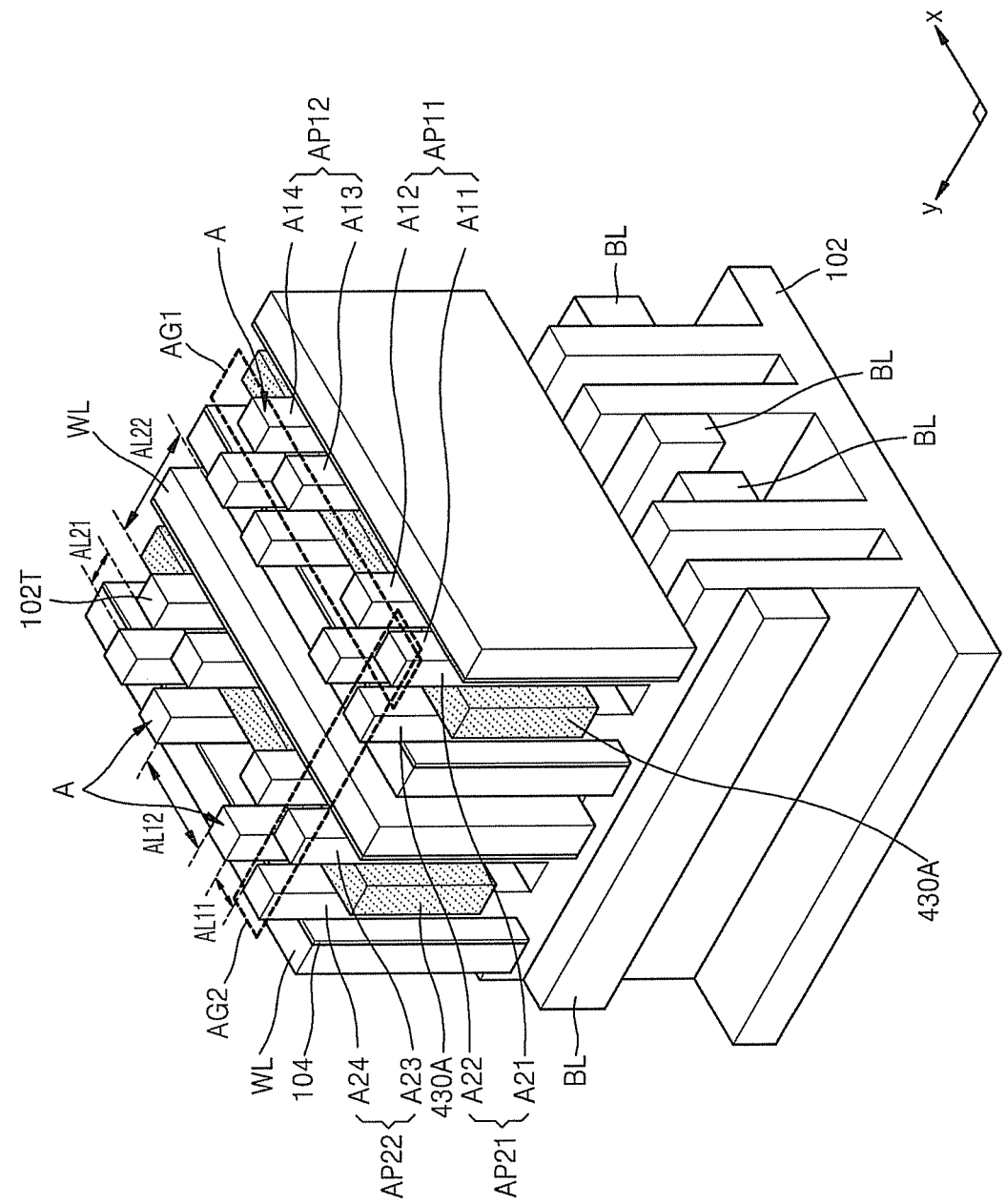

FIG. 9 is a perspective view of part of a 3D arrangement of a semiconductor device 100 with a layout illustrated in FIG. 3A, and including a plurality of body contact lines of FIGS. 8A-8E, according to yet still other example embodiments of the inventive concepts. The structure of the semiconductor device 100 of FIG. 9 is the same or similar to that of the semiconductor device 100 of FIG. 3B except that the plurality of body contact lines 430A of FIG. 9, which extend in parallel with a plurality of buried word lines WL may be present in a region (corresponding to the distance AL21 in FIG. 3A) between two regions A that constitute a pair of second active regions from among a plurality of pairs of second active regions AP21, AP22, . . . .

FIGS. 10A-10D are cross-sectional diagrams illustrating operations included in methods of fabricating a semiconductor device 100 illustrated in FIGS. 3A and 3B according to yet still further example embodiments of the inventive concepts. FIGS. 10A-10D may illustrate operations of forming a plurality of buried bit lines BL of FIGS. 3A and 3B, which are part of methods of manufacturing a semiconductor device 100 according to example embodiments of the inventive concept. The operations of FIGS. 10A-10D may be a modified example of those of FIGS. 4A-4N. FIGS. 10A-10D may illustrate methods of manufacturing a semiconductor device 100 in which the floating body effect may be prevented from occurring, and/or reduced, in active regions of the substrate 200 according to example embodiments of the inventive concepts.

Figure 10A:
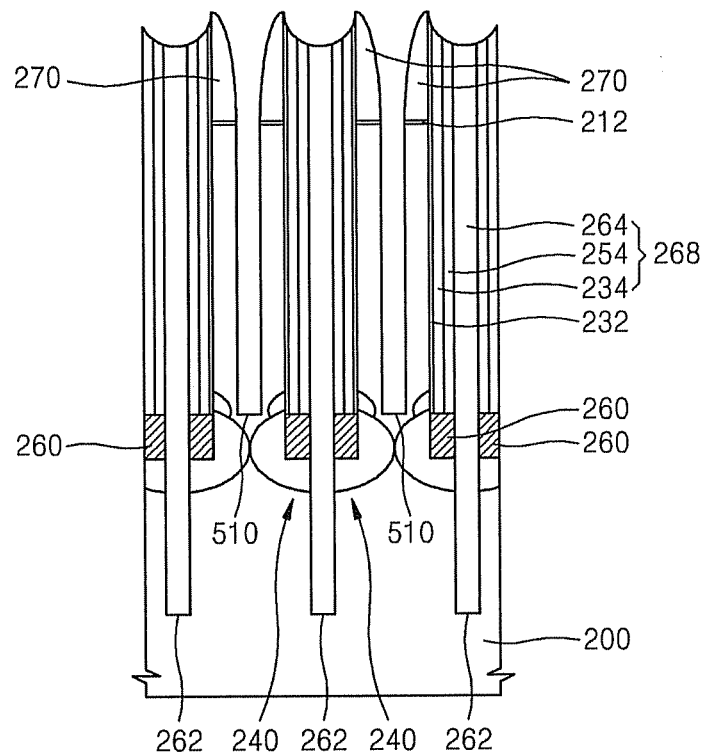
FIGS. 10A-10D are cross-sectional diagrams illustrating operations included in methods of manufacturing the semiconductor devices illustrated in FIGS. 3A and 3B according to yet still further example embodiments of the inventive concepts.

In FIGS. 10A-10D, the same reference numerals as those of FIGS. 4A-4N may denote the same elements, and their operations or characteristics may not be described. Referring to FIG. 10A, a plurality of spacers 270 may be formed on the substrate 200 to respectively cover exposed sidewalls of first protrusions by performing the operations of FIGS. 4A-4L, and an exposed part of the substrate 200 may be etched using the first protrusions and the plurality of spacers 270 as an etch mask, thereby forming a plurality of sixth trenches 510 in the substrate 200. The plurality of sixth trenches 510 may be formed in such a manner that bottom surfaces thereof are adjacent to the plurality of first source/drain regions 240 formed in the substrate 200.

Figure 10B:
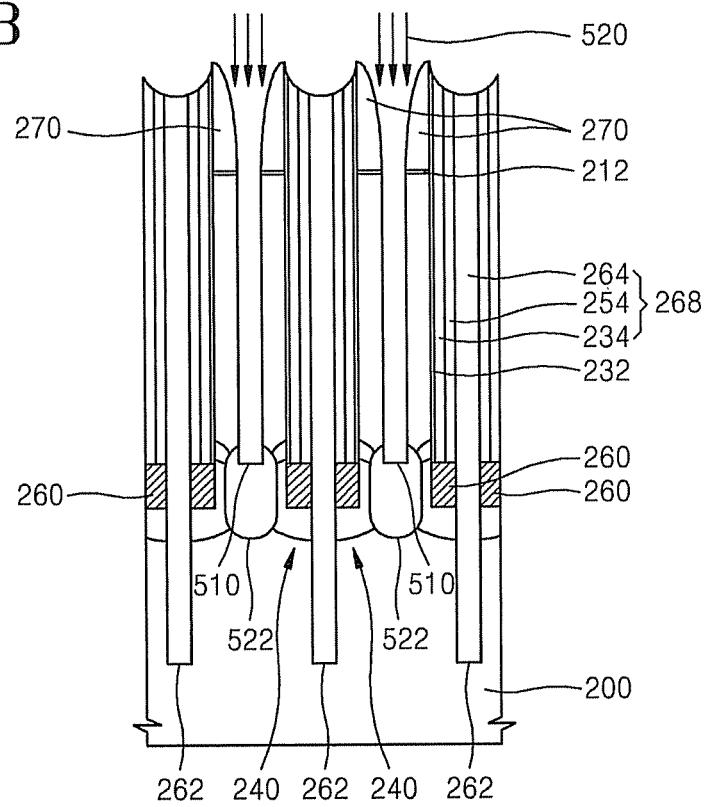

Referring to FIG. 10B, a plurality of non-floating body (NFB) ion implant regions 522 may be formed between two first source/drain regions 240 in the active regions of the substrate 200, respectively, by ion-implanting a dopant 520, the conductive type of which may be opposite to that of the first source/drain regions 240, into the plurality of first source/drain regions 240 formed in the active regions of the substrate 200 via the plurality of sixth trenches 510. If the conductive type of the plurality of first source/drain regions 240 is N type, then the conductive type of the plurality of NFB ion implanting regions 522 may be P type. For example, a B or In dopant may be ion-implanted as the dopant 520 into the plurality of first source/drain regions 240 to form the plurality of NFB ion implanting regions 522. Because each of the plurality of NFB ion implant regions 522 may be formed between two adjacent first source/drain regions 240 in the active regions of the substrate 200, widths of the plurality of first source/drain regions 240 may decrease in the active regions of the substrate 200.

Figure 10C:
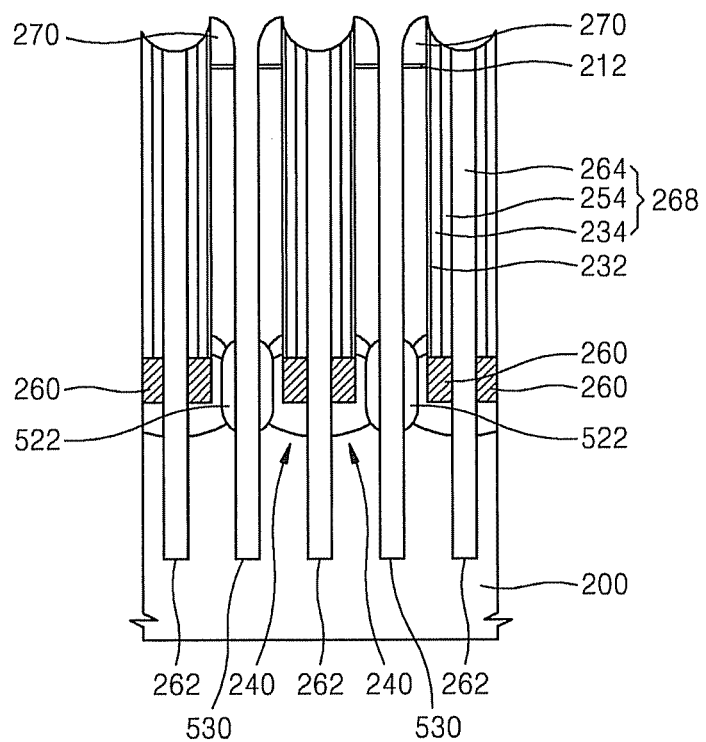
Figure 10D:
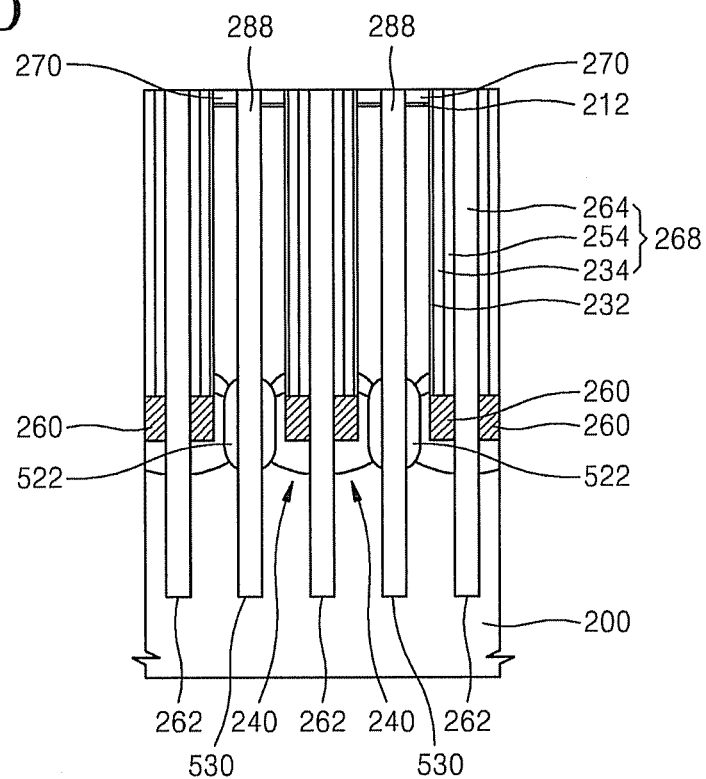

Referring to FIG. 10C, a plurality of extended sixth trenches 530 may be formed to connect to the plurality of sixth trenches 510, respectively, by etching the substrate 200 to a depth from bottom surfaces of the plurality of sixth trenches 510. If the pluralities of extended sixth trenches 530 are formed, each of the plurality of NFB ion implant regions 522 formed in the active regions of the substrate 200 may be divided into two parts. The plurality of NFB ion implant regions 522, which may be each divided into two parts, may provide a P-type impurity region path between upper and lower regions of the first source/drain regions 240 of the substrate 200, thereby preventing the floating body effect from occurring in the active regions of the substrate 200. Referring to FIG. 10D, the operation of FIG. 4N may be performed to form a plurality of second buried patterns 288 in such a manner that the plurality of sixth trenches 510 and the plurality of extended sixth trenches 530 that are connected to the plurality of sixth trenches 510, respectively, may be filled with the plurality of second buried patterns 288.

Figure 11:
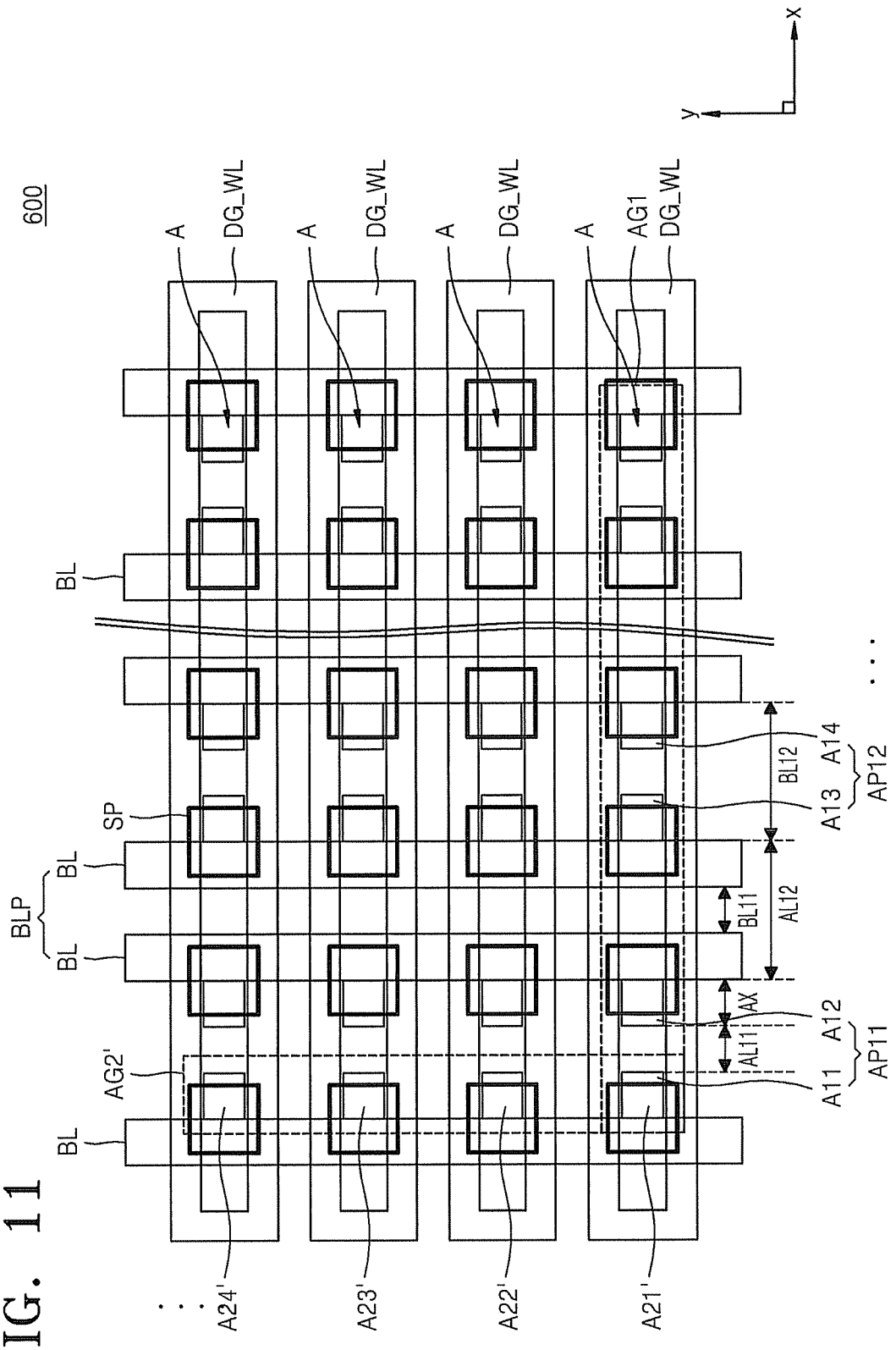

FIG. 11 is a layout plan view of semiconductor devices according to still yet further example embodiments of the inventive concepts. In FIG. 11, the same reference numerals as those of FIGS. 3A and 3B may denote the same elements, and their operations or characteristics may not be described. In the semiconductor device 600 of FIG. 11, a plurality of buried bit lines BL may be the same or similar to the plurality of buried bit lines BL of the semiconductor device 100 of FIGS. 3A and 3B in terms of their structures. As illustrated in FIGS. 3A and 3B, the semiconductor device 600 of FIG. 11 may include a plurality of active regions A separately arranged in a first direction (X-axis direction) and a second direction (Y-axis direction). The plurality of active regions A may include a first group AG1 of active regions arranged in a line in the first direction (X-axis direction). The plurality of active regions A may include a second group AG2' of active regions arranged in a line in the second direction (Y-axis direction). The first group AG1 of active regions may include a plurality of active regions A11, A12, A13, A14, ... arranged in a line in the first direction. The second group AG2' of active regions may include a plurality of active regions A21', A22', A23', A24', ... arranged in a line in the second direction.

The semiconductor device 600 of FIG. 11 may be different from the semiconductor device 100 of FIGS. 3A and 3B in that a plurality of buried word lines DG_WL are formed in a ring shape around the plurality of active regions A11, A12, A13, A14, ... of the first group AG1. Each of the plurality of buried word lines DG_WL faces two sidewalls of one of the plurality of active regions A11, A12, A13, A14, ... of the first group AG1. A double-gate transistor, including a buried word line DG_WL from among the plurality of buried word lines DG_WL, may be formed in each of the plurality of active regions A. From among the plurality of active regions A, the plurality of active regions A21', A22', A23', A24', ... of the second group AG2' that are arranged in a line in the second direction (Y-axis direction) may be arranged at equal intervals in the second direction (Y-axis direction).

In the semiconductor device 600 of FIG. 11, the first group AG1 of active regions may include a plurality of pairs of first active regions AP11, AP12, .... The distance AL11 between two active regions A that constitute a pair of first active regions selected among the plurality of pairs of first active regions AP11, AP12, ..., may be less than the distance AL12 between two adjacent active regions A having two buried bit lines BL therebetween from among the first group AG1 of active regions. The plurality of pairs of first active regions AP11, AP12, ... may be arranged with two adjacent buried bit lines BL therebetween. A pair of buried bit lines BL from among the plurality of buried bit lines BL may be between each of the plurality of pairs of active regions AP11, AP12, . . .

The distance BL11 between the pair of buried bit lines BL may be less than the distance BL12 between two adjacent buried bit lines BL including each of the plurality of pairs of first active regions AP11, AP12, therebetween. The plurality of buried word lines DG_WL may extend in a ring fashion, and upper surfaces of the plurality of buried word lines DG_WL may be lower than those of the active regions A.

FIGS. 12A-12D are cross-sectional diagrams illustrating operations included in methods of fabricating the semiconductor devices illustrated in FIG. 11 according to still yet other example embodiments of the inventive concept. In the operations of FIGS. 12A-12D, a plurality of buried bit lines 260 (which may be similar to the plurality of buried bit lines BL of FIGS. 3A and 3B or the plurality of buried bit lines 260 of FIG. 11) may be formed as described above with references to FIGS. 4A-4N in such a manner that upper surfaces of the plurality of buried bit lines 260 may be lower than an upper surface of the substrate 200. A plurality of buried word lines 740W (see FIG. 12D), the plan view of which is the same as that of the buried word lines DG_WL of FIG. 11, may be formed on the plurality of buried bit lines 260.

Figure 12A:
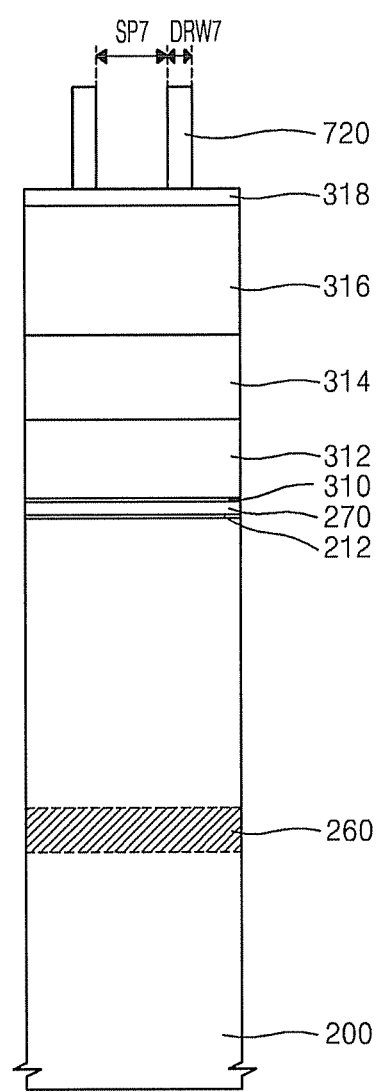
FIGS. 12A-12D are cross-sectional diagrams illustrating operations included in methods of manufacturing the semiconductor devices illustrated in FIG. 11 according to still yet other example embodiments of the inventive concept.

The operations of FIGS. 12A-12D may be performed after the operations of FIGS. 4A-4N are performed. FIGS. 12A-12D may be cross-sectional views taken along the line VI-VI' of FIG. 5. In FIGS. 12A-12D, the plurality of buried bit lines 260 may be marked by a dotted line for ease of understanding of example embodiments. In FIGS. 12A-12D, the same reference numerals as those of FIGS. 4A-4N and FIGS. 6A-6L may denote the same elements, and their operations or characteristics may not be described. Referring to FIG. 12A, as described above with reference to FIG. 6A, an etch stop insulating layer 310, a second sacrificial layer 312, a third hard mask layer 314, and a fourth hard mask layer 316 may be formed (e.g., sequentially formed) on a resultant structure in which the plurality of buried bit lines 260, the plurality of buried insulating layers 264, and the plurality of second buried patterns 288 are formed by performing the operations of FIGS. 4A-4N.

An anti-reflection layer 318 and a plurality of photoresist patterns 720 may be formed (e.g., sequentially formed) on the fourth sacrificial layer 316. The plurality of photoresist patterns 720 may be similar to the plurality of photoresist patterns 320 of FIG. 6A. The plurality of photoresist patterns 720 may include a plurality of line patterns that extend with a width DRW7 and are spaced from each other by an interval SP7. The interval SP7 between the plurality of photoresist patterns 720 may be about three times greater than the width DRW7 of each of the plurality of photoresist patterns 720.

Figure 12B:
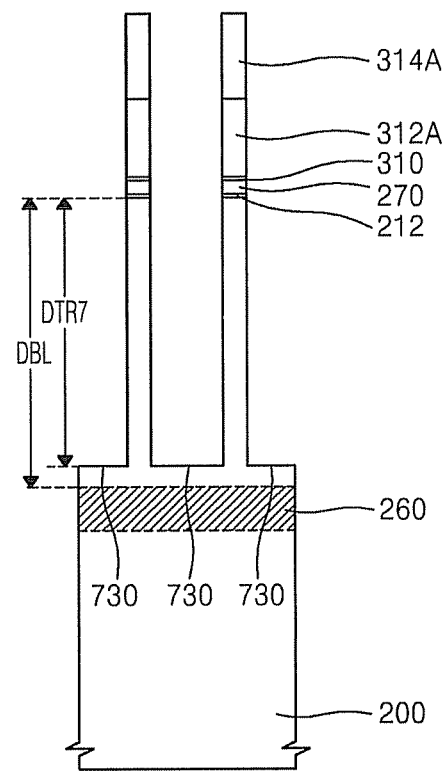

Referring to FIG. 12B, a plurality of third hard mask patterns 314A may be formed by etching the anti-reflection layer 318 and the fourth hard mask layer 316 by using the plurality of photoresist patterns 720 as an etch mask and etching the third hard mask layer 314. A plurality of second sacrificial layer patterns 312A may be formed by etching the second sacrificial layer 312 using the plurality of third hard mask patterns 314A as an etch mask. A plurality of seventh trenches 730 may be formed in the substrate 200 by etching the etch stop insulating layer 310, the spacers 270, the pad oxide layer 212, and the substrate 200 using the plurality of second sacrificial layer patterns 312A as an etch mask.

In a top view, the plurality of seventh trenches 730 may be line shaped and extend in parallel with each other. The plurality of seventh trenches 730 may extend in a direction perpendicular to a direction in which the plurality of first trenches 230 and the plurality of first separation trenches 262 extend (see FIG. 6A). The plurality of seventh trenches 730 may extend perpendicularly to a direction in which the plurality of buried bit lines 260 extend. Depths of the plurality of seventh trenches 730 may be determined in such a manner that the distance DTR7 between the upper surface of the substrate 200 and bottom surfaces of the plurality of seventh trenches 730 may be less than the distance DBL between the upper surface of the substrate 200 and upper surfaces of the plurality of buried bit lines 260. After the plurality of seventh trenches 730 are formed, layers formed on the plurality of third hard mask patterns 314A may be removed.

Figure 12C:
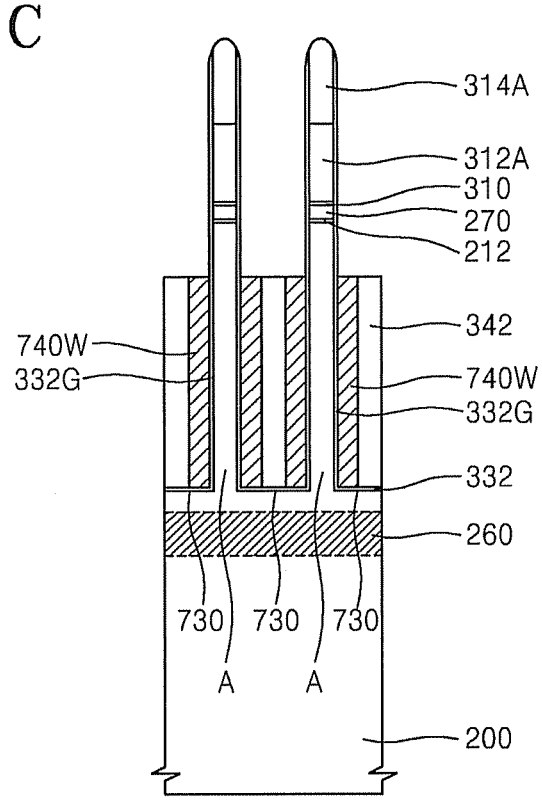

Referring to FIG. 12C, an insulating layer 332 may formed on inner sidewalls of the plurality of seventh trenches 730 so as to form a gate insulating layer 332G as described above with reference to FIGS. 6C-6F, and a plurality of buried word lines 740W may be formed in a manner similar to the manner in which the plurality of buried word lines 340W of FIG. 6F are formed. The plurality of buried word lines 740W may be formed in a ring shape around the plurality of second sacrificial layer patterns 312A while facing both sidewalls of each of the active regions A of the substrate 200, which define the widths of the plurality of seventh trenches 730, respectively. A plan view of the plurality of buried word lines 740W may be the same or similar to that of the buried word lines DG_WL of FIG. 11.

Figure 12D:
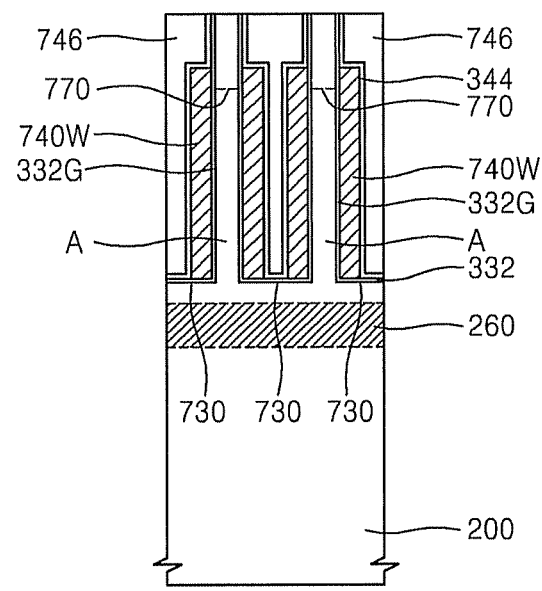

Referring to FIG. 12D, as described above with reference to FIG. 6G, a plurality of buffer layers 342 may be removed, a capping layer 344 for covering the buried word lines 740W and a buried layer 746 for filling the insides of the plurality of seventh trenches 730 therewith may be formed (e.g., sequentially formed) in the plurality of seventh trenches 730. Layers on the substrate 200 may be planarized and removed so as to expose the upper surface of the substrate 200. The buried layer 746 may be formed of, for example, an oxide layer. According to example embodiments, the plurality of buffer layers 342 may be removed but example embodiments of the inventive concepts are not limited thereto. As described above with reference to FIG. 6G, if the plurality of buffer layers 342 are formed of an oxide layer, then the plurality of buffer layers 342 may not be removed, and the capping layer 344 and the buried layer 746 may be formed on the plurality of buffer layers 342. A plurality of second source/drain regions 770 may be formed in the substrate 200 by ion-implanting through the exposed upper surface of the substrate 200.

Figure 13:
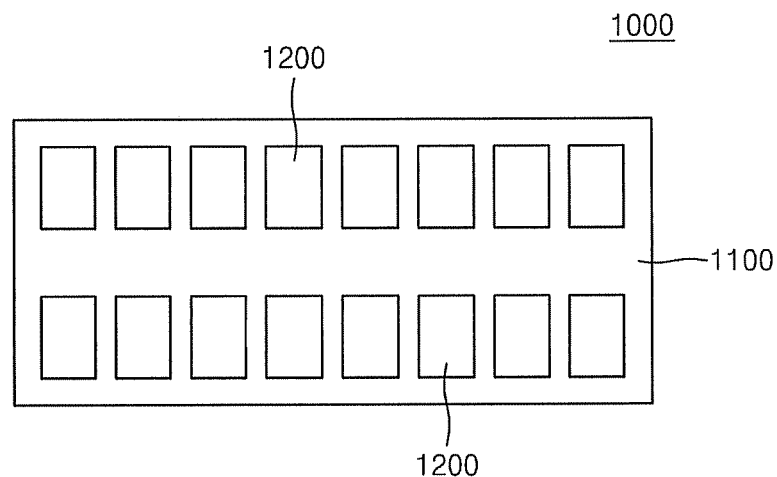

FIG. 13 is a plan view of a memory module 1000 including at least one semiconductor memory device described with respect to example embodiments of the inventive concepts illustrated in FIGS. 1A-12D. Referring to FIG. 13, the memory module 1000 may include a printed circuit board 1100 and a plurality of semiconductor packages 1200. Each of the plurality of semiconductor packages 1200 may include a semiconductor memory device according to example embodiments of the inventive concepts. Each of the plurality of semiconductor packages 1200 may include the structural characteristics of at least one semiconductor device selected from among the above semiconductor devices described above with reference to FIGS. 1A-12D.

In the current embodiment, the memory module 1000 may be, for example, a single in-line memory module (SIMM) in which a plurality of semiconductor packages 1200 are mounted on only one surface of the printed circuit board 1100 or a dual in-line memory module (DIMM) in which the plurality of semiconductor packages 1200 are mounted on both surfaces of the printed circuit board 1100. The memory module 1000 may be a fully buffered DIMM (FBDIMM), in which an advanced memory buffer (AMB) delivers signals from the outside to the plurality of semiconductor packages 1200, respectively.

Figure 14:
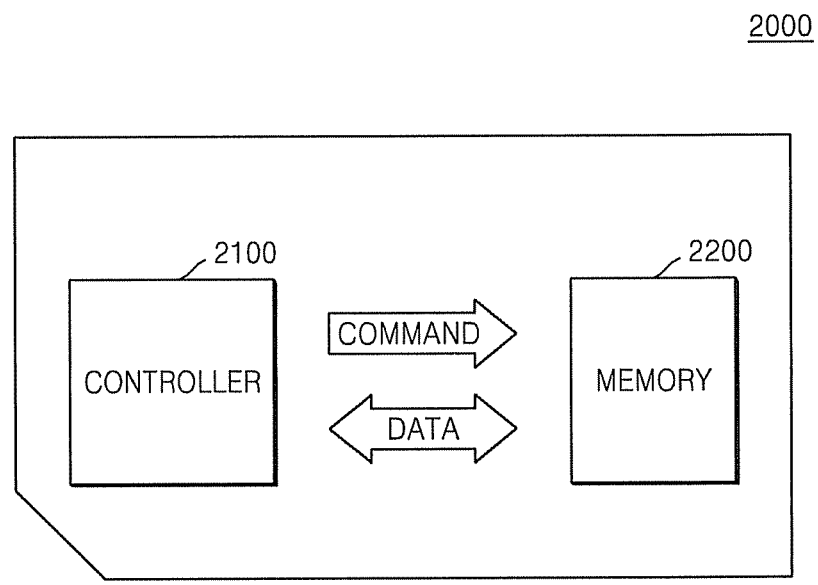

FIG. 14 is a schematic block diagram of a memory card 2000 including at least one semiconductor memory device according to example embodiments of the inventive concepts. Referring to FIG. 14, the memory card 2000 may be constructed in such a manner that a controller 2100 and a memory 2200 may exchange electrical signals with each other. For example, if the controller 2100 provides a command to the memory 2200, then the memory 2200 may transmit data to the controller 2100. The memory 2200 may include a semiconductor device according to example embodiments of the inventive concepts. The memory 2200 may include the structural characteristics of at least one semiconductor device selected from among the semiconductor devices described above with reference to FIGS. 1A-12D. Examples of the memory card 2000 may include a memory stick card, a smart media card (SM), a secure digital (SD) card, a mini-secure digital card (mini SD), and/or a multimedia card (MMC).

Figure 15:
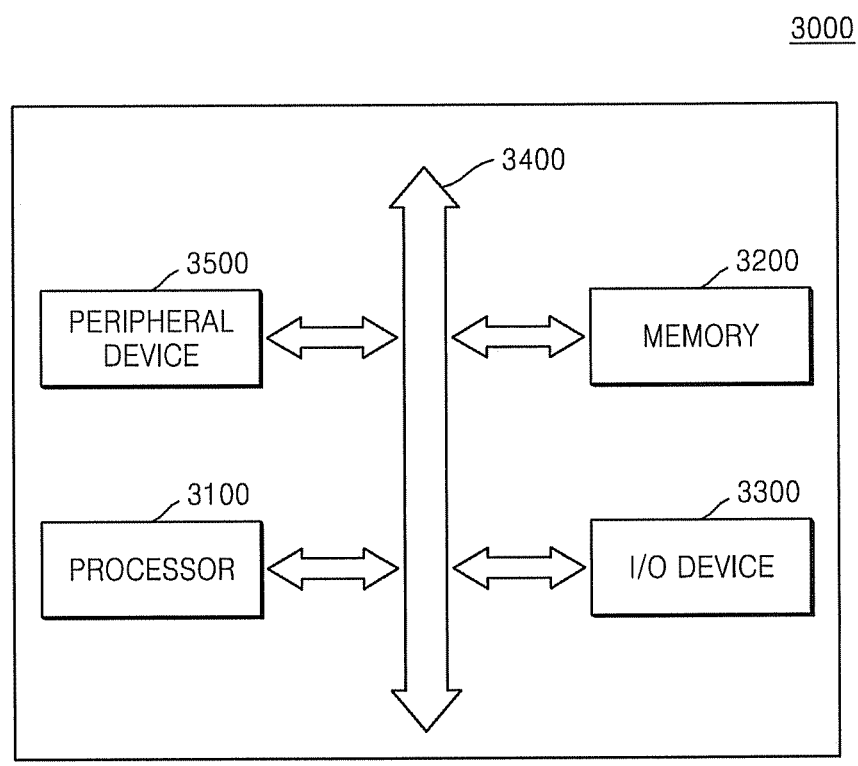

FIG. 15 is a schematic block diagram of a system 3000 including at least one semiconductor device according to example embodiments of the inventive concepts. Referring to FIG. 15, the system 3000 may include a processor 3100, a memory 3200, a peripheral device 3500 and an input/output (I/O) device 3300 that may establish data communications with one another via a bus 3400. The memory 3200 may include random access memory (RAM) and read only memory (ROM). The system 3000 may include a peripheral device 3500, for example, a floppy disk drive and/or a compact disc (CD) ROM drive. The memory 3200 may include a semiconductor device according to example embodiments of the inventive concepts. The memory 3200 may include the structural characteristics of at least one semiconductor device selected from among the semiconductor devices described above with reference to FIGS. 1A-12D. The memory device 3200 may store code and data for operating the processor 3100. The system 3000 may be used, for example, in mobile phones, MP3 players, navigators, portable multimedia players (PMPs), solid state disks (SSD) and/or household appliances.

While example embodiments have been particularly shown and described, it will be understood by one of ordinary skill in the art that variations in form and detail may be made therein without departing from the spirit and scope of the claims.

What is claimed is:

1. A semiconductor device, comprising:
    active regions spaced apart from each other in first and second directions in a substrate;
    a plurality of buried word lines extending in the first direction on sidewalls of a first group of the active regions arranged in the first direction, the first group including a first plurality of pairs of the active regions, upper surfaces of the plurality of buried word lines lower than an upper surface of the substrate; and
    a plurality of buried bit lines extending in the second direction on sidewalls of a second group of the active regions arranged in the second direction, a distance between adjacent active regions of the first group with at least two of the plurality of buried bit lines therebetween greater than a distance between active regions of at least one of the first plurality of pairs, upper surfaces of the plurality of buried bit lines lower than the upper surface of the substrate.

2. The semiconductor device of claim 1, wherein two adjacent buried bit lines of the plurality of buried bit lines are between adjacent pairs of the first plurality of pairs of the active regions.

3. The semiconductor device of claim 1, wherein the second group includes a second plurality of pairs of the active regions, and
    a distance between active regions of one of the second plurality of pairs is less than a distance between adjacent active regions with at least two of the plurality of buried word lines therebetween.

4. The semiconductor device of claim 3, wherein two adjacent buried word lines of the plurality of buried word lines are between adjacent pairs of the second plurality of pairs.

5. The semiconductor device of claim 3, wherein each of the plurality of buried word lines is on one sidewall of at least a plurality of the active regions of the first group, and
    each of the plurality of active regions is part of a single-gate transistor including one of the plurality of buried word lines.

6. The semiconductor device of claim 5, wherein each of the plurality of buried word lines are bar shaped and extend in the first direction at a side of the first group.

7. The semiconductor device of claim 3, wherein the plurality of buried bit lines is a plurality of pairs of buried bit lines,
    each of the plurality of pairs of buried bit lines is between adjacent pairs of the first plurality of pairs, and
    a distance between bit lines of each of the plurality of pairs of buried bit lines is less than a distance between adjacent buried bit lines with one of the first plurality of pairs therebetween.

8. The semiconductor device of claim 3, wherein the plurality of buried word lines is a plurality of pairs of buried word lines,
    each of the plurality of pairs of buried word lines is between adjacent pairs of the second plurality of pairs, and
    a distance between buried word lines of each of the plurality of pairs of buried word lines is less than a distance between adjacent buried word lines with one of the second plurality of pairs therebetween.

9. The semiconductor device of claim 1, wherein the second group of the active regions includes a plurality of second active regions at regular intervals in the second direction.

10. The semiconductor device of claim 9, wherein each of the plurality of buried word lines is on two sidewalls of at least a plurality of the active regions of the first group, and
    each of the plurality of active regions of the first group is part of a double-gate transistor including one of the plurality of buried word lines.

11. The semiconductor device of claim 10, wherein the plurality of buried word lines are ring shaped and surround one line of the active regions of the first group.

12. The semiconductor device of claim 9, wherein the plurality of buried bit lines is a plurality of pairs of buried bit lines, and
    each pair of the plurality of pairs of buried bit lines is between adjacent pairs of the first plurality of pairs, and
    a distance between buried bit lines of each of the plurality of pairs of buried bit lines is less than a distance between two adjacent buried bit lines with one of the first plurality of pairs therebetween.

13. The semiconductor device of claim 1, wherein the second direction is perpendicular to the first direction.

14. A semiconductor device, comprising:
    a plurality of active regions of a substrate,
        the plurality of active regions having sidewalls that define a plurality of first to fourth trenches with an upper surface of the substrate,
        the plurality of first trenches and the plurality of second trenches having a first depth, extending a first direction, and being alternately arranged with each other along a second direction crossing the first direction,
        the plurality of third trenches and the plurality of fourth trenches having a second depth, extending the second direction, and being alternately arranged with each other along the first direction,
        the first depth being different than the second depth;
    a plurality of bit lines in the plurality of first trenches,
        each of the bit lines connected to at least one of the active regions,
        each of the bit lines including a material that is different than a material of the substrate; and
    a plurality of word lines in the plurality of third trenches,
        each of the word lines facing one of the sidewalls of at least one of the active regions.

15. The semiconductor device of claim 14, wherein the plurality of bit lines and the plurality of word lines are between a front-side and a back-side of the substrate, and
    the substrate is a semiconductor wafer.

16. The semiconductor device of claim 14, wherein the plurality of word lines are closer to a surface of the substrate than the plurality of bit lines,
    the plurality of bit lines extend in a first direction parallel to the surface of the substrate, and
    the plurality of word lines extend in a second direction parallel to the surface of the substrate, the second direction different from the first direction.

17. A semiconductor device, comprising:
    a plurality of active regions of a substrate;
    a plurality of bit lines in the substrate,
        each of the bit lines connected to at least one of the active regions,
        the plurality of bit lines extending in a first direction parallel to a surface of the substrate; and
    a plurality of word lines in the substrate,
        each of the word lines on a sidewall of at least one of the active regions,
        the plurality of word lines being closer to the surface of the substrate than the plurality of bit lines, the plurality of word lines extending in a second direction parallel to the surface of the substrate, the second direction different from the first direction;

at least one first layer extending in the first direction on at least two of the bit lines;

at least one second layer extending in the first direction in parallel to the first layer;

at least one third layer extending across the first and second layers in the second direction on at least two of the word lines; and at least one fourth layer extending in parallel to the third layer.

18. The semiconductor device of claim 17, wherein the first layer separates the at least two of the bit lines, and the third layer separates the at least two of the word lines.

19. The semiconductor device of claim 17, wherein
the first through fourth layers are each a plurality of layers,
the first and second layers alternate in the second direction, and
the third and fourth layers alternate in the first direction.

20. The semiconductor device of claim 19, wherein a distance between the at least two of the bit lines on one of the first layers is less than a distance between one of the at least two of the bit lines on the one of the first layers and an adjacent bit line on a different one of the first layers.

* * * * *